(12) United States Patent
Asami

(10) Patent No.: US 11,950,410 B2
(45) Date of Patent: Apr. 2, 2024

(54) SEMICONDUCTOR DEVICE AND DRIVING METHOD OF SEMICONDUCTOR DEVICE

(71) Applicant: Semiconductor Energy Laboratory Co., Ltd., Atsugi (JP)

(72) Inventor: Yoshinobu Asami, Isehara (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 17/838,555

(22) Filed: Jun. 13, 2022

(65) Prior Publication Data
US 2022/0310628 A1    Sep. 29, 2022

Related U.S. Application Data

(63) Continuation of application No. 16/626,708, filed as application No. PCT/IB2018/054839 on Jun. 29, 2018, now Pat. No. 11,374,012.

(30) Foreign Application Priority Data

Jul. 6, 2017  (JP) ................. 2017-132401

(51) Int. Cl.
  *H10B 12/00*  (2023.01)
  *G11C 11/405*  (2006.01)
  *H01L 29/24*  (2006.01)

(52) U.S. Cl.
  CPC ............ *H10B 12/50* (2023.02); *G11C 11/405* (2013.01); *H01L 29/24* (2013.01)

(58) Field of Classification Search
  CPC . H10B 12/50; H01L 27/0688; H01L 27/0694; H01L 2021/775; H01L 21/8221;
  (Continued)

(56) References Cited

U.S. PATENT DOCUMENTS 5,525,820 A    6/1996  Furuyama
8,476,626 B2    7/2013  Yamazaki et al.
(Continued)

FOREIGN PATENT DOCUMENTS

CN    102598266 A    7/2012
EP    0453959 A    10/1991
(Continued)

OTHER PUBLICATIONS

International Search Report (Application No. PCT/IB2018/054839) dated Sep. 11, 2018.
(Continued)

*Primary Examiner* — Thanh Y. Tran
(74) *Attorney, Agent, or Firm* — Eric J. Robinson; Robinson Intellectual Property Law Office, P.C.

(57) ABSTRACT

A semiconductor device with a large storage capacity per unit area can be provided. A memory cell including a first transistor, a second transistor, a third transistor, a fourth transistor, a first capacitor, and a second capacitor includes a stack including a first conductor, a first insulator over the first conductor, a second conductor over the first insulator, a second insulator over the second conductor, and a third conductor over the second insulator; a first oxide arranged in a ring-like shape on a side surface of an opening portion of the second conductor; a fourth conductor arranged in a ring-like shape in contact with an inner wall of the first oxide; a cylindrical third insulator arranged to penetrate the stack, the first oxide, and the fourth conductor; and a second oxide arranged in contact with an inner wall of the third insulator.

4 Claims, 47 Drawing Sheets

(58) Field of Classification Search
CPC ............. H01L 25/0657; H01L 25/0756; H01L 2924/1435; H01L 2924/1436; H01L 2924/1437; H01L 2924/1438; H01L 2924/1441

See application file for complete search history.

(56) References Cited

U.S. PATENT DOCUMENTS

| | | | |
|---|---|---|---|
| 8,860,108 B2 | 10/2014 | Yamazaki et al. |
| 8,902,663 B1 | 12/2014 | Or-Bach et al. |
| 9,117,749 B1 | 8/2015 | Or-Bach et al. |
| 9,117,923 B2 | 8/2015 | Shim et al. |
| 9,514,792 B2 | 12/2016 | Kajigaya |
| 10,170,639 B2 | 1/2019 | Hopkins et al. |
| 10,529,413 B2 | 1/2020 | Atsumi et al. |
| 2004/0095364 A1 | 5/2004 | Koyama et al. |
| 2007/0133358 A1 | 6/2007 | Kubo et al. |
| 2008/0149913 A1 | 6/2008 | Tanaka et al. |
| 2008/0239799 A1 | 10/2008 | Watanabe |
| 2009/0027955 A1 | 1/2009 | Koh et al. |
| 2009/0034123 A1 | 2/2009 | Aoki et al. |
| 2009/0086528 A1 | 4/2009 | Hanafi |
| 2010/0052042 A1 | 3/2010 | Tanaka et al. |
| 2010/0142091 A1 | 6/2010 | Tsukamoto et al. |
| 2010/0142261 A1 | 6/2010 | Kubo et al. |
| 2010/0142262 A1 | 6/2010 | Tsukamoto et al. |
| 2010/0182828 A1 | 7/2010 | Shima et al. |
| 2010/0259960 A1 | 10/2010 | Samachisa |
| 2010/0296338 A1 | 11/2010 | Park et al. |
| 2011/0006277 A1 | 1/2011 | Kubo et al. |
| 2011/0026294 A1 | 2/2011 | Tsukamoto et al. |
| 2011/0031467 A1 | 2/2011 | Kubo et al. |
| 2011/0068319 A1 | 3/2011 | Tsukamoto et al. |
| 2011/0121286 A1 | 5/2011 | Yamazaki et al. |
| 2011/0122676 A1 | 5/2011 | Murooka et al. |
| 2011/0140070 A1 | 6/2011 | Kim |
| 2011/0216575 A1 | 9/2011 | Yamaguchi et al. |
| 2011/0216582 A1 | 9/2011 | Tsukamoto et al. |
| 2011/0235408 A1 | 9/2011 | Minemura et al. |
| 2011/0273927 A1 | 11/2011 | Hanzawa et al. |
| 2011/0286256 A1 | 11/2011 | Kamata |
| 2012/0008369 A1 | 1/2012 | Shimuta et al. |
| 2012/0033484 A1 | 2/2012 | Matsuzaki et al. |
| 2012/0087178 A1 | 4/2012 | Watanabe et al. |
| 2012/0113707 A1 | 5/2012 | Takemura |
| 2012/0261722 A1 | 10/2012 | Tang et al. |
| 2012/0268980 A1 | 10/2012 | Awaya et al. |
| 2012/0287697 A1 | 11/2012 | Hanzawa et al. |
| 2013/0070506 A1 | 3/2013 | Kajigaya |
| 2013/0075684 A1 | 3/2013 | Kinoshita et al. |
| 2013/0128651 A1 | 5/2013 | Kubo |
| 2013/0141968 A1 | 6/2013 | Sasago et al. |
| 2013/0228739 A1 | 9/2013 | Sasago et al. |
| 2013/0258752 A1 | 10/2013 | Park |
| 2014/0268996 A1 | 9/2014 | Park |
| 2014/0301128 A1 | 10/2014 | Park |
| 2014/0321193 A1 | 10/2014 | Park |
| 2016/0343434 A1 | 11/2016 | Lee et al. |
| 2016/0365351 A1 | 12/2016 | Nishikawa et al. |
| 2016/0365352 A1 | 12/2016 | Nishikawa et al. |
| 2017/0236872 A1 | 8/2017 | Kanemura et al. |
| 2017/0323900 A1* | 11/2017 | Kanamori ............. H10B 43/10 |
| 2020/0126991 A1* | 4/2020 | Yamazaki ............. G11C 5/025 |

FOREIGN PATENT DOCUMENTS

| | | |
|---|---|---|
| JP | 04-003463 A | 1/1992 |
| JP | 2011-066417 A | 3/2011 |
| JP | 2011-119674 A | 6/2011 |
| JP | 2011-129893 A | 6/2011 |
| JP | 2013-065638 A | 4/2013 |
| JP | 2016-508670 | 3/2016 |
| JP | 2016-225613 A | 12/2016 |
| KR | 1993-0008008 A | 5/1993 |
| KR | 2012-0099464 A | 9/2012 |
| TW | 201138067 | 11/2011 |
| WO | WO-2011/062067 | 5/2011 |

OTHER PUBLICATIONS

Written Opinion (Application No. PCT/IB2018/054839) dated Sep. 11, 2018.

* cited by examiner

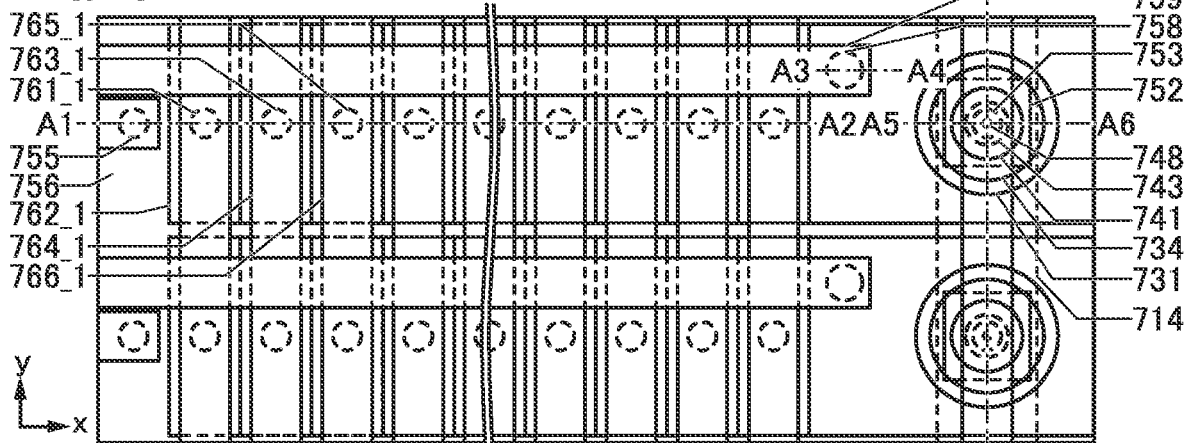
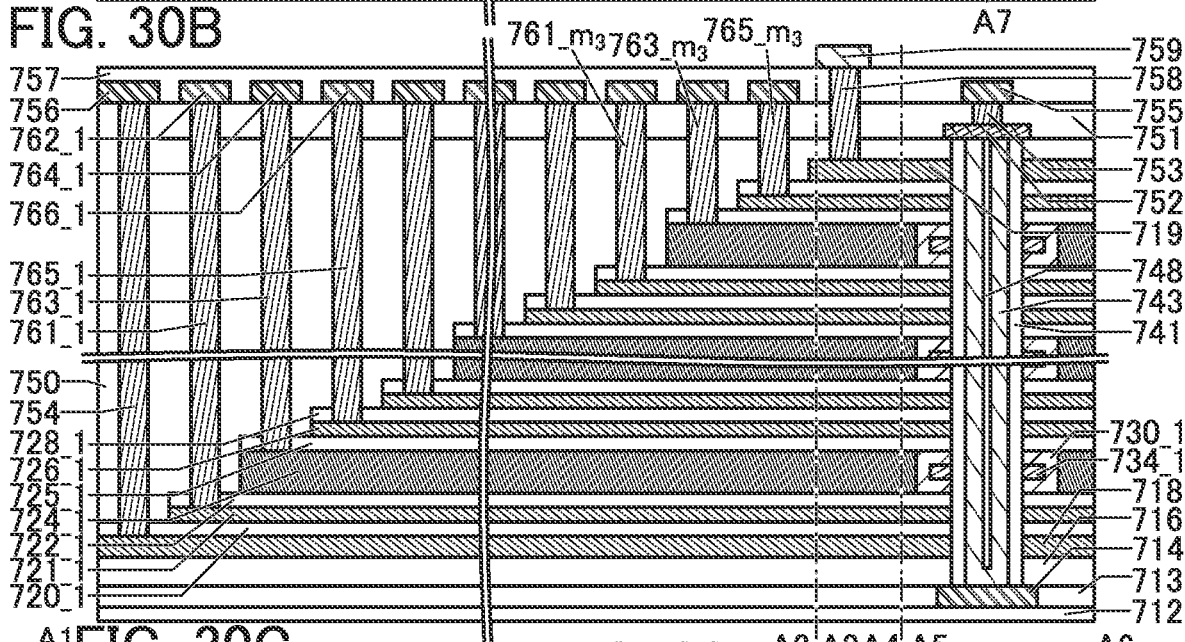
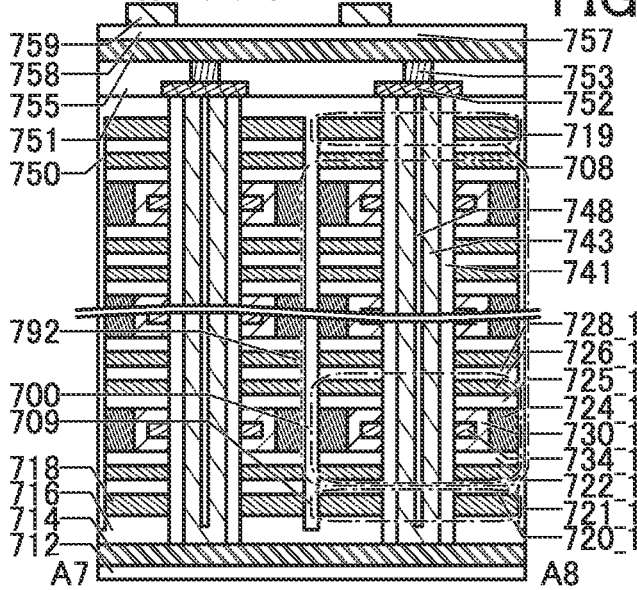
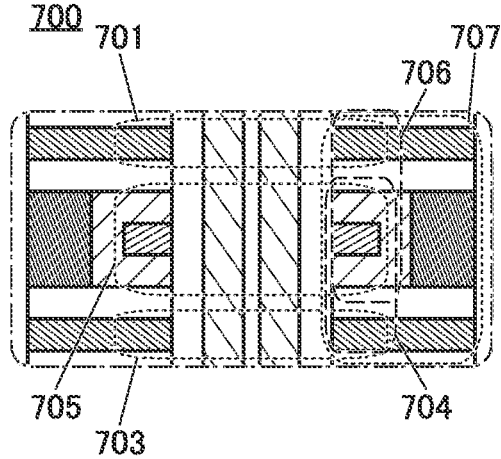

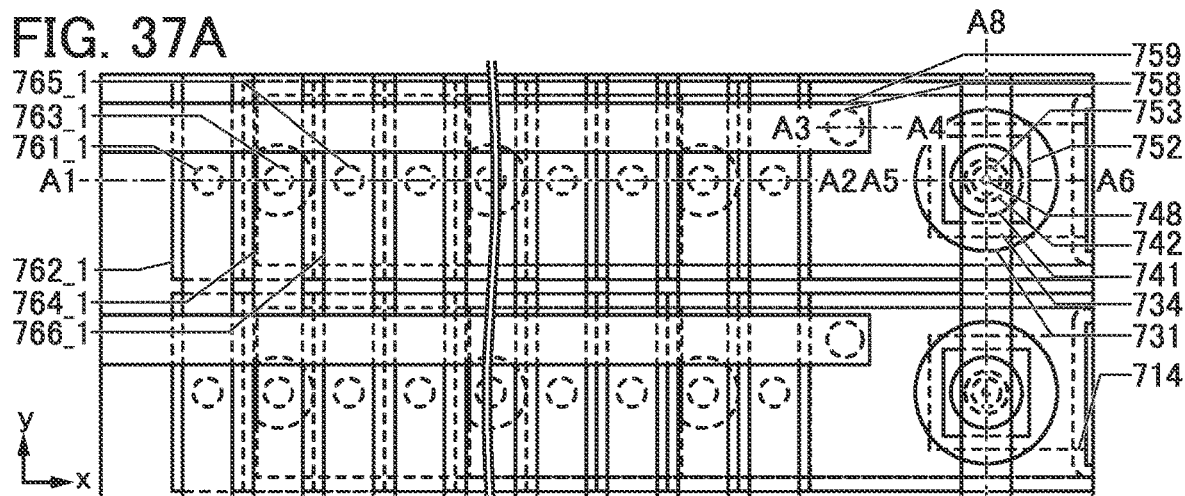
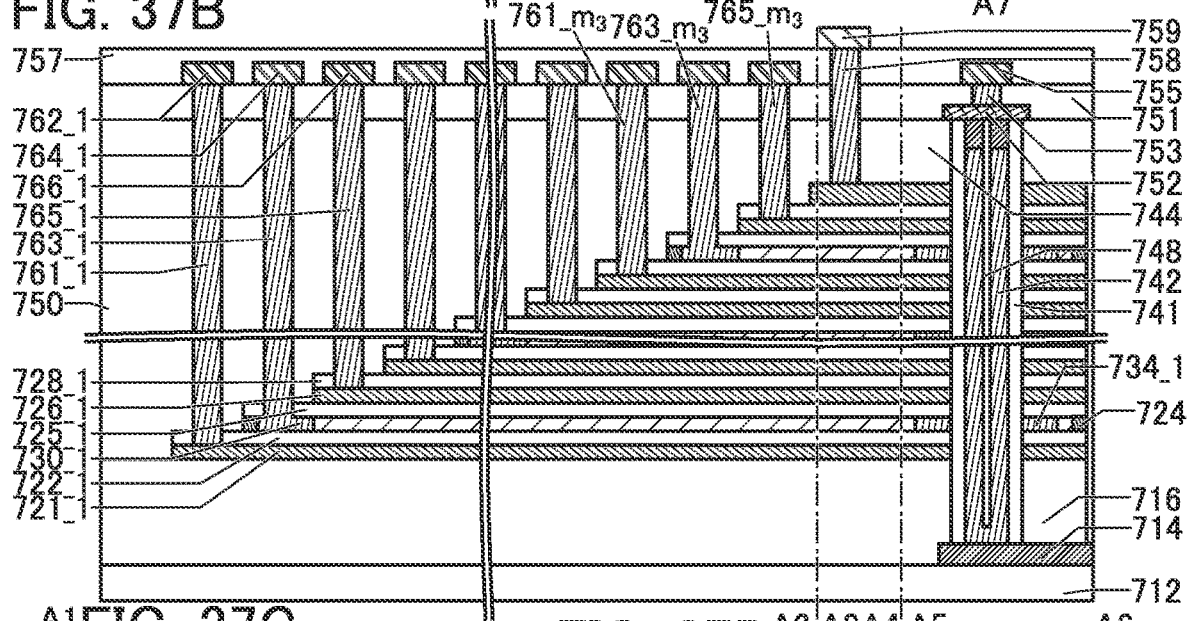
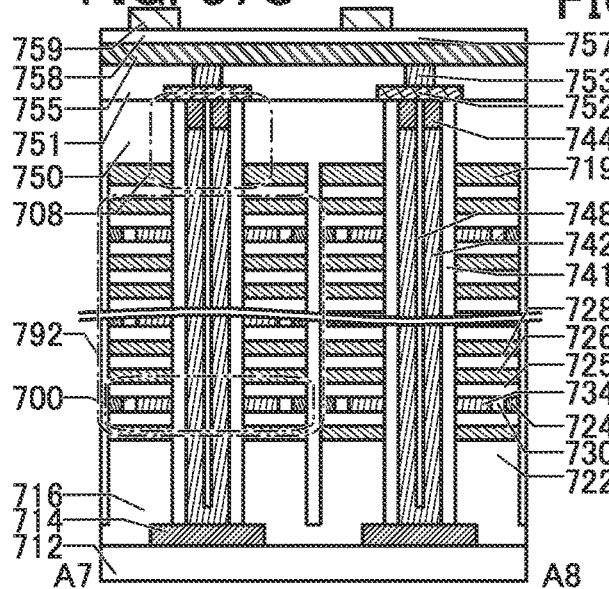
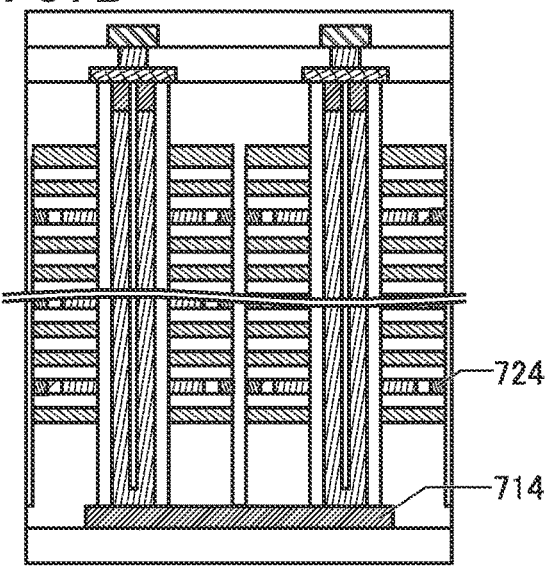

SEMICONDUCTOR DEVICE AND DRIVING METHOD OF SEMICONDUCTOR DEVICE

TECHNICAL FIELD

The present invention relates to, for example, a transistor and a semiconductor device. The present invention relates to, for example, a method for manufacturing a transistor and a semiconductor device. The present invention relates to, for example, a display device, a light-emitting device, a lighting device, a power storage device, a memory device, a processor, and an electronic device. The present invention relates to a method for manufacturing a display device, a liquid crystal display device, a light-emitting device, a memory device, and an electronic device. The present invention relates to a method for driving a display device, a liquid crystal display device, a light-emitting device, a memory device, and an electronic device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter.

Note that in this specification and the like, a semiconductor device refers to a device that can function by utilizing semiconductor characteristics in general. A display device, a light-emitting device, a lighting device, an electro-optical device, a memory device, a semiconductor circuit, and an electronic device include a semiconductor device in some cases.

BACKGROUND ART

Much attention has been focused on a semiconductor device that can read and write data by using a combination of a transistor in which silicon (Si) is used for a semiconductor layer and a transistor in which an oxide semiconductor (OS) is used for a semiconductor layer (hereinafter, referred to as an OS transistor) (see Patent Document 1).

In recent years, with the increase in the amount of data dealt with, semiconductor devices having a larger storage capacity have been required. To increase storage capacity per unit area, stacking memory cells is effective (see Patent Documents 2 and 3). Stacking memory cells can increase storage capacity per unit area in accordance with the number of stacked memory cells.

REFERENCES

Patent Documents

[Patent Document 1] Japanese Published Patent Application No. 2011-119674
[Patent Document 2] Japanese Published Patent Application No. 2011-066417
[Patent Document 3] Japanese Published Patent Application No. 2016-225613

SUMMARY OF THE INVENTION

Problems to be Solved by the Invention

An object is to provide a semiconductor device with a large storage capacity per unit area. Another object is to provide a semiconductor device with a novel structure in which memory cells are stacked. Another object is to provide a method for driving a semiconductor device with a novel structure. Another object is to provide a semiconductor device with high productivity.

Another object is to provide a module including any of the above semiconductor devices. Another object is to provide an electronic device including any of the above semiconductor devices or the module. Another object is to provide a novel semiconductor device. Another object is to provide a novel module. Another object is to provide a novel electronic device.

Note that the descriptions of these objects do not disturb the existence of other objects. One embodiment of the present invention does not need to achieve all the objects. Other objects will be apparent from the description of the specification, the drawings, the claims, and the like, and other objects can be derived from the description of the specification, the drawings, the claims, and the like.

Means for Solving the Problems

One embodiment of the present invention is a memory cell including a first transistor, a second transistor, a third transistor, a fourth transistor, a first capacitor, and a second capacitor. The memory cell includes a stack including a first conductor, a first insulator over the first conductor, a second conductor over the first insulator, a second insulator over the second conductor, and a third conductor over the second insulator; a first oxide arranged in a ring-like shape on a side surface of an opening portion of the second conductor; a fourth conductor arranged in a ring-like shape in contact with an inner wall of the first oxide; a cylindrical third insulator arranged to penetrate the stack, the first oxide, and the fourth conductor; and a second oxide arranged in contact with an inner wall of the third insulator. The first transistor includes part of the first conductor, part of the second conductor, part of the third conductor, part of the fourth conductor, part of the first oxide, part of the first insulator, and part of the second insulator; the second transistor includes part of the first conductor, part of the third insulator, and part of the second oxide; the third transistor includes part of the third conductor, part of the third insulator, and part of the second oxide; the fourth transistor includes part of the fourth conductor, part of the third insulator, and part of the second oxide; the first capacitor includes part of the first conductor, part of the first insulator, and part of the fourth conductor; and the second capacitor includes part of the third conductor, part of the second insulator, and part of the fourth conductor.

In the above structure, a fourth insulator is provided over the stack, and my stacks and $m_v$ fourth insulators ($m_v$ is an integer greater than or equal to 2) are arranged in a direction perpendicular to one surface of a base.

In the above structure, the semiconductor device includes the base, a fifth insulator, and $m_h$ memory cells ($m_h$ is an integer greater than or equal to 2) in a direction horizontal to the one surface of the base. The fifth insulator is in contact with a side surface of the first conductor, a side surface of the second conductor, and a side surface of the third conductor.

In the above structure, the semiconductor device includes a fifth conductor, a sixth insulator over the fifth conductor, the stack over the sixth insulator, a seventh insulator over the stack, and a sixth conductor over the seventh insulator. The fifth conductor, the third insulator, and the second oxide function as a fifth transistor, and the sixth conductor, the third insulator, and the second oxide function as a sixth transistor.

In the above structure, the first oxide and the second oxide contain In, an element M (M is Al, Ga, Y, or Sn), and Zn.

Effect of the Invention

A semiconductor device with a large storage capacity per unit area can be provided. A semiconductor device with a novel structure in which memory cells are stacked can be provided. A method for driving a semiconductor device with a novel structure can be provided. A semiconductor device with high productivity can be provided.

A module including any of the above semiconductor devices can be provided. An electronic device including any of the above semiconductor devices or the module can be provided. A novel semiconductor device can be provided. A novel module can be provided. A novel electronic device can be provided.

Note that the descriptions of these effects do not disturb the existence of other objects. One embodiment of the present invention does not need to achieve all the effects. Other effects will be apparent from the description of the specification, the drawings, the claims, and the like, and other effects can be derived from the description of the specification, the drawings, the claims, and the like.

BRIEF DESCRIPTION OF DRAWINGS

FIGS. 30A-30D Cross-sectional views and a plan view illustrating a semiconductor device of one embodiment of the present invention.

FIGS. 37A-37D A plan view and cross-sectional views illustrating a method for manufacturing a semiconductor device of one embodiment of the present invention.

MODE FOR CARRYING OUT THE INVENTION

Figure 1A:
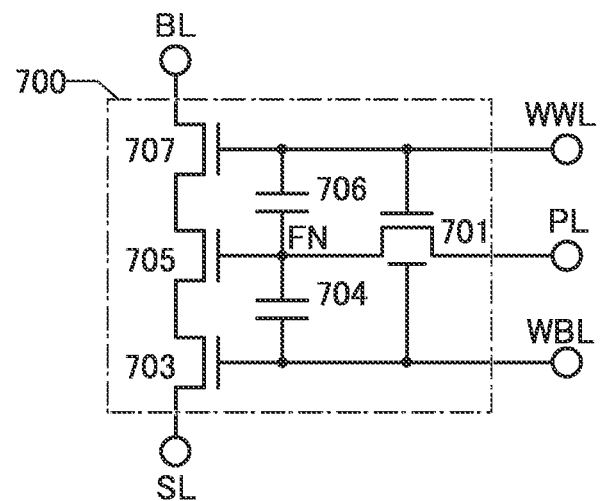
FIGS. 1A-1B A circuit diagram and a cross-sectional view illustrating a semiconductor device of one embodiment of the present invention.

Embodiments of the present invention will be described in detail with reference to the drawings. Note that the present invention is not limited to the description below, and it is easily understood by those skilled in the art that modes and details of the present invention can be modified in various ways. In addition, the present invention should not be construed as being limited to the description in the embodiments given below. In describing structures of the present invention with reference to the drawings, common reference numerals are used for the same portions in different drawings. Note that the same hatched pattern is applied to similar parts, and the similar parts are not especially denoted by reference numerals in some cases.

A structure in the following embodiment can be appropriately applied to, combined with, or replaced with another structure in another embodiment, for example, and the resulting structure can be one embodiment of the present invention.

Note that the size, the thickness of films (layers), or regions in drawings is sometimes exaggerated for simplicity.

In this specification, the expression "film" and the expression "layer" can be interchanged with each other.

A voltage usually refers to a potential difference between a given potential and a reference potential (e.g., a ground potential (GND) or a source potential). Thus, a voltage can be replaced with a potential. In general, a potential (voltage) is relative, and it is determined by the relative quantity from a reference potential. Therefore, even in the case where there is an expression such as "ground potential", the potential is not necessarily 0 V. For example, the lowest potential in a circuit may be represented as a "ground potential". Alternatively, a substantially intermediate potential in a circuit may be represented as a "ground potential". In those cases, a positive potential and a negative potential are defined using the potential as a reference.

Note that the ordinal numbers such as first and second are used for convenience and do not denote the order of steps or the stacking order of layers. Therefore, for example, description can be made even when "first" is replaced with "second", "third", or the like, as appropriate. In addition, the ordinal numbers put in this specification and the like do not correspond to the ordinal numbers that are used to specify one embodiment of the present invention in some cases.

In this specification, the expression "A and B are connected" means the case where A and B are electrically connected as well as the case where A and B are directly connected. Here, the expression "A and B are electrically connected" means the case where electric signals can be transmitted and received between A and B when an object having any electric action exists between A and B.

Note that in this specification, a source of a transistor means a source region that is part of a semiconductor film functioning as an active layer or a source electrode connected to the above semiconductor film. Similarly, a drain of a transistor means a drain region that is part of the above semiconductor film or a drain electrode connected to the above semiconductor film. Moreover, a gate means a gate electrode.

The names of a source and a drain of a transistor interchange with each other depending on the conductivity type of the transistor or levels of potentials supplied to the terminals. In general, in an n-channel transistor, a terminal to which a lower potential is supplied is called a source, and a terminal to which a higher potential is supplied is called a drain. In a p-channel transistor, a terminal to which a lower potential is supplied is called a drain, and a terminal to which a higher potential is supplied is called a source. In this specification, although connection relation of the transistor is described assuming that the source and the drain are fixed for convenience in some cases, actually, the names of the source and the drain interchange with each other depending on the above relation of the potentials.

Unless otherwise specified, off-state current in this specification refers to a drain current of a transistor in an off state. Unless otherwise specified, an off state refers to, in an n-channel transistor, a state where the potential difference ($V_{GS}$) between its gate and source is lower than the threshold voltage (Vth). In a p-channel transistor, an off state refers to a state where $V_{GS}$ is higher than Vth. For example, the off-state current of an n-channel transistor sometimes refers to a drain current that flows when $V_{GS}$ is lower than Vth. The off-state current of a transistor depends on $V_{GS}$ in some cases. Thus, "the off-state current of a transistor is lower than or equal to $10^{-21}$ A" may mean that there is $V_{GS}$ at which the off-state current of the transistor is lower than or equal to $10^{-21}$ A.

Furthermore, the off-state current of a transistor depends on the potential difference ($V_{DS}$) in some cases. Unless otherwise specified, the off-state current in this specification may be off-state current at $V_{DS}$ with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current is sometimes off-state current at $V_{DS}$ at which the reliability of a semiconductor device or the like including the transistor is ensured or $V_{DS}$ at which the semiconductor device or the like including the transistor is used.

Note that a "semiconductor" includes characteristics of an "insulator" in some cases when the conductivity is sufficiently low, for example. Furthermore, a "semiconductor" and an "insulator" cannot be strictly distinguished from each other in some cases because a border therebetween is not clear. Accordingly, a "semiconductor" described in this specification can be called an "insulator" in some cases. Similarly, an "insulator" described in this specification can be called a "semiconductor" in some cases.

Note that a "semiconductor" includes characteristics of a "conductor" in some cases when the conductivity is sufficiently high, for example. Furthermore, a "semiconductor" and a "conductor" cannot be strictly distinguished from each other in some cases because a border therebetween is not clear. Accordingly, a "semiconductor" described in this specification can be called a "conductor" in some cases. Similarly, a "conductor" described in this specification can be called a "semiconductor" in some cases.

In addition, in this specification and the like, the term "insulator" can be replaced with the term "insulating film" or "insulating layer". Moreover, the term "conductor" can be replaced with the term "conductive film" or "conductive layer". Furthermore, the term "semiconductor" can be replaced with the term "semiconductor film" or "semiconductor layer".

Note that an impurity in a semiconductor refers to, for example, elements other than the main components of a semiconductor. For example, an element with a concentration of lower than 0.1 atomic % is an impurity. When an impurity is contained, DOS (Density of States) may be formed in a semiconductor, the carrier mobility may be decreased, or the crystallinity may be decreased, for example. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specifically, there are hydrogen (included in water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

Note that a channel length refers to, for example, the distance between a source (a source region or a source electrode) and a drain (a drain region or a drain electrode) in a region where a semiconductor (or a portion where current flows in a semiconductor when a transistor is on) and a gate electrode overlap with each other, or a region where a channel is formed in a plan view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where current flows in a semiconductor when a transistor is on) and a gate electrode overlap with each other, or a region where a channel is formed. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel formation region formed in a side surface of a semiconductor is increased in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining a cross-sectional TEM image and the like and analyzing the image, for example.

Note that in the case where field-effect mobility, a current value per channel width, and the like of a transistor are obtained by calculation, the calculation is performed using a surrounded channel width in some cases. In that case, a value different from one calculated using an effective channel width is obtained in some cases.

In this specification, "parallel" indicates a state where the angle formed between two straight lines is greater than or equal to $-10°$ and less than or equal to $10°$. Accordingly, the case where the angle is greater than or equal to $-5°$ and less than or equal to $5°$ is also included. The term "substantially parallel" indicates a state where the angle formed between two straight lines is greater than or equal to $-30°$ and less than or equal to $30°$. In addition, "perpendicular" indicates a state where the angle formed between two straight lines is greater than or equal to $80°$ and less than or equal to $100°$. Accordingly, the case where the angle is greater than or equal to $85°$ and less than or equal to $95°$ is also included. The term "substantially perpendicular" indicates a state where the angle formed between two straight lines is greater than or equal to $60°$ and less than or equal to $120°$.

Furthermore, in this specification, in the case where a crystal is a trigonal crystal or a rhombohedral crystal, the crystal is represented as a hexagonal crystal system.

In this specification and the like, a "silicon oxynitride film" is a film in which oxygen content is higher than nitrogen content in its composition. For example, the silicon oxynitride film preferably contains oxygen, nitrogen, silicon, and hydrogen in the concentration ranges of 55 atomic % or higher and 65 atomic % or lower, 1 atomic % or higher and 20 atomic % or lower, 25 atomic % or higher and 35 atomic % or lower, and 0.1 atomic % or higher and 10 atomic % or lower, respectively. Moreover, "silicon nitride oxide film" is a film in which nitrogen content is higher than oxygen content in its composition. For example, the silicon nitride oxide film preferably contains nitrogen, oxygen, silicon, and hydrogen in the concentration ranges of 55 atomic % or higher and 65 atomic % or lower, 1 atomic % or higher and 20 atomic % or lower, 25 atomic % or higher and 35 atomic % or lower, and 0.1 atomic % or higher and 10 atomic % or lower, respectively.

In this specification and the like, a metal oxide means an oxide of a metal in a broad expression. Metal oxides are classified into an oxide insulator, an oxide conductor (including a transparent oxide conductor), an oxide semiconductor (also simply referred to as an OS), and the like. For example, when a metal oxide is used in an active layer of a transistor, the metal oxide is called an oxide semiconductor in some cases. That is, an OS FET can also be called a transistor including a metal oxide or an oxide semiconductor.

Note that in this specification and the like, In:Ga:Zn=4:2:3 or a neighborhood thereof refers to an atomic ratio where, when In is 4 with respect to the total number of atoms, Ga is greater than or equal to 1 and less than or equal to 3 ($1 \leq Ga \leq 3$) and Zn is greater than or equal to 2 and less than or equal to 4.1 ($2 \leq Zn \leq 4.1$). In:Ga:Zn=5:1:6 or a neighborhood thereof refers to an atomic ratio where, when In is 5 with respect to the total number of atoms, Ga is greater than 0.1 and less than or equal to 2 ($0.1 < Ga \leq 2$) and Zn is greater than or equal to 5 and less than or equal to 7 ($5 \leq Zn \leq 7$). In:Ga:Zn=1:1:1 or a neighborhood thereof refers to an atomic ratio where, when In is 1 with respect to the total number of atoms, Ga is greater than 0.1 and less than or equal to 2 ($0.1 < Ga \leq 2$) and Zn is greater than 0.1 and less than or equal to 2 ($0.1 < Zn \leq 2$).

Embodiment 1

In this embodiment, the circuit configuration and the operation of a semiconductor device of one embodiment of the disclosed invention are described with reference to FIG. 1 to FIG. 6.

<Memory Cell>

Figure 1B:
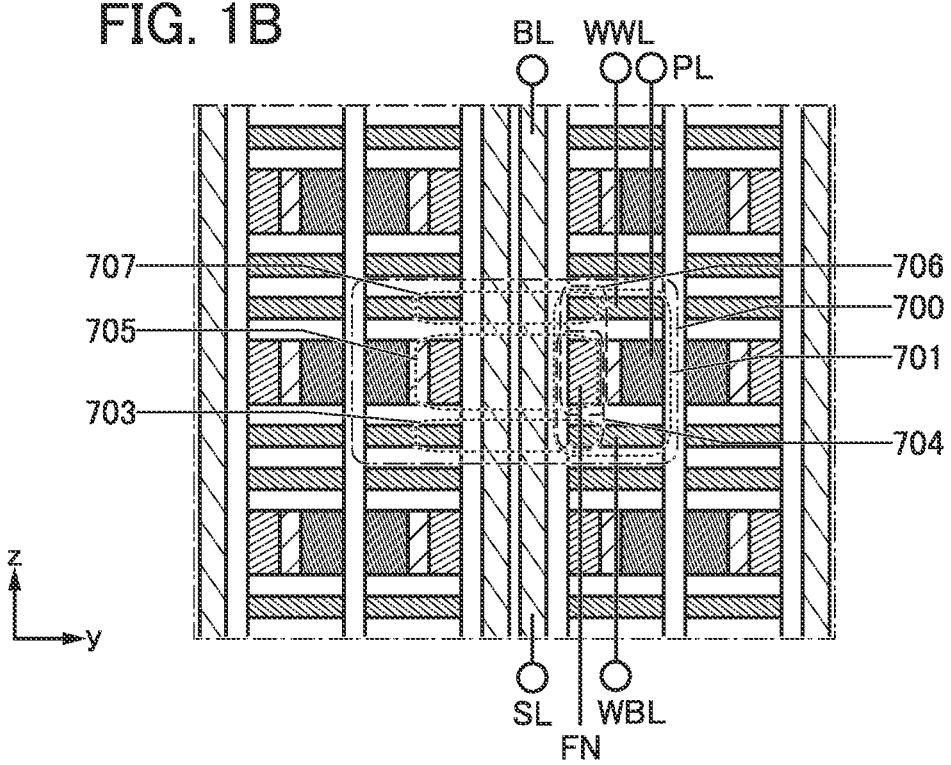

First, the circuit configuration of a memory cell of a semiconductor device described later will be described with reference to FIG. 1(A) and FIG. 1(B). Here, FIG. 1(A) is an example of a circuit diagram three-dimensionally illustrating the circuit configuration of a memory cell 700 to correspond to the three-dimensional structure of the semiconductor device. FIG. 1(B) is a schematic cross-sectional view illustrating a structure example of the memory cell 700.

As illustrated in FIG. 1, the memory cell 700 includes a transistor 701, a transistor 703, a transistor 705, a transistor 707, a capacitor 704, and a capacitor 706, and is electrically connected to a wiring SL, a wiring BL, a wiring PL, a wiring WBL, and a wiring WWL. Note that in the following description, the transistor 701, the transistor 703, the transistor 705, and the transistor 707 are described as n-channel transistors.

In the memory cell 700 illustrated in FIG. 1(A), a first gate electrode of the transistor 701 is electrically connected to the wiring WWL, and a second gate electrode of the transistor 701 is electrically connected to the wiring WBL. A source electrode (or drain electrode) of the transistor 701 is electrically connected to the wiring PL, and a drain electrode (or source electrode) of the transistor 701 is connected to a node FN. A gate electrode of the transistor 703 is electrically connected to the wiring WBL and the other electrode of the capacitor 704. A source electrode (or drain electrode) of the transistor 703 is connected to the wiring SL, and a drain electrode (or source electrode) of the transistor 703 is connected to a source electrode (or drain electrode) of the transistor 705. A gate electrode of the transistor 707 is electrically connected to the wiring WWL and one electrode of the capacitor 706. A source electrode (or drain electrode) of the transistor 707 is connected to the drain electrode (or source electrode) of the transistor 705, and a drain electrode (or source electrode) of the transistor 707 is connected to the wiring BL. A gate electrode of the transistor 705, the other electrode of the capacitor 704, and the other electrode of the capacitor 706 are electrically connected to the node FN.

Here, a transistor using a metal oxide in a channel formation region is preferably used as the transistor 701. As will be described in detail later, a transistor using a metal oxide in a channel formation region has a characteristic of an extremely low off-state current. Therefore, when the transistor 701 is turned off, the potential of the gate electrode of the transistor 705 can be retained for an extremely long time. Provision of the capacitor 704 and the capacitor 706 facilitates retention of a charge supplied to the gate electrode of the transistor 705 and facilitates reading of the retained data.

In addition, it is also preferable to use transistors using a metal oxide in a channel formation region also as the transistor 703, the transistor 705, and the transistor 707. When the transistor 703, the transistor 705, and the transistor 707 are transistors using a metal oxide for channel formation regions, a shoot-through current flowing between the wiring SL and the wiring BL can be reduced.

The memory cell 700 illustrated in FIG. 1(A) and FIG. 1(B) utilizes a characteristic in which the potential of the gate electrode of the transistor 705 can be retained, and thus enables data writing, data retention, and data reading as follows.

First, data writing and retention are described. First, the potentials of the wiring WWL and the wiring WBL are set to potentials at which the transistor 701 is turned on, so that the transistor 701 is turned on. Thus, the potential of the wiring PL is supplied to the node to which the drain electrode (or source electrode) of the transistor 701, the gate electrode of the transistor 705, and the other electrodes of the capacitor 704 and the capacitor 706 are electrically connected. That is, a predetermined charge is supplied to the gate electrode of the transistor 705 (writing). Here, one of charges for supplying two different potentials (hereinafter, a charge for supplying a low potential is referred to as a charge $Q_L$ and a charge for supplying a high potential is referred to as a charge $Q_H$) is given. Note that charges for supplying three or more different potentials may be used to increase storage capacity. After that, the potentials of the wiring WWL and the wiring WBL are set to potentials at which the transistor 701 is turned off, so that the transistor 701 is turned off. Thus, the charge supplied to the gate electrode of the transistor 705 is retained (retention).

Since the off-state current of the transistor 701 is extremely low, the charge of the gate electrode of the transistor 705 is retained for a long time.

Next, data reading is described. By supplying an appropriate potential (a reading potential) to the wiring WWL and the wiring WBL while supplying a predetermined potential (a constant potential) to the wiring SL, the potential of the wiring BL varies depending on the amount of charge retained in the gate electrode of the transistor 705. This is because an apparent threshold voltage $V_{th\_H}$ when $Q_H$ is supplied to the gate electrode of the transistor 705 becomes lower than an apparent threshold voltage $V_{th\_L}$ when $Q_L$ is supplied to the gate electrode of the transistor 705.

Here, an apparent threshold voltage refers to a potential needed to bring the transistor 705 from an "off state" to an "on state" or from an "on state" to an "off state". Thus, the potentials of the wiring WWL and the wiring WBL are set to potentials $V_0$, which are between $V_{th\_H}$ and $V_{th\_L}$, and the potentials $V_0$ are applied to the gate of the transistor 705 as reading voltages, whereby the charge supplied to the gate of the transistor 705 can be determined. For example, in the case where $Q_H$ is supplied in writing, when the potentials of the wiring WWL and the wiring WBL become $V_0$ ($>V_{th\_H}$), the transistor 705 is turned "on". In the case where $Q_L$ is supplied, even when the potentials of the wiring WWL and the wiring WBL become $V_0$ ($<V_{th\_L}$), the transistor 705 remains "off". Thus, the retained data can be read by detecting the output of the potential from the wiring BL with the voltage applied to the wiring WWL.

Note that in the case where memory cells are arranged in a matrix, it is necessary that only data of a desired selected memory cell be read. In the case where the transistor 703, the transistor 705, and the transistor 707 are connected in series in each of the memory cells and the respective memory cells are connected in series, for reading data of a predetermined memory cell and not reading data of other memory cells, potentials at which the transistor 703, the transistor 705, and the transistor 707 are turned on regardless of the state of the gate electrode, that is, potentials higher than $V_{th\_L}$ may be supplied to the wiring WWL and the wiring WBL of a non-selected memory cell which is not a target of reading. Thus, when potentials higher than $V_{th\_L}$ are supplied to the wiring WWL and the wiring WBL, potentials at which the transistor 703, the transistor 705, and the transistor 707 are turned on are applied to the gate electrodes of the transistor 703, the transistor 705, and the transistor 707, so that the transistors can be turned on.

Next, data rewriting is described. First, the potentials of the wiring WWL and the wiring WBL are set to potentials at which the transistor 701 is turned on. When the transistor 701 is turned on, the potential of the wiring PL (a potential for new data) is supplied to the gate electrode of the transistor 705, the capacitor 704, and the capacitor 706. After that, the potentials of the wiring WWL and the wiring WBL are set to potentials at which the transistor 701 is turned off, so that the transistor 701 is turned off. Thus, the charge for new data is supplied to the gate electrode of the transistor 705.

Accordingly, in the semiconductor device of the disclosed invention, data can be directly rewritten by overwriting of data. That is, extraction of a charge from a floating gate with the use of a high voltage necessary for an erasing operation of a flash memory or the like is not needed, and thus a decrease in operation speed can be suppressed. In other words, high-speed operation of the semiconductor device can be achieved.

Note that the node FN to which the drain electrode (or source electrode) of the transistor 701, the gate electrode of the transistor 705, one electrode of the capacitor 704, and the other electrode of the capacitor 706 are electrically connected has a function similar to that of a floating gate of a floating-gate transistor which is used as a nonvolatile memory element. When the transistor 701 is off, the node FN can be regarded as being embedded in an insulator and a charge is retained at the node FN. Since the off-state current of the transistor 701 using an oxide semiconductor such as a metal oxide in a channel formation region is lower than or equal to 1/100000 of that of a transistor formed using a silicon semiconductor, the transistor 701 in an off state functions as a pseudo insulator. Thus, a charge accumulated at the node FN can be retained for a long period. That is, with the transistor 705 using an oxide semiconductor, a memory device which can retain data for a long period even without being supplied with power can be achieved.

For example, when the off-state current of the transistor 701 at room temperature (25° C.) is 10 zA (1 zA (zeptoampere) is $1 \times 10^{-21}$ A) or less and the capacitance value of the capacitor 704 and the capacitor 706 is approximately 10 fF, data can be retained for at least $10^4$ seconds or longer. It is needless to say that the retention time depends on transistor characteristics and the capacitance value.

In the memory cell 700 described in this embodiment, when data is rewritten, a charge is transmitted and received through the transistor 701 using an oxide semiconductor such as a metal oxide in a channel formation region. Therefore, the problem of deterioration of a gate insulating film (tunnel insulating film), which has been pointed out in a conventional floating-gate transistor, does not exist. That is, the deterioration of a gate insulating film due to injection of electrons into a floating gate, which has been regarded as a problem, can be solved. This means that there is no limitation on the number of times of writing in principle. In addition, a high voltage which is needed for writing or erasing data in a conventional floating-gate transistor is unnecessary.

In the memory cell 700, the node FN has a function similar to that of a floating gate of a floating-gate transistor of a flash memory or the like, but the node FN of this embodiment has a feature that is essentially different from that of the floating gate of the flash memory or the like. In a flash memory, since a potential supplied to a control gate is high, it is necessary to keep a proper distance between cells in order to prevent the potential from affecting a floating gate of an adjacent cell. This is a factor inhibiting high integration of the semiconductor device. The factor is attributed to a fundamental principle of a flash memory, in which a high electrical field is applied to generate a tunneling current.

In contrast, the semiconductor device of this embodiment operates by switching of a transistor using an oxide semiconductor and does not use the above-described principle of charge injection by a tunneling current. That is, unlike in a flash memory, a high electrical field for charge injection is unnecessary. Accordingly, it is not necessary to consider an influence of a high electrical field from a control gate on an adjacent cell, which facilitates high integration.

Note that in order to increase the storage capacity of the semiconductor device, a multilevel technique can be employed instead of increasing the integration degree. For example, three or more levels of data are written to one memory cell, whereby the storage capacity can be increased as compared with the case where 2-level (1-bit) data is written. The multilevel technique can be achieved by, for example, giving a charge Q for supplying another potential to the gate electrode of the transistor 705 in addition to the charge $Q_L$ for supplying a low potential and the charge $Q_H$ for supplying a high potential. It is acceptable as long as data such as 4-level (2-bit), 8-level (3-bit), or 16-level (4-bit) data can be retained as multilevel data depending on the amount of accumulated charge.

Here, a specific configuration of the circuit diagram illustrated in FIG. 1(A) is illustrated in FIG. 1(B). The memory cell 700 includes the transistor 701, the transistor 703, the transistor 705, the transistor 707, the capacitor 704, and the capacitor 706.

A conductor functioning as one of the source and the drain of the transistor 701 is provided to extend to the depth direction of the paper and also functions as the wiring PL. A conductor functioning as the other of the source and the drain of the transistor 701 functions as the one electrode of the capacitor 704, the other electrode of the capacitor 706, the node FN, and the gate of the transistor 705. A conductor functioning as the first gate of the transistor 701 is provided to extend to the depth direction of the paper and also functions as the gate of the transistor 707 and the wiring WWL. A conductor functioning as the second gate of the transistor 701 is provided to extend to the depth direction of the paper and also functions as the gate of the transistor 703 and the wiring WBL.

An oxide semiconductor functioning as active layers of the transistor 703, the transistor 705, and the transistor 707 is provided in a cylindrical form and is electrically connected to the wiring BL and the wiring SL.

Note that the more specific structure of the memory cell 700 illustrated in FIG. 1(B) will be described in Embodiment 2.

As illustrated in FIG. 1(B), a circuit configuration in which the transistor 703, the transistor 705, and the transistor 707 are provided so that the channel length direction is perpendicular to the top surface of a substrate is preferable. In such a configuration, a vertical transistor whose gate electrode surrounds the channel formation regions of the transistor 703, the transistor 705, and the transistor 707 and whose source and drain are provided above and below the transistor can be easily used. The transistor of the present invention occupies an extremely smaller area than a standard planar transistor. Thus, storage capacity per unit area can be further increased.

<Memory Cell Array>

A more specific circuit configuration to which the memory cell 700 illustrated in FIG. 1 is applied and an operation thereof will be described below with reference to FIG. 2 to FIG. 6.

FIG. 2 and FIG. 3 illustrate examples of a block circuit diagram of a semiconductor device including a memory cell array 790 in which the memory cells 700 are integrated. In the following description, rectangular coordinates using an x-axis, a y-axis, and a z-axis are set as illustrated in FIG. 2 and FIG. 3 for the sake of convenience.

The memory cell array 790 includes $m_1 \times m_2 \times m_3$ memory cells 700 ($m_1$, $m_2$, and $m_3$ are natural numbers). In the memory cell array 790, $m_1$ memory cells 700, $m_2$ memory cells 700, and $m_3$ memory cells 700 are arranged in a cuboid shape in the x-axis direction, the y-axis direction, and the z-axis direction, respectively. In the following description, the memory cells 700 are indicated by coordinates as memory cells 700(1,1,1) to ($m_1$,$m_2$,$m_3$) in some cases.

Figure 2A:
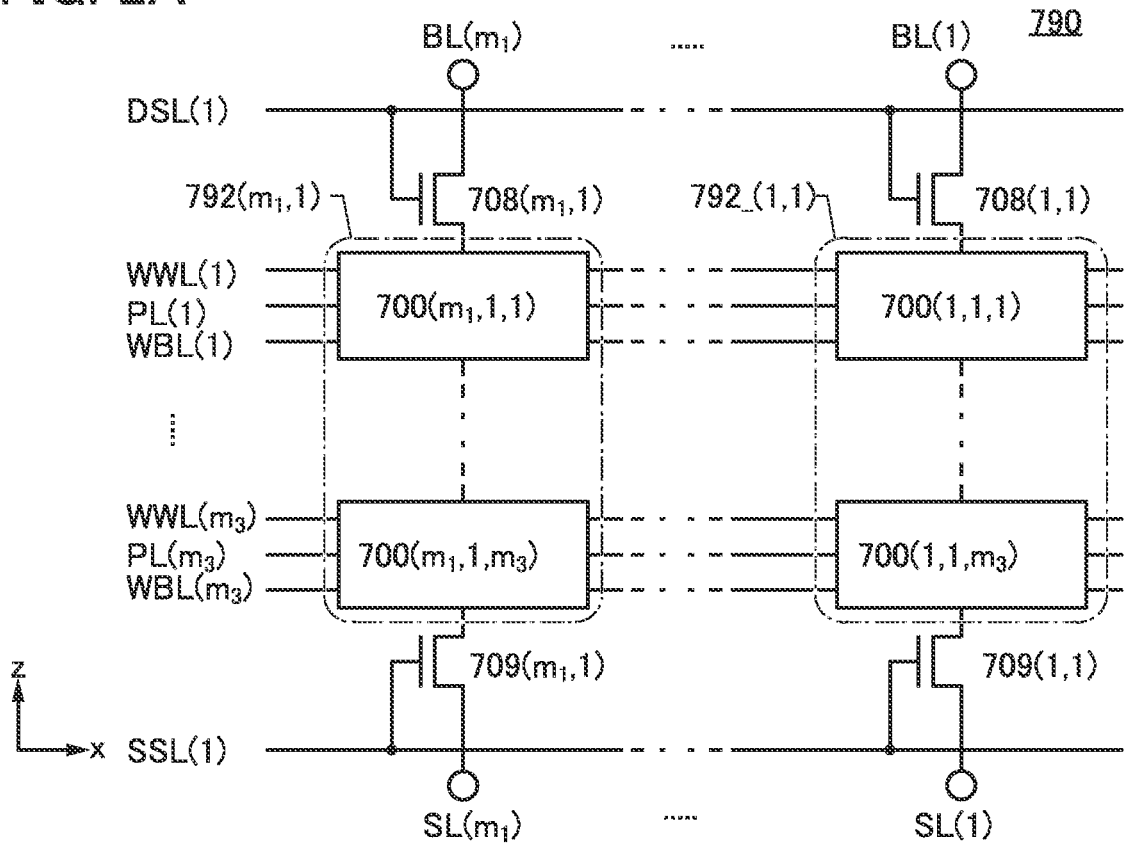
FIGS. 2A-2B Block diagrams illustrating a semiconductor device of one embodiment of the present invention.
Figure 2B:
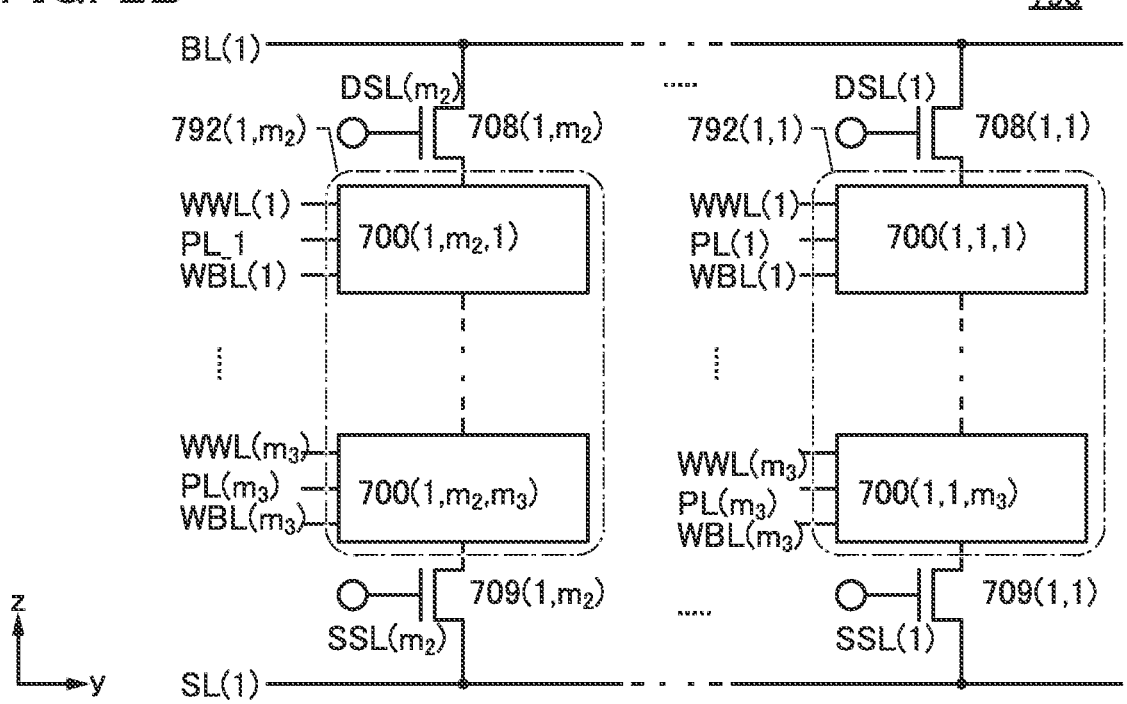
Figure 3A:
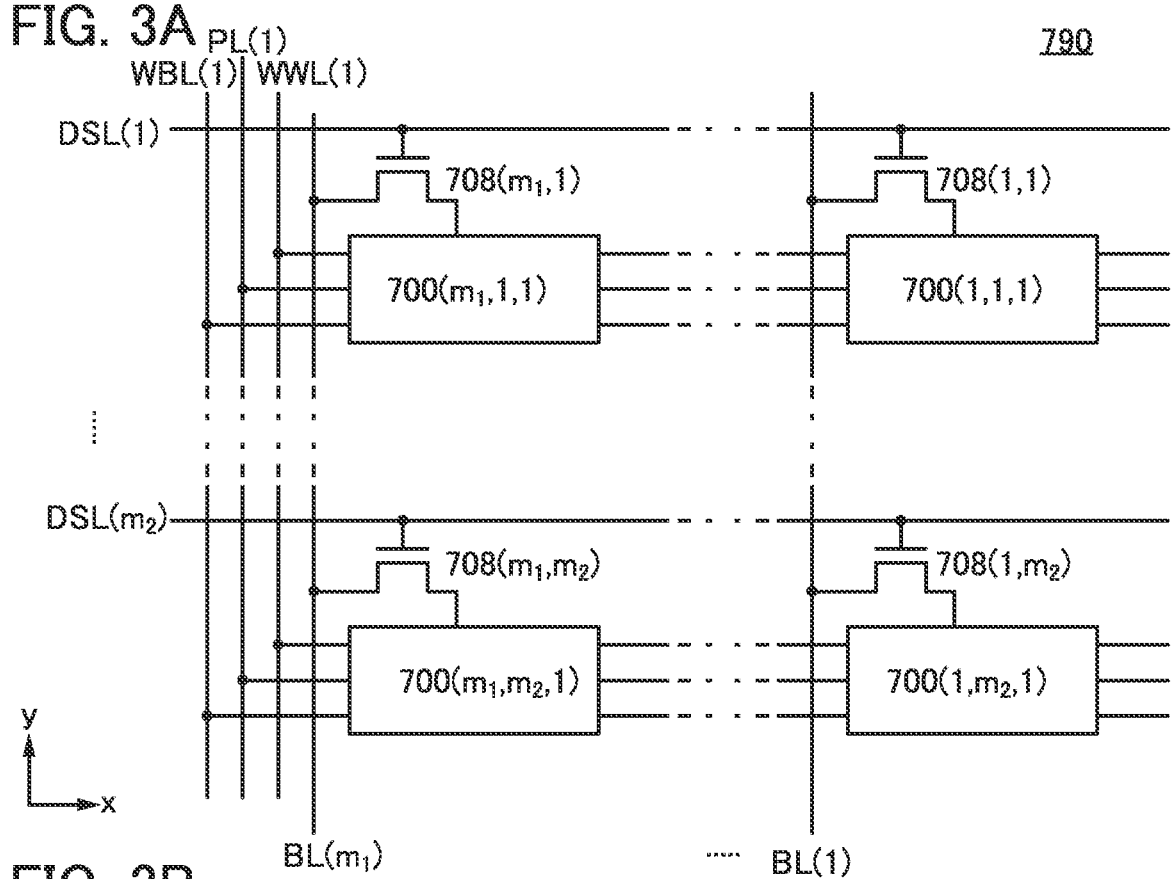
FIGS. 3A-3B Block diagrams illustrating a semiconductor device of one embodiment of the present invention.
Figure 3B:
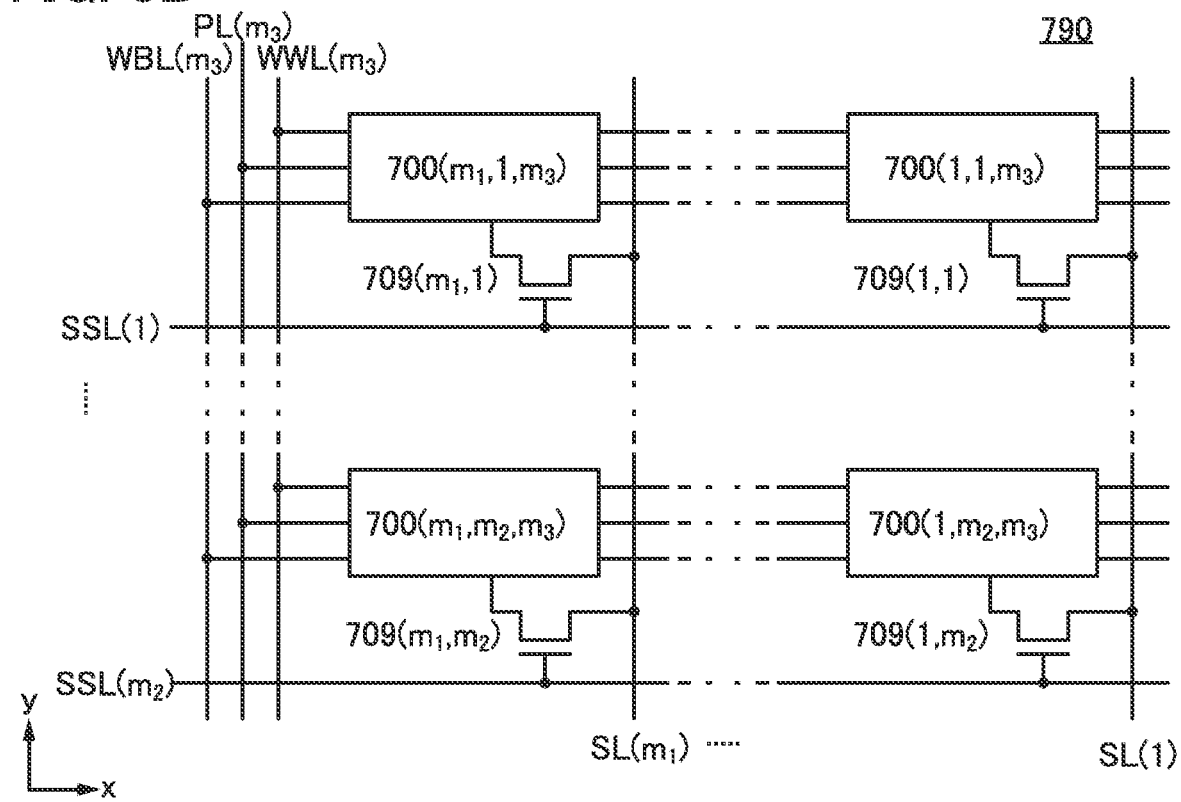

Here, FIG. 2(A) illustrates a block diagram of an x-z plane including the memory cell 700(1,1,1), and FIG. 2(B) illustrates a block diagram of a y-z plane including the memory cell 700(1,1,1). FIG. 3(A) illustrates a block diagram of an x-y plane including the memory cell 700(1,1,1), and FIG. 3(B) illustrates a block diagram of an x-y plane including the memory cell 700($m_1$,$m_2$,$m_3$).

As illustrated in FIG. 2, a cell string in which $m_3$ memory cells 700 are stacked in the z-axis direction is a string 792. Note that $m_3$ memory cells are connected in series in the string 792. As illustrated in FIG. 3, the strings 792 are arranged in a matrix of $m_1$ rows in the x-axis direction and $m_2$ columns in the y-axis direction. Thus, the strings 792 are indicated by coordinates as strings 792(1,1) to ($m_1$,$m_2$) in some cases.

As illustrated in FIG. 2 and FIG. 3(A), the memory cell 700 positioned on one end of the string 792, specifically, the memory cell 700(1,1,1) or the like is electrically connected to a source electrode (or drain electrode) of a transistor 708 functioning as a selection transistor. Moreover, as illustrated in FIG. 2 and FIG. 3(B), the memory cell 700 positioned on another end of the string 792, specifically, a memory cell 700(1,1,$m_3$) or the like is electrically connected to a source electrode (or drain electrode) of a transistor 709 functioning as a selection transistor.

That is, the memory cell array 790 includes $m_1 \times m_2$ transistors 708 and $m_1 \times m_2$ transistors 709, whose numbers each correspond to the number of strings 792. Like the string 792, the transistors 708 and the transistors 709 are arranged in a matrix of $m_1$ rows in the x-axis direction and $m_2$ columns in the y-axis direction. Thus, in some cases, in the following description, the transistors 708 and the transistors 709 are indicated by coordinates as transistors 708(1,1) to ($m_1$,$m_2$) and transistors 709(1,1) to ($m_1$,$m_2$).

A drain electrode (or source electrode) of the transistor 708 is electrically connected to the wiring BL. A gate electrode of the transistors 708 is electrically connected to a wiring DSL. A drain electrode (or source electrode) of the transistor 709 is electrically connected to the wiring SL. A gate electrode of the transistor 709 is electrically connected to a wiring SSL.

The memory cell array 790 includes the wiring DSL provided to extend in the x-axis direction as illustrated in FIG. 2(A). As illustrated in FIG. 3(A), one wiring DSL is electrically connected to $m_1$ transistors 708. In addition, $m_2$ wirings DSL are provided in parallel in the y-axis direction.

The memory cell array 790 includes the wiring SSL provided to extend in the x-axis direction as illustrated in FIG. 2(A). As illustrated in FIG. 3(B), one wiring SSL is electrically connected to $m_1$ transistors 709. In addition, $m_2$ wirings DSL are provided in parallel in the y-axis direction.

As illustrated in FIG. 2 and FIG. 3, the memory cell array 790 includes the wiring WWL, the wiring WBL, and the wiring PL. As illustrated in FIG. 2(A) and FIG. 3, the wiring WWL, the wiring WBL, and the wiring PL each include $m_2$ regions provided in parallel in the y-axis direction to extend in the x-axis direction. In addition, an end portion of each of the $m_2$ regions extending in the x-axis direction is electrically connected to a region extending in the y-axis direction. The wiring WWL, the wiring WBL, and the wiring PL are electrically connected to $m_1$ memory cells 700 in one region extending in the x-axis direction. Thus, as illustrated in FIG. 3(A) and FIG. 3(B), one wiring WWL, one wiring WBL, and one wiring PL are electrically connected to $m_1 \times m_2$ memory cells 700. In addition, $m_3$ wirings WWL, $m_3$ wirings WBL, and $m_3$ wirings PL are provided in parallel in the z-axis direction.

The memory cell array 790 includes the wiring BL provided to extend in the y-axis direction as illustrated in FIG. 2(B). As illustrated in FIG. 3(A), one wiring BL is electrically connected to $m_2$ memory cells 700 through the transistors 708. In addition, $m_1$ wirings BL are provided in parallel in the x-axis direction.

The memory cell array 790 includes the wiring SL provided to extend in the y-axis direction as illustrated in FIG. 2(B). As illustrated in FIG. 3(B), one wiring SL is electrically connected to $m_2$ memory cells 700 through the transistors 709. In addition, $m_1$ wirings SL are provided in parallel in the x-axis direction.

Here, a specific memory cell 700($n_1,n_2,n_3$) ($n_1$ is a natural number greater than or equal to 1 and less than or equal to $m_1$, $n_2$ is a natural number greater than or equal to 1 and less than or equal to $m_2$, and $n_3$ is a natural number greater than or equal to 1 and less than or equal to $m_3$) includes a transistor 701($n_1,n_2,n_3$), a transistor 703($n_1,n_2,n_3$), a transistor 705($n_1,n_2,n_3$), a transistor 707($n_1,n_2,n_3$), a capacitor 704($n_1,n_2,n_3$), and a capacitor 706($n_1,n_2,n_3$).

In the memory cell 700($n_1,n_2,n_3$), a first gate electrode of the transistor 701 ($n_1,n_2,n_3$) is electrically connected to a wiring WWL($n_3$), and a second gate electrode of the transistor 701 ($n_1,n_2,n_3$) is electrically connected to a wiring WBL($n_3$).

A source electrode (or drain electrode) of the transistor 701($n_1,n_2,n_3$) is electrically connected to a wiring PL($n_3$), and a drain electrode (or source electrode) of the transistor 701($n_1,n_2,n_3$) is connected to a node FN($n_1,n_2,n_3$).

A gate electrode of the transistor 703($n_1,n_2,n_3$) is electrically connected to the wiring WBL($n_3$) and one electrode of the capacitor 704($n_1,n_2,n_3$). A source electrode (or drain electrode) of the transistor 703($n_1,n_2,n_3$) is connected to a wiring SL($n_1$) through a transistor 709($n_1,n_2$), and a drain electrode (or source electrode) of the transistor 703($n_1,n_2,n_3$) is connected to a source electrode (or drain electrode) of a transistor 705($n_1,n_2,n_3$).

A gate electrode of the transistor 707($n_1,n_2,n_3$) is electrically connected to the wiring WWL($n_3$) and one electrode of the capacitor 706($n_1,n_2,n_3$). A source electrode (or drain electrode) of the transistor 707($n_1,n_2,n_3$) is connected to a drain electrode (or source electrode) of the transistor 705 ($n_1,n_2,n_3$), and a drain electrode (or source electrode) of the transistor 707($n_1,n_2,n_3$) is connected to a wiring BL($n_1$) through a transistor 708($n_1,n_2$).

A gate electrode of the transistor 705($n_1,n_2,n_3$), the other electrode of the capacitor 704($n_1,n_2,n_3$), and the other electrode of the capacitor 706($n_1,n_2,n_3$) are electrically connected to the node FN($n_1,n_2,n_3$).

As described above, a plurality of memory cells 700 are included in the string 792 and stacked so that the transistors 705 functioning as memory calls are connected in series. The storage capacity of the string 792 can be increased in accordance with the number of stacked memory cells 700. Thus, the storage capacity per unit area of the memory cell array 790 including the strings 792 arranged in a matrix can be increased in accordance with the number of stacked memory cells 700.

In the memory cell array 790, as illustrated in FIG. 2 and FIG. 3, the memory cells 700 are preferably provided so that the channel length direction of the transistor 701, the channel length direction of the transistor 705, the wiring DSL, the wiring BL, the wiring SSL, the wiring SL, the wiring PL, the wiring WWL, and the wiring WBL three-dimensionally intersect with each other.

The channel length direction of the transistor 701 is preferably substantially perpendicular to the channel length direction of the transistor 705. The channel length direction of the transistor 705 is preferably substantially perpendicular to the top surface of the substrate over which the memory cell 700 is provided, and the channel length direction of the transistor 701 is preferably substantially parallel to the top surface of the substrate.

The wiring PL, the wiring WWL, and the wiring WBL each preferably include a plurality of regions substantially perpendicular to the wiring SSL and the wiring DSL. The wiring BL, the wiring SL, the wiring PL, the wiring WWL, and the wiring WBL are preferably substantially parallel to the top surface of the substrate over which the memory cell 700 is provided.

With such a configuration of the memory cell 700, a plurality of memory cells 700 can be stacked such that the respective transistors 705 are connected in series. This allows provision of a semiconductor device whose storage capacity per unit area can be increased in accordance with the number of stacked memory cells 700.

<Operation Example of Memory Cell Array>

Figure 4:
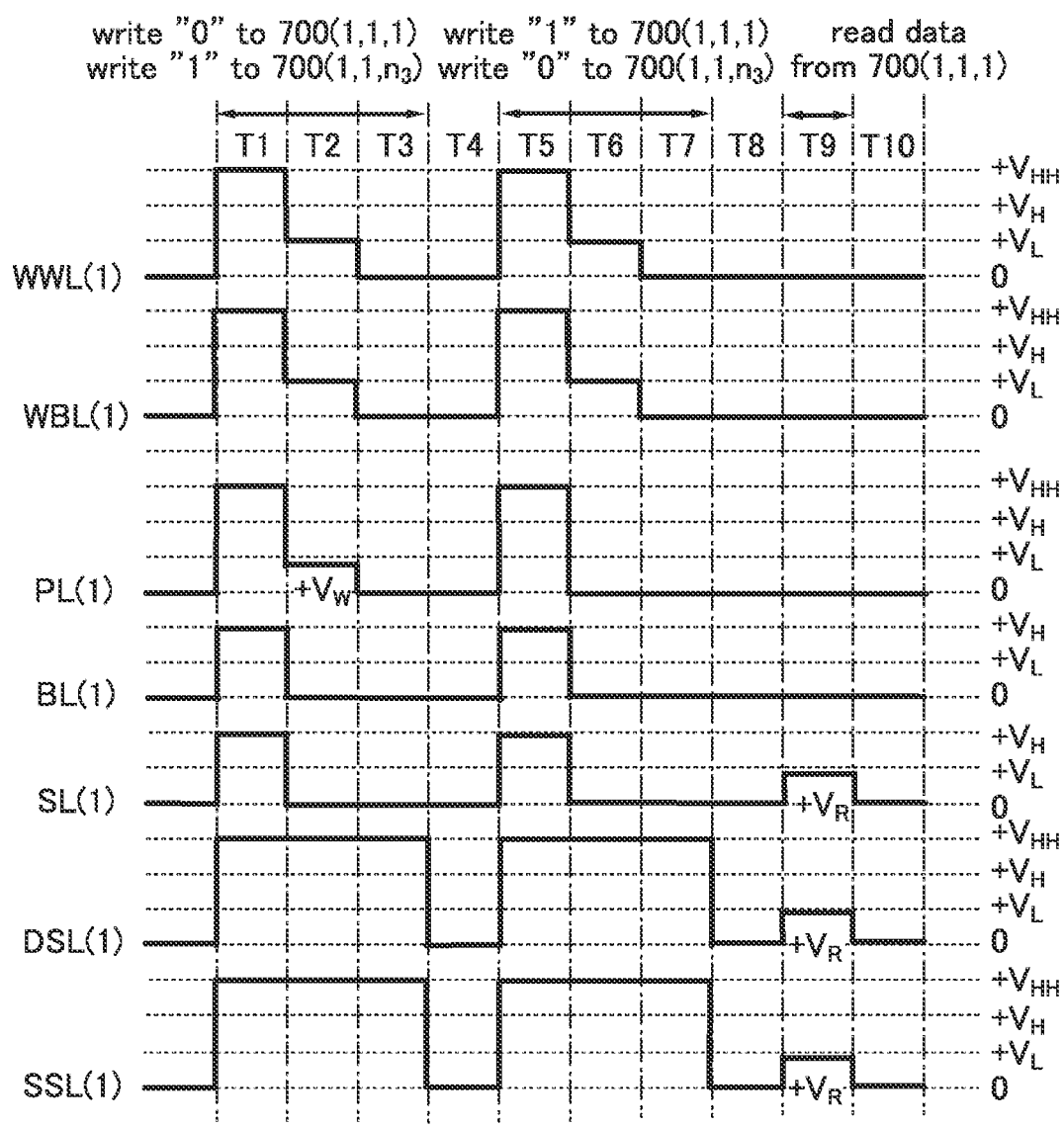
FIG. 4 A timing chart showing a method for driving a semiconductor device of one embodiment of the present invention.
Figure 5:
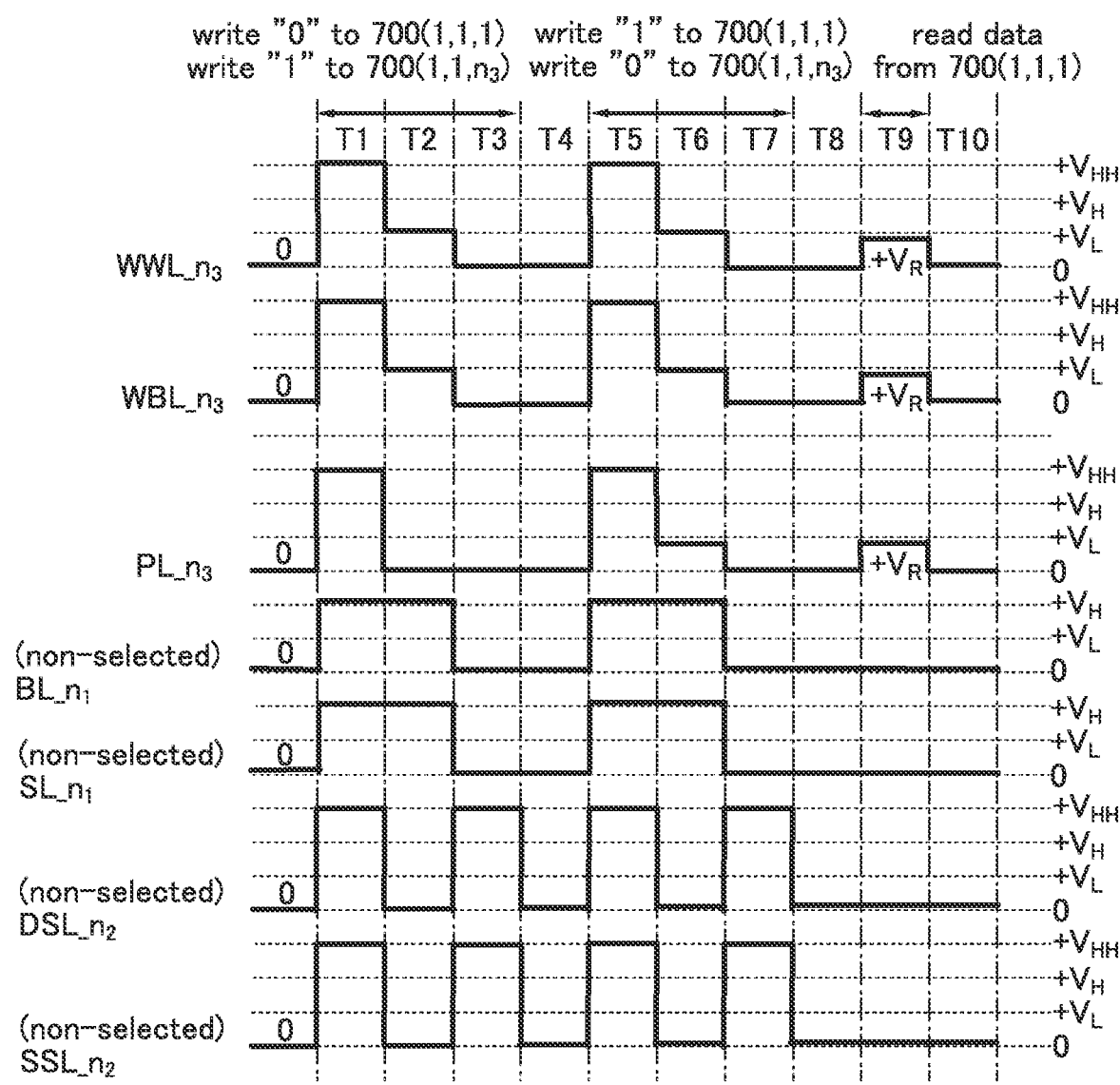
FIG. 5 A timing chart showing a method for driving a semiconductor device of one embodiment of the present invention.
Figure 6:
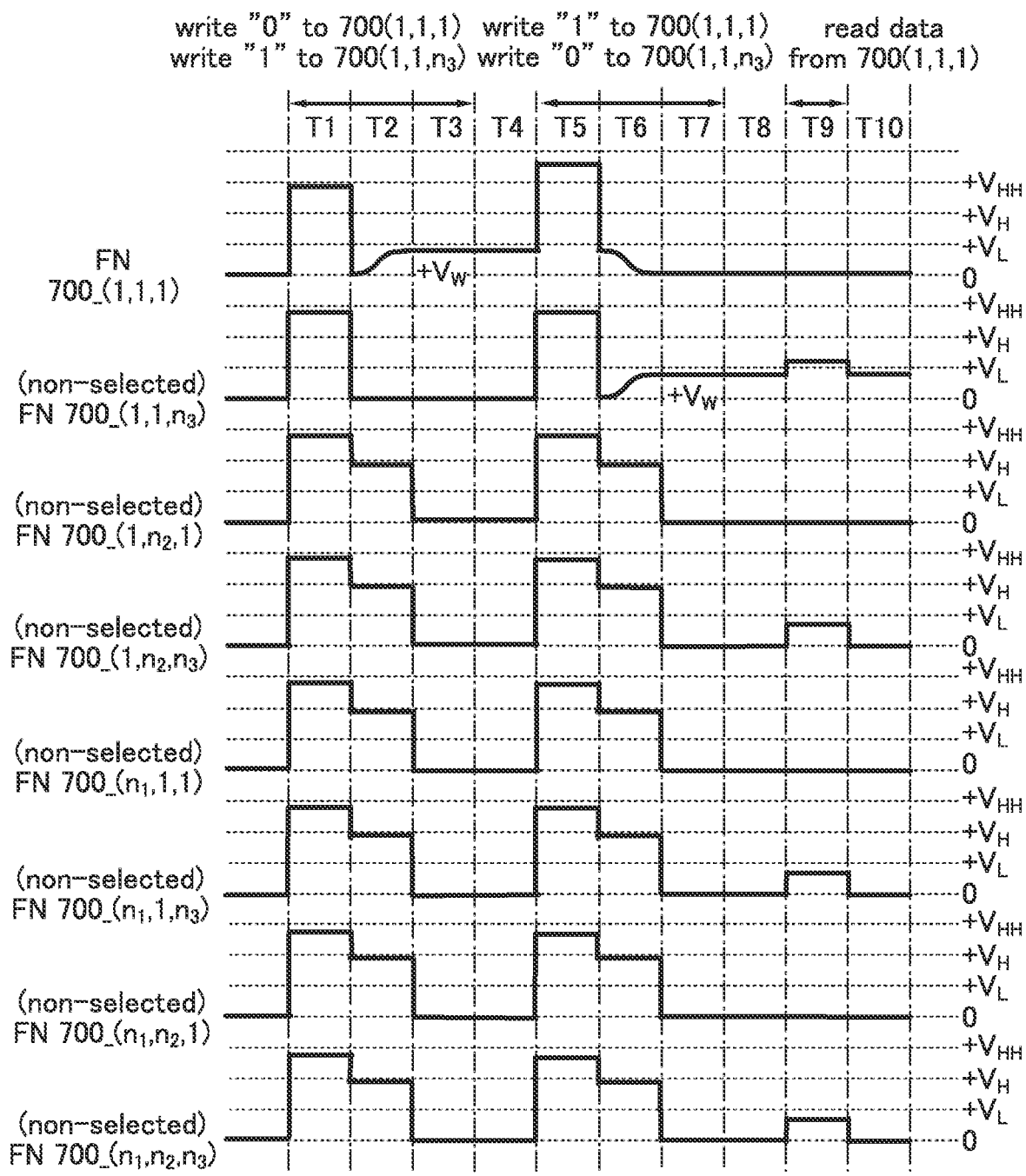
FIG. 6 A timing chart showing a method for driving a semiconductor device of one embodiment of the present invention.

FIG. 4 to FIG. 6 show timing charts showing examples of data writing operation, data retention operation, and data reading operation on the memory cell 700. FIG. 4 and FIG. 5 show timing charts of potentials supplied to the respective wirings in operation of a selected memory cell 700 to which data is written (here, the memory cell 700(1,1,1) and a memory cell 700(1,1,$n_3$)) and a selected memory cell 700 from which data is read (here, the memory cell 700(1,1,1)).

Here, when the memory cell 700(1,1,1) is a 1-bit (2-level) memory cell that can retain a positive charge with a certain size (data "0") or a vacant state (data "1"), a node FN(1,1,1) has either a positive potential or 0 V when data is retained. That is, a gate electrode of a transistor 705(1,1,1) connected to the node FN(1,1,1) has either a positive potential or 0 V when data is retained.

FIG. 6 shows a timing chart of potentials supplied to the node FN(1,1,1) included in the memory cell 700(1,1,1) and the nodes FN included in the non-selected memory cells.

Note that in FIG. 4 to FIG. 6, a series of operations of writing of the data "1" defined in the above, retention of the data, and reading of the data is shown in a period T1 to a period T10.

Note that data that can be retained by the memory cell 700 is not limited to the two values defined in the above. By broadening the range of the potential supplied to the node FN and dividing potentials within the range, data having two or more values can be retained, for example. Consequently, the amount of data that can be stored in the memory cell 700 can be increased.

Respective operation examples of the memory cell 700 using a potential $V_R$, a potential $V_L$, a potential $V_H$, a potential $V_{HH}$, a potential $V_{HHH}$, and a potential $V_W$, each of which has a certain level, are described in below as examples.

Note that the potential $V_R$ is a potential for reading, and the potential $V_W$ is a potential for writing. A multi-level memory is possible when a writing potential $+V_W$ corresponds to a gray level.

The magnitude relationship between the absolute values of the potential $V_R$, the potential $V_L$, the potential $V_H$, the potential $V_{HH}$, and the potential $V_W$ is $0<V_W \leq V_L<V_H<V_{HH}$. Note that a potential "$+V_L$", a potential "$+V_W$", a potential "$+V_H$", and a potential "$+V_{HH}$" are potentials higher than the threshold voltage of the transistor 705, and the potential "$V_R$" is a potential lower than the threshold voltages of the transistor 701, the transistor 703, the transistor 705, and the transistor 707. The transistor 701 has normally-off characteristics. The transistor 703, the transistor 705, and the transistor 707 have normally-off characteristics or normally-on characteristics.

Note that in this specification and the like, normally off refers to being in an off state without application of a potential by a power source. Specifically, normally off means that current per micrometer of channel width flowing through a transistor when a voltage is not applied to a gate or the gate is supplied with a ground potential is $1\times10^{-20}$ A or lower at room temperature, $1\times10^{-18}$ A or lower at 85° C., or $1\times10^{-16}$ A or lower at 125° C. Moreover, normally on refers to being in an on state without application of a potential by a power source.

[Data Writing Operation]

First, an operation example of writing data to the memory cell 700(1,1,1) and the memory cell 700(1,1,$n_3$) placed in a string 792(1,1) is described using the timing charts shown in FIG. 4 to FIG. 6. In FIG. 4 to FIG. 6, the period T1 to the period T3 are periods for writing the data "0" to the memory cell 700(1,1,1) and writing the data "1" to the memory cell 700(1,1,$n_3$). The period T5 to the period T7 are periods for writing the data "1" to the memory cell 700(1,1,1) and writing the data "0" to the memory cell 700(1,1,$n_3$).

Note that as shown in FIG. 6, the potential of 0 V is retained at each of the nodes FN just before the period T1, and the data "0" is stored in the memory cells 700.

First, to prevent false rewriting on the non-selected cell, precharge is performed on the transistor 703, the transistor 705, and the transistor 707 of the non-selected memory cell 700.

In the period T1, the potential $+V_{HH}$ is supplied to a wiring DSL(1) to a wiring DSL($m_2$), whereby the transistor 708(1,1) to the transistor 708(1,$m_2$) that correspond to the string 792(1,1) to the string 792(1,$m_2$) and function as string selection transistors are turned on. The potential $+V_{HH}$ is supplied to a wiring SSL(1) to a wiring SSL($m_2$), whereby the transistor 709(1,1) to the transistor 709(1,$m_2$) that correspond to the string 792(1,1) to the string 792(1,$m_2$) and function as string selection transistors are turned on.

Next, the potential $+V_H$ is supplied to a wiring BL(1) to a wiring BL($m_1$) and a wiring SL(1) to a wiring SL($m_1$), whereby precharge of the potential $+V_H$ is performed on the active layer of the transistor 703, the active layer of the transistor 705, and the active layer of transistor 707 of the non-selected memory cell 700.

Next, the potential $+V_{HH}$ is supplied to a wiring WWL(1) to a wiring WWL($m_3$), the potential $+V_{HH}$ is supplied to a wiring WBL(1) to a wiring WBL($m_3$), and the potential $+V_{HH}$ is supplied to a wiring PL(1) to a wiring PL($m_3$), whereby the transistor 703, the transistor 705, and the transistor 707 are turned on. When the wiring PL(1) to the wiring PL($m_3$) have higher potentials than the wiring WWL(1) to the wiring WWL($m_3$) and the wiring WBL(1) to the wiring WBL($m_3$), the transistor 701 is turned off when precharge is performed, so that rewriting of data retained at the node FN can be prevented.

That is, by the precharge on the non-selected memory cell, the potential of the node FN of the non-selected memory cell 700, such as a node FN(1,$n_2$,$n_3$) of a memory cell 700(1,$n_2$,$n_3$), a node FN($n_1$,1,1) of a memory cell 700($n_1$,1,1), a node FN($n_1$, 1,$n_3$) of a memory cell 700($n_1$,1,$n_3$), a node FN($n_1$,$n_2$,1) of a memory cell 700($n_1$,$n_2$,1), or the node FN($n_1$,$n_2$,$n_3$) of the memory cell 700($n_1$,$n_2$,$n_3$), becomes a potential between the potential $+V_H$ and the potential $+V_{HH}$ by capacitive coupling regardless of the potential of the node FN in the period T1.

The gate voltage of the transistor 701 of the non-selected memory cell 700 corresponds to a potential difference between the gate potential $+V_{HH}$ of the transistor 701 and the drain potential (or source potential)$+V_{HH}$ of the transistor 701. The potential of the node FN of the non-selected memory cell 700 is determined by charges accumulated in the potential of the node FN and capacitive coupling between the potentials of the wiring WWL($n_3$) and the wiring WBL($n_3$) and the potential of the active layer of the transistor 705.

In the case where a positive charge is accumulated at the node FN of the non-selected memory cell 700, the potential becomes higher than the potential $+V_{HH}$ by capacitive coupling between the wiring WWL($n_3$) and the wiring WBL($n_3$), and the active layer of the transistor 705. Therefore, the transistor 701 of the non-selected memory cell 700 is turned off, so that false rewriting can be prevented. In the case where charges are not accumulated at the node FN of the non-selected memory cell 700, the potential becomes the potential $+V_{HH}$ or a potential that is high enough to be approximated to the potential $+V_{HH}$ by capacitive coupling between the wiring WWL($n_3$) and the wiring WBL($n_3$), and the active layer of the transistor 705. Therefore, in the non-selected memory cell 700, charge transfer does not occur between the drain (or source) of the transistor 701 and the node FN. Thus, when the gate voltage of the transistor 701 is a potential lower than the potential of the node FN of the non-selected memory cell 700, the off state of the transistor 701 maintains, whereby false rewriting can be prevented.

Next, the potentials of the wirings DSL other than the selected DSL(1), that is, a non-selected wiring DSL(2) to the non-selected wiring DSL($m_2$), are set to 0. Moreover, the potentials of the wirings SSL other than the selected wiring SSL(1), that is, a non-selected wiring SSL(2) to the non-selected wiring SSL($m_2$), are set to 0. That is, the transistors 708 and the transistors 709 other than the transistor 708(1,1) and the transistor 709(1,1) that correspond to the selected string 792(1,1), that is, a transistor 708(2,1) and the transistor 709($n_1$,$n_2$) that correspond to a non-selected string 792(2,1) to a non-selected string 792($m_1$,$m_2$), are turned off. Thus, the active layers of the transistors 703, the transistors 705, and the transistors 707 included in the memory cell 700 of the strings 792 other than the selected string 792(1,1), that is, the non-selected strings 792, are brought into a floating state.

As described above, in the period of writing operation, the potential $+V_H$ can be retained in the active layers of the transistor 703, the transistor 705, and the transistor 707 included in the memory cell 700 in the non-selected string 792 subjected to the precharge.

In the period T2, the potential $+V_{HH}$ is supplied to the wiring DSL(1) and the potential $+V_H$ is supplied to the wiring BL($n_1$), whereby the transistors 708 other than the transistor 708(1,1) electrically connected to the wiring DSL(1), that is, the transistor 708(2,1) to the transistor 708($m_1$, 1) are turned off. Also in the period T2, the potential $+V_{HH}$ is supplied to the wiring SSL(1) and the potential $+V_H$ is supplied to the wiring SL($n_1$), whereby the transistors 709 other than the transistor 709(1,1) electrically connected to the wiring SSL(1), that is, the transistor 709(2,1) to the transistor 709($n_1$,1) are turned off.

Here, the transistor 708($n_1$, 1) and the transistor 709($n_1$,1) which share the same wiring DSL(1) and the same wiring SSL(1) with the selected string 792 are turned on when the wiring DSL(1) and the wiring SSL(1) are set to the potential $+V_{HH}$. In other words, the potential $+V_H$ precharged to the active layers of the transistor 703, the transistor 705, and the transistor 707 beforehand cannot be charged. Therefore, the potential $+V_H$ is supplied to the wiring BL($n_1$) and the wiring SL($n_1$) so that the precharged potential $+V_H$ is retained in the active layers of the transistor 703, the transistor 705, and the transistor 707.

Thus, in a memory cell 700(1,$n_2$,1), the memory cell 700(1,$n_2$,$n_3$), a memory cell 700(2,1,1), and the memory cell 700($n_1$,$n_2$,$n_3$) in the non-selected string 792, the potentials of the active layers of the transistors 703, the transistors 705, and the transistors 707 included in the memory cells 700 are maintained at $+V_H$, whereby false rewriting on the memory cell 700(1,$n_2$,1), the memory cell 700(1,$n_2$,$n_3$), the memory cell 700(2,1,1), and the memory cell 700($n_1$,$n_2$,$n_3$) in the non-selected string 792 can be prevented.

Next, in the period T2, the data "0" is written to the memory cell 700(1,1,1) and the data "1" is written to the memory cell 700(1,1,$n_3$).

First, the potential $+V_{HH}$ is supplied to the wiring DSL(1) to turn on the transistor 708(1,1) corresponding to the string 792(1,1) including the selected memory cell 700(1,1,1) and the selected memory cell 700(1,1,$n_3$). The potential $+V_{HH}$ is supplied to the wiring SSL(1) to turn on the transistor 709(1,1) of the string 792(1,1).

Next, a potential 0 is supplied to the wiring BL(1) and the wiring SL(1). The potential $+V_w$ is supplied to the wiring PL(1), the potential $+V_L$ is supplied to the wiring WWL(1), and the potential $+V_L$ is supplied to the wiring WBL(1), whereby the transistor 701 of the memory cell 700(1,1,1) is turned on. The transistor 701 is turned on, so that the potential $+V_w$ is supplied to the node FN(1,1,1). The potential of the node FN(1,1,1) therefore increases until a potential difference between the potential $+V_w$ of the node FN(1,1) and the gate potential $+V_L$ of the transistor 701 becomes smaller than the threshold voltage of the transistor 701, and thus the transistor 701 is turned off. That is, when the potential of the node FN(1,1,1) becomes the potential $+V_w$, the data "0" has been written to the node FN(1,1,1).

Furthermore, the data "1" can be written to the memory cell 700(1,1,$n_3$) in the selected string 792(1,1) concurrently with data writing to the memory cell 700(1,1,1). In that case, the potential 0 is supplied to a wiring PL(n) and the potential $+V_L$ is supplied to WWL($n_3$) and the wiring WBL($n_3$), whereby the transistor 701 of the selected memory cell 700(1,1,$n_3$) is turned on. When the potential 0 corresponding to the potential of the data "1" is supplied to the node FN(1,1,$n_3$), the data "1" has been written to the node FN(1,1,$n_3$).

Note that data can be written to the memory cell 700(1,1,1) to the memory cell 700(1,1,$m_3$) separately. On the contrary, data are preferably written to the memory cell 700(1,1,1) to the memory cell 700(1,1,$m_3$) concurrently, in which case false rewriting can be prevented.

After data is written to the selected memory cell 700, the potential 0 is supplied to the wirings WWL(1) to WWL($m_3$) and the wiring WBL(1) to the wiring WBL($m_3$).

Next, in the period T3, the potential precharged in the period T1 is returned to the initial state in the transistor 703, the transistor 705, and the transistor 707 of the non-selected memory cell 700. First, the potential $+V_{HH}$ is supplied to the wiring DSL(1) to the wiring DSL($m_2$), whereby the transistor 708(1,1) to the transistor 708(1,$m_2$) that correspond to the string 792(1,1) to the string 792(1,$m_2$) are turned on. The potential $+V_{HH}$ is supplied to the wiring SSL(1) to the wiring SSL($m_2$), whereby the transistor 709(1,1) to the transistor 709(1,$m_2$) that correspond to the string 792(1,1) to the string 792(1,$m_2$) are turned on.

Next, the potential 0 is supplied to the wiring BL(1) to the wiring BL($m_1$) and the wiring SL(1) to the wiring SL($m_1$), whereby the precharged potentials in the active layers of the transistor 703, the transistor 705, and the transistor 707 are returned to the state just before the period T1. Note that the retention time of the precharged potential depends on the off-state leakage currents of the transistor 708 and the transistor 709. Therefore, in the case where the retention time of the precharged potential is shorter than or equal to writing time, the step of returning the precharged potential to the initial state in the period T3 can be omitted.

As shown in the periods T5 to T7 in FIG. 4 to FIG. 6, the data "1" can be written to the memory cell 700(1,1,1) and the data "0" can be written to the memory cell 700(1,1,$n_3$) in the same string 792(1,1). For the writing processing, the writing periods T1 to T3 can be referred to. That is, when the writing potentials are changed in the writing processing shown in the writing periods T1 to T3, the data "1" can be written to the memory cell 700(1,1,1) and the data "0" can be written to the memory cell 700(1,1,$n_3$).

[Data Reading Operation]

An operation example of reading data stored in the memory cell 700(1,1,1) is described below using the timing charts shown in FIG. 4 to FIG. 6. In FIG. 4 to FIG. 6, the period T9 is the period for reading the data.

As shown in the timing charts of FIG. 4 to FIG. 6, at the time before the period T9, the data "1" is stored in a selected memory cell 700 (here, the memory cell 700(1,1,1)). In other words, in the memory cell 700(1,1,1), the potential of 0 V is supplied to the node FN(1,1,1).

As shown in FIG. 4 to FIG. 6, the data stored in the memory cell 700(1,1,1) is read in the period T9.

First, the transistor 708 and the transistor 709 that correspond to the string 792(1,1) including a memory cell 700 to be selected are turned on. The potential $+V_R$ is supplied to the wiring DSL(1), the wiring SSL(1), and SL(1), whereby the transistor 708 and the transistor 709 are turned on.

Next, the potential 0 is supplied to the wiring WWL(1) and the wiring WBL(1), whereby the data stored at the node FN(1,1,1) of the memory cell 700(1,1,1) is read.

When the potential $+V_R$ is supplied to the wiring WWL(2) to the wiring WWL($m_3$) and the wiring WBL(2) to the wiring WBL($m_3$) in reading, the potential of the node FN of the non-selected memory cell 700 in the selected string 792(1,1) is increased by capacitive coupling, so that the transistor 703, the transistor 705, and the transistor 707 of the non-selected memory cell 700 in the selected string 792(1,1) are turned on.

As described above, in the selected string 792, the transistor 703, the transistor 705, and the transistor 707 of the non-selected memory cell 700(1,1,$m_3$) other than the transistor 703, the transistor 705, and the transistor 707 of the selected memory cell 700(1,1,1) are turned on. Thus, a potential corresponding to the state of data at the node FN(1,1,1) of the memory cell 700(1,1,1) is output to the wiring BL(1) depending on on or off and the driving capability of the transistor 703, the transistor 705, and the transistor 707 of the selected memory cell 700(1,1,1), whereby the data stored in the memory cell 700(1,1,1) can be read.

Through the series of operations described above (the period T9), the data stored in the memory cell 700(1,1,1) can be read.

[Data Retention Operation]

The memory cell 700 of one embodiment of the present invention can retain a potential applied to the node FN though the potential is any of positive, 0 V, and negative.

Data retention operation can be basically achieved only by turning off the potentials (0 V) applied to all the wirings after the above-described data writing operation.

Note that in order to achieve long-term data retention in the memory cell 700, the off-state current (it may be expressed as Id in the Vg-Id characteristics at Vg=0 V) of the transistor 701 included in the memory cell 700 needs to be reduced as much as possible. The transistor 701 of one embodiment of the present invention use a metal oxide in a channel formation region, whereby the off-state current of the transistor can be reduced significantly as compared with the case of using Si or the like. Accordingly, in the semiconductor device of one embodiment of the present invention, data can be retained for an extremely long period. When data can be retained for a long period, the refresh operation of the memory cell 700 becomes unnecessary, or the frequency of the refresh operation can be extremely low. Accordingly, in one embodiment of the present invention, it is possible to provide a semiconductor device with extremely low power consumption.

As described above, a semiconductor device including the memory cell array 790 of one embodiment of the present invention can achieve favorable reliability and low power consumption.

The structure, method, and the like described above in this embodiment can be used in combination as appropriate with the structures, methods, and the like described in the other embodiments.

Embodiment 2

In this embodiment, structures of a semiconductor device including a memory cell and a memory cell array of one embodiment of the present invention will be described with reference to FIG. 7 to FIG. 32.

<Structure of Semiconductor Device>

Figure 7A:
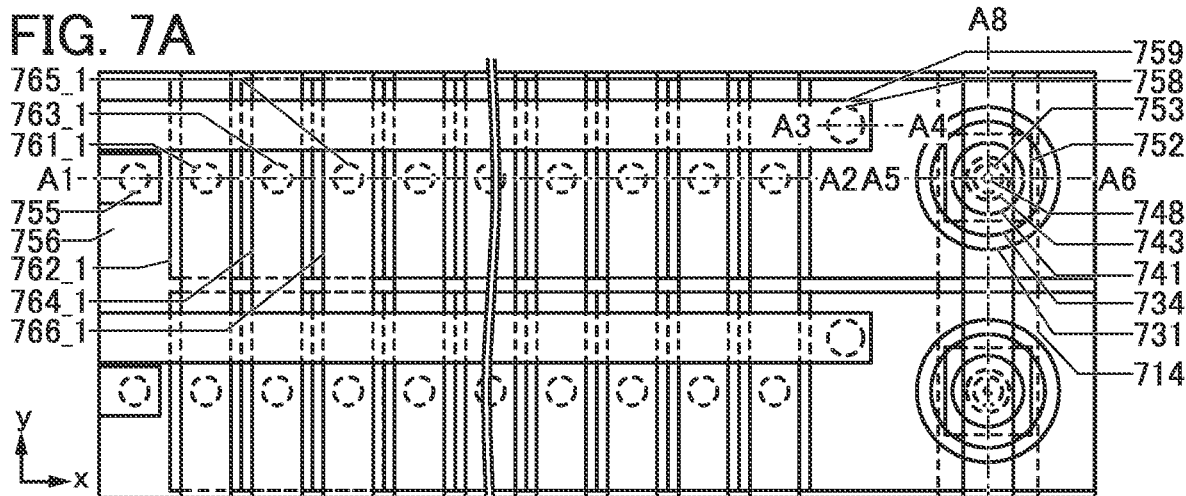
FIGS. 7A-7D Cross-sectional views and a plan view illustrating a semiconductor device of one embodiment of the present invention.
Figure 7B:
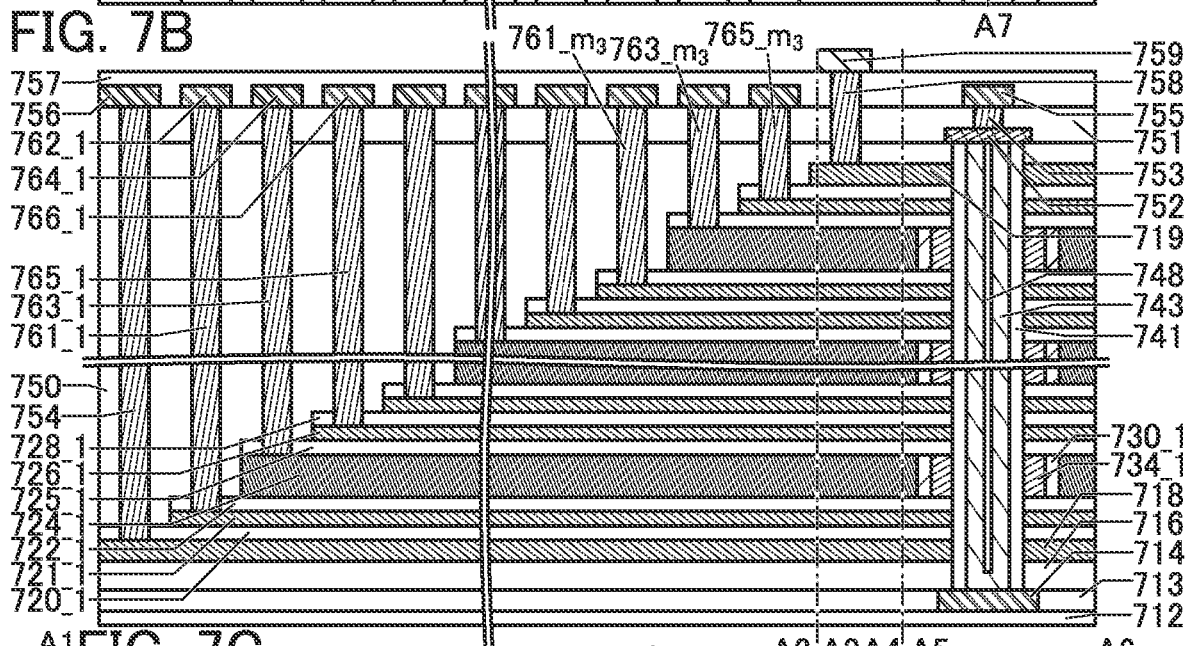
Figure 7C:
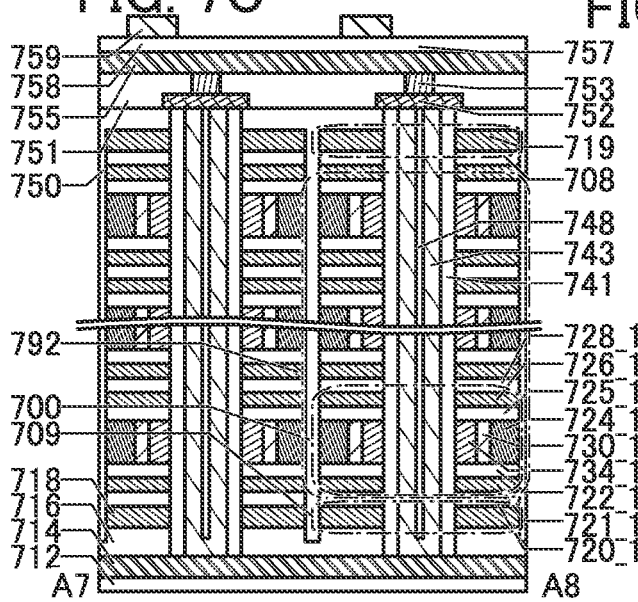
Figure 7D:
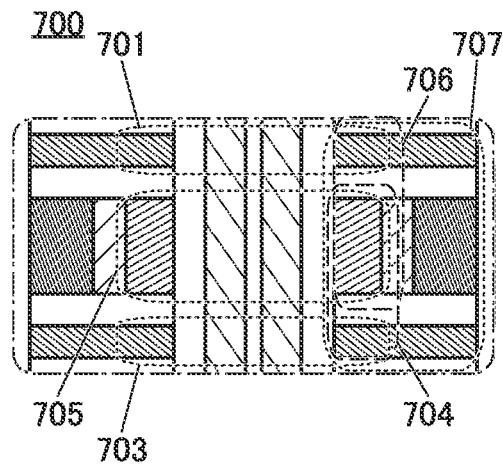

Structures of the memory cell 700 and the memory cell array 790 in which a plurality of memory cells 700 are arranged are described with reference to FIG. 7. FIG. 7(A) is a top view of the memory cell array 790. FIG. 7(B) is a cross-sectional view of a portion indicated by the dashed-dotted lines A1-A2, A3-A4, and A5-A6 in FIG. 7(A). Furthermore, FIG. 7(C) is a cross-sectional view of a portion indicated by the dashed-dotted line A7-A8 in FIG. 7(A). FIG. 7(D) is an enlarged view of the memory cell 700 illustrated in FIG. 7(C). Note that in the following description, rectangular coordinates using an x-axis, a y-axis, and a z-axis are set as illustrated in FIG. 7 for the sake of convenience. Here, the x-axis and the y-axis are parallel to the top surface of a base provided with the memory cell array 790, and the z-axis is perpendicular to the top surface of the base.

Note that in FIG. 7, some components of the memory cell array 790 are not illustrated.

Here, the memory cell array 790 includes $m_1 \times m_2$ strings 792, $m_1 \times m_2$ transistors 708, and $m_1 \times m_2$ transistors 709, and one string 792 includes $m_3$ memory cells 700 ($m_1$, $m_2$, and $m_3$ are each natural numbers greater than or equal to 2). One memory cell 700 includes one transistor 701, one transistor 703, one transistor 705, one transistor 707, one capacitor 704, and one capacitor 706.

Specifically, the memory cell array 790 includes an insulator 712, an insulator 713 and a conductor 714 over the insulator 712, and the insulator 716 over the insulator 713 and the conductor 714. The memory cell array 790 also includes, over the insulator 716, a conductor 718 and $m_3$ layers of stacks in each of which an insulator 720 over the conductor 718, a conductor 721 over the insulator 720, an insulator 722 over the conductor 721, a conductor 724 over the insulator 722, an insulator 725 over the conductor 724, a conductor 726 over the insulator 725, and an insulator 728 over the conductor 726 are stacked. Hereinafter, in some cases, an ordinal number is added to the end of each numeral to distinguish the stacks. Specifically, in some cases, the components of a stack which is a first layer close to the base are denoted by an insulator 720_1, a conductor 721_1, an insulator 722_1, a conductor 724_1, an insulator 725_1, a conductor 726_1, and an insulator 728_1; and the respective components of a stack which is an $m_3$-th layer are denoted by an insulator 720_$m_3$, a conductor 721_$m_3$, an insulator 722_$m_3$, a conductor 724_$m_3$, an insulator 725_$m_3$, a conductor 726_$m_3$, and an insulator 728_$m_3$.

As illustrated in FIG. 7(A), the conductor 718, the conductor 721, the conductor 724, the conductor 726, and a conductor 719 are divided by an insulator 750 and provided to extend in the y-axis direction.

The conductor 719 is provided over the insulator 728_$m$, which is the uppermost layer of the stack, and the insulator 750 is provided over the conductor 719. Opening portions are formed to penetrate the stack, the conductor 719, and the insulator 750. A ring-like oxide 730 is provided on the side surface of the opening portion in the conductor 724 of the stack, and a ring-like conductor 734 is provided on the side surface of the opening portion with the ring-like oxide 730 therebetween. The side surface of the conductor 734 that is not in contact with the oxide 730 has a surface which is on the same surface as the side surface of the opening portion in the insulator 725.

In the opening portion formed to penetrate the stack as described above, an insulator 741 is included, an oxide 743 is included on the inner side of the insulator 741, and an insulator 748 is included on the inner side of the oxide 743. A conductor 752 is provided to be in contact with an upper end portion of the oxide 743, and an insulator 751 is provided over the insulator 750 and the conductor 752.

The insulator 720, the insulator 722, the insulator 725, the insulator 728, the insulator 750, and the insulator 751 include opening portions reaching the conductor 718, the conductor 721, the conductor 724, the conductor 726, the conductor 719, and a conductor 753. A conductor 754 in contact with the conductor 718, a conductor 761 in contact with the conductor 721, a conductor 763 in contact with the conductor 724, a conductor 765 in contact with the conductor 726, and the conductor 753 in contact with the conductor 752 are included in the opening portions, and a conductor 756 over the conductor 754, a conductor 762 over the conductor 761, a conductor 764 over the conductor 763, a conductor 766 over the conductor 765, and a conductor 755 over the conductor 753 are provided. Hereinafter, in some cases, an ordinal number is added to the end of each symbol of the conductor 761 to the conductor 766 to distinguish the conductors. Specifically, the same ordinal numbers as the ordinal numbers added to the conductor 721, the conductor 724, and the conductor 726, to which the conductor 761, the conductor 763, and the conductor 765 are connected, are added. Moreover, the same ordinal numbers as the ordinal numbers added to the conductor 761, the conductor 763, and the conductor 765, to which the conductor 762, the conductor 764, and the conductor 766 are connected, are added.

An insulator 757 is provided over the insulator 751, the conductor 756, the conductor 762, the conductor 764, the conductor 766, and the conductor 755. The insulator 751 and the insulator 757 include an opening portion reaching the conductor 753. The conductor 755 is included in the opening portion, and a conductor 759 is provided over the conductor 755 and the insulator 757.

As illustrated in FIG. 7(A) and FIG. 7(B), the conductor 718, the conductor 719, the conductor 721, the conductor 724, and the conductor 726 are provided to extend in the x-axis direction. As illustrated in FIG. 7(A) and FIG. 7(C), the conductor 714 and the conductor 755 are provided to extend in the y-axis direction. That is, the conductor 718 and the conductor 719 are preferably provided to intersect with each other, and the conductor 714 and the conductor 755 are preferably provided to intersect with each other. As illustrated in FIG. 7(B) and FIG. 7(C), the conductor 754, the conductor 761, the conductor 763, the conductor 765, and the oxide 743 are provided to extend in the z-axis direction.

Note that in FIG. 7 and the like, the top surface of each opening portion is, but not limited to, circular; the top surface may be, for example, elliptic or polygonal, e.g., a triangle or a quadrangle. In the case where a polygonal shape is employed, corners thereof may be rounded. Furthermore, the shape of the top surface of the structure body in the opening portion may change depending on the shape of the top surface of the opening portion. Each opening portion may have a shape where a lower (on the substrate side) cross-sectional area of the opening portion perpendicular to the z-axis is smaller than an upper cross-sectional area of the opening portion perpendicular to the z-axis.

Here, as illustrated in FIG. 7(C), the transistor 708 includes the conductor 719 functioning as a gate, the insulator 741 functioning as a gate insulator, the oxide 743 functioning as a channel formation region, and the insulator 748. Some regions of the oxide 743 function as a source region and a drain region of the transistor 708 in some cases. The transistor 709 includes the conductor 718 functioning as a gate, the insulator 741 functioning as a gate insulator, the oxide 743 functioning as a channel formation region, and the insulator 748. Some regions of the oxide 743 function as a source region and a drain region of the transistor 709 in some cases.

As illustrated in FIG. 7(D), the memory cell 700 includes the transistor 701, the transistor 703, the transistor 705, the transistor 707, the capacitor 704, and the capacitor 706. The transistor 701 includes the conductor 721 and the conductor 726 functioning as gates, the oxide 730 functioning as a channel formation region, the insulator 722 and the insulator 725 functioning as gate insulators, the conductor 724 functioning as one of a source and a drain, and 734 functioning as the other of the source and the drain.

The transistor 703 includes the conductor 721 functioning as a gate, the oxide 743 functioning as a channel formation region, and the insulator 741 functioning as a gate insulator. Some regions of the oxide 743 function as a source region and a drain region of the transistor 703 in some cases. The transistor 705 includes the conductor 734 functioning as a gate, the oxide 743 functioning as a channel formation region, and the insulator 741 functioning as a gate insulator. Some regions of the oxide 743 function as a source region and a drain region of the transistor 705 in some cases. The transistor 707 includes the conductor 726 functioning as a gate, the oxide 743 functioning as a channel formation region, and 741 functioning as a gate electrode. Some regions of the oxide 743 function as a source region and a drain region of the transistor 707 in some cases.

Here, the insulator 748 may function as an interlayer film; however, the insulator 748 is not necessarily provided. In that case, the opening portion may be filled with the insulator 748. Alternatively, the opening portion may be filled with an inert gas instead of the insulator 748. Alternatively, a region of the insulator 748 may be in a vacuum.

The capacitor 704 includes the conductor 721 functioning as one electrode, the conductor 734 functioning as the other electrode, and the insulator 722 functioning as a dielectric. The capacitor 706 includes the conductor 734 functioning as one electrode, the conductor 726 functioning as the other electrode, and the insulator 725 functioning as a dielectric.

Thus, the conductor 721 functions as the gate of the transistor 701, the gate of the transistor 703, and the other electrode of the capacitor 704. The conductor 726 functions as the gate of the transistor 701, the gate of the transistor 707, and the one electrode of the capacitor 706. The insulator 722 functions as a gate insulator of the transistor 701 and a dielectric of the capacitor 704. The insulator 725 functions as the gate insulator of the transistor 701 and a dielectric of the capacitor 706. The conductor 734 functions as the gate of the transistor 705 and one of the source and the drain of the transistor 701.

The insulator 741 includes a region functioning as gate insulators of the transistor 708, the transistor 703, the transistor 705, the transistor 707, and the transistor 709. The oxide 743 includes regions functioning as channel formation regions, source regions, and drain regions of the transistor 708, the transistor 703, the transistor 705, the transistor 707, and the transistor 709.

As illustrated in FIG. 7, the conductor 721, the conductor 724, and the conductor 726 are divided by the insulator 750 and shared by the memory cells 700 arranged in the x-axis direction, and have a function of the wiring WWL, the wiring WBL, and the wiring PL illustrated in FIG. 2 and the like. The conductor 721, the conductor 724, and the conductor 726 are penetrated by the oxide 743, and the insulator 741 is provided between the conductor 721, the conductor 724, and the conductor 726 and the oxide 743 to surround the vicinity of the oxide 743.

As illustrated in FIG. 7, the conductor 718 and the conductor 719 are divided by the insulator 750 and shared by the transistors 708 or the transistors 709 arranged in the x-axis direction, and have a function of the wiring SSL and the wiring DSL illustrated in FIG. 2 and the like. The conductor 718 and the conductor 719 are penetrated by the oxide 743, and the insulator 741 is provided between the conductor 718 and the conductor 719 and the oxide 743 to surround the vicinity of the oxide 743.

As illustrated in FIG. 7, the conductor 714 and the conductor 755 are shared by the transistors 708 or the transistors 709 arranged in the y-axis direction, and have a function of the wiring SL or the wiring BL illustrated in FIG. 2 and the like.

As illustrated in FIG. 7(A) and FIG. 7(B), the conductor 718, the conductor 721, the conductor 724, and the conductor 719 are preferably provided in a step-like shape so that a lower conductor further extends in the x-axis direction beyond an upper conductor. Since the insulator 720, the conductor 721, the insulator 722, the conductor 724, and the conductor 719 are provided in a step-like shape, part of a region of a lower conductor does not overlap with an upper conductor; thus, regions of the conductors not overlapping with each other and the conductor 754, the conductor 761, the conductor 763, the conductor 765, the conductor 753, and the conductor 758, which are provided in a plug-like shape, can be connected.

Furthermore, the conductor 756, the conductor 762, the conductor 764, and the conductor 766 are provided over the conductor 754, the conductor 761, the conductor 763, the conductor 765, and the conductor 753, which are provided in a plug-like shape. The conductor 756, the conductor 762, the conductor 764, and the conductor 766 can be used as wirings.

Similarly, the insulator 757 may be provided over the conductor 756, the conductor 762, the conductor 764, and the conductor 766; the conductor 758 to be connected to the conductor 719 may be provided; and the conductor 759 functioning as a wiring may be provided over the conductor 758.

Accordingly, in the memory cell array 790, $m_3$ stacks are repeatedly stacked in the z-axis direction, whereby the memory cells 700 are arranged in the z-axis direction. The memory cells 700 are arranged in the z-axis direction to form the string 792 described in the above embodiment. Moreover, the ring-like oxides 730, the ring-like conductors 734, the insulators 741, the oxides 743, and the like, which are surrounded by the conductor 724, are repeatedly arranged in $m_2$ columns in the y-axis direction, whereby $m_2$ memory cells 700 are arranged in the y-axis direction. Similarly, the strings 792 are arranged in $m_1$ rows in the x-axis direction, whereby the strings 792 form the memory cell array 790 described in the above embodiment.

<Constituent Material of Semiconductor Device>

Constituent materials that can be used for a semiconductor device described in this embodiment are described below.

First, the base (not illustrated) provided with the memory cell array 790 preferably has an insulating surface. As a substrate having an insulating surface, a semiconductor substrate provided with an insulating film on its surface, an insulator substrate, a conductor substrate provided with an insulator on its surface, or the like is used. For the semiconductor substrate, a semiconductor substrate of silicon, germanium, or the like or a semiconductor substrate of silicon carbide, silicon germanium, gallium arsenide, indium phosphide, zinc oxide, gallium oxide, or the like may be used, for example. A semiconductor substrate on which a transistor for a driver circuit is provided may be used. As the insulator substrate, a glass substrate, a quartz substrate, a sapphire substrate, a stabilized zirconia substrate (e.g., an yttria-stabilized zirconia substrate), or a resin substrate may be used, for example. In addition, a semiconductor substrate in which an insulator region is included in the above semiconductor substrate, for example, an SOI (Silicon On Insulator) substrate or the like may be used. As the conductor substrate, a graphite substrate, a metal substrate, an alloy substrate, a conductive resin substrate, or the like may be used.

<<Insulator>>

An insulating oxide, an insulating nitride, an insulating oxynitride, an insulating nitride oxide, an insulating metal oxide, an insulating metal oxynitride, and an insulating metal nitride oxide are given as an insulator. The insulator described in the above embodiment can be formed of a single layer or a stacked layer of an insulator selected from insulators described below depending on its function.

With miniaturization and high integration of a transistor, for example, a problem of leakage current or the like may arise because a gate insulator becomes thin. When a high-k material is used for the insulator functioning as a gate insulator, the voltage when the transistor is operated can be reduced while the physical thickness of the gate insulator is kept. By contrast, when a material having a low dielectric constant is used for the insulator functioning as an interlayer film, the parasitic capacitance generated between wirings can be reduced. Thus, a material is preferably selected depending on the function of an insulator.

As an insulator having a high dielectric constant, gallium oxide, hafnium oxide, zirconium oxide, an oxide containing aluminum and hafnium, an oxynitride containing aluminum and hafnium, silicon nitride oxide, silicon nitride, an oxide containing silicon and hafnium, an oxynitride containing silicon and hafnium, a nitride containing silicon and hafnium, or the like can be given. For example, such an insulator may be used as a dielectric of the capacitor.

As an insulator having low dielectric constant, silicon oxide, silicon oxynitride, silicon oxide to which fluorine is added, silicon oxide to which carbon is added, silicon oxide to which carbon and nitrogen are added, porous silicon oxide, a resin, or the like can be given.

In particular, silicon oxide and silicon oxynitride are thermally stable. Accordingly, a stacked-layer structure which is thermally stable and has a low dielectric constant can be obtained by combining silicon oxide or silicon oxynitride with a resin, for example. Examples of the resin include polyester, polyolefin, polyamide (e.g., nylon or aramid), polyimide, polycarbonate, and acrylic. A stacked-layer structure which is thermally stable and has a high dielectric constant can be obtained by combining silicon oxide and silicon oxynitride with an insulator having high dielectric constant.

Each of the insulator 712, the insulator 713, the insulator 716, the insulator 728, the insulator 748, the insulator 750, the insulator 751, and the insulator 757 preferably includes an insulator having a low dielectric constant. For example, the insulators preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and low dielectric constant. Examples of the resin include polyester, polyolefin, polyamide (e.g., nylon or aramid), polyimide, polycarbonate, and acrylic.

An insulator having a function of inhibiting the passage of oxygen and impurities such as hydrogen may be used as the insulator 712, the insulator 713, the insulator 716, the insulator 728, the insulator 748, the insulator 750, the insulator 751, or the insulator 757. For the insulator having a function of inhibiting the passage of oxygen and impurities such as hydrogen, a metal oxide such as aluminum oxide, hafnium oxide, magnesium oxide, gallium oxide, germanium oxide, yttrium oxide, zirconium oxide, lanthanum oxide, neodymium oxide, or tantalum oxide; silicon nitride oxide; silicon nitride; or the like may be used, for example.

The transistor using an oxide semiconductor is surrounded by an insulator which has a function of inhibiting the passage of oxygen and impurities such as hydrogen, whereby the electrical characteristics of the transistor can be stable.

As an insulator which has a function of inhibiting the passage of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, for the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For example, a metal oxide containing one or more kinds of hafnium, aluminum, gallium, yttrium, zirconium, tungsten, titanium, tantalum, nickel, germanium, magnesium, and the like can be used as the insulator 712, the insulator 713, the insulator 716, the insulator 722, the insulator 725, the insulator 728, the insulator 741, the insulator 748, the insulator 750, the insulator 751, or the insulator 757.

In particular, aluminum oxide has a high barrier property, so that even a thin aluminum oxide film having a thickness of greater than or equal to 0.5 nm and less than or equal to 3.0 nm can inhibit diffusion of hydrogen and nitrogen. Although hafnium oxide has lower barrier property than aluminum oxide, hafnium oxide having a large thickness can have a high barrier property. Therefore, the amount of added hydrogen and nitrogen can be adjusted appropriately by adjusting the thickness of hafnium oxide.

For example, the insulator 722, the insulator 725, and the insulator 741 functioning as part of the gate insulator are preferably insulators including an excess oxygen region. When silicon oxide or silicon oxynitride including an excess oxygen region is in contact with a region of a metal oxide where a channel is formed, oxygen vacancies contained in the region of the metal oxide where a channel is formed may be compensated.

For example, silicon oxide or silicon oxynitride, which is thermally stable, is preferably used for the insulator 722, the insulator 725, and the insulator 741.

Furthermore, in the insulator 722, the insulator 725, and the insulator 741, an oxide of one or more kinds of aluminum, hafnium, and gallium may be stacked in addition to the above-described insulator. In particular, it is preferable to use aluminum oxide, hafnium oxide, an oxide containing aluminum and hafnium (hafnium aluminate), or the like as an insulator containing an oxide of one or both of aluminum and hafnium. When the gate insulator has a stacked-layer structure of a thermally stable film and a film with a high dielectric constant, the equivalent oxide thickness (EOT) of the gate insulator can be reduced while the physical thickness of the gate insulator is kept.

With the above stacked-layer structure, on-state current can be increased without reduction in the influence of the electric field applied from the gate electrode. Since the distance between the gate electrode and the channel formation region is kept by the physical thickness of the gate insulator, leakage current between the gate electrode and the channel formation region can be inhibited.

<<Conductor>>

For the conductors, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

Furthermore, a stack including a plurality of conductive layers formed with the above materials may be used. For example, a stacked-layer structure combining a material containing the above metal element and a conductive material containing oxygen may be employed. Furthermore, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

Note that when an oxide is used in the channel formation region of the transistor, a stacked-layer structure combining a material containing any of the above-described metal elements and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where a channel is formed. Furthermore, a conductive material containing the above metal element and nitrogen may be used. For example, a conductive material containing nitrogen, such as titanium nitride or tantalum nitride, may be used. Furthermore, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where a channel is formed can be trapped in some cases. Alternatively, hydrogen entering from an external insulator or the like can be trapped in some cases.

For the conductor 714, the conductor 718, the conductor 719, the conductor 721, the conductor 724, the conductor 726, the conductor 734, the conductor 752, the conductor 753, the conductor 754, the conductor 755, the conductor 756, the conductor 758, the conductor 759, the conductor 761, the conductor 762, the conductor 763, the conductor 764, the conductor 765, or the conductor 766, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

Note that different conductive materials are preferably used for the conductor 714, the conductor 718, the conductor 719, the conductor 721, and the conductor 726, and the conductor 724. By using a conductive material different from those for the conductor 714, the conductor 718, the conductor 719, the conductor 721, and the conductor 726 for the conductor 724, the etching rate can be changed between the conductive materials, so that the position of the side surface of the conductor 724 can be different from the positions of the side surfaces of the conductor 714, the conductor 718, the conductor 719, the conductor 721, the conductor 726.

<<Metal Oxide>>

As the oxide 743 and the oxide 730, a metal oxide functioning as an oxide semiconductor (hereinafter also referred to as an oxide semiconductor) is preferably used. A metal oxide that can be used as the oxide 743 and the oxide 730 of one embodiment of the present invention will be described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Other elements that can be used as the element M include boron, titanium, iron, nickel, germanium, zirconium, molybdenum, lanthanum, cerium, neodymium, hafnium, tantalum, tungsten, and magnesium. Note that a plurality of the above-described elements may be combined as the element M.

Note that in this specification and the like, a metal oxide containing nitrogen is also referred to as a metal oxide in some cases. Alternatively, a metal oxide containing nitrogen may be referred to as a metal oxynitride.

[Composition of Metal Oxide]

The composition of a CAC (Cloud-Aligned Composite)-OS that can be used for a transistor disclosed in one embodiment of the present invention will be described below.

Note that in this specification and the like, CAAC (c-axis aligned crystal) and CAC (Cloud-Aligned Composite) are sometimes stated. Note that CAAC refers to an example of a crystal structure, and CAC refers to an example of a function or a material composition.

A CAC-OS or a CAC-metal oxide has a conducting function in a part of the material and an insulating function in another part of the material, and has a function of a semiconductor as the whole material. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. Moreover, the conductive regions are sometimes observed to be coupled in a cloud-like manner with their boundaries blurred.

Furthermore, in the CAC-OS or the CAC-metal oxide, the conductive regions and the insulating regions each having a size greater than or equal to 0.5 nm and less than or equal to 10 nm, preferably greater than or equal to 0.5 nm and less than or equal to 3 nm are dispersed in the material in some cases.

The CAC-OS or the CAC-metal oxide is composed of components having different band gaps. For example, the CAC-OS or the CAC-metal oxide is composed of a component having a wide gap due to the insulating region and a component having a narrow gap due to the conductive region. In the case of the structure, when carriers flow, the carriers mainly flow in the component having a narrow gap. Moreover, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, high on-state current and high field-effect mobility.

In other words, the CAC-OS or the CAC-metal oxide can also be referred to as a matrix composite or a metal matrix composite.

[Structure of Metal Oxide]

Oxide semiconductors (metal oxides) are classified into a single-crystal oxide semiconductor and a non-single-crystal oxide semiconductor. Examples of the non-single-crystal oxide semiconductors include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and the crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a grain boundary is inhibited due to the distortion of lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium of the In layer is replaced with the element M, the layer can also be referred to as an (In,M) layer.

The CAAC-OS is a metal oxide with high crystallinity. On the other hand, a clear crystal grain boundary is difficult to observe in the CAAC-OS; thus, a reduction in electron mobility due to the crystal grain boundary is less likely to occur. Furthermore, entry of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

The a-like OS is a metal oxide having a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor (a metal oxide) has various structures with different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

[Transistor Including Metal Oxide]

Next, the case where the above metal oxide is used in a channel formation region of a transistor will be described.

Note that when the above metal oxide is used in a channel formation region of a transistor, the transistor having high field-effect mobility can be achieved. In addition, the transistor having high reliability can be achieved.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

Moreover, a highly purified intrinsic or substantially highly purified intrinsic metal oxide film has a low density of defect states and accordingly may have a low density of trap states.

Charges trapped by the trap states in the metal oxide take a long time to be released and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the concentration of impurities in the metal oxide. In addition, in order to reduce the concentration of impurities in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide will be described.

When silicon or carbon that is a Group 14 element is contained in the metal oxide, defect states are formed in the metal oxide. Thus, the concentration of silicon or carbon in the metal oxide and the concentration of silicon or carbon in the vicinity of an interface with the metal oxide (the concentration measured by secondary ion mass spectrometry (SIMS) is set to lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated, in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1\times10^{18}$ atoms/cm$^3$, preferably lower than or equal to $2\times10^{16}$ atoms/cm$^3$.

Furthermore, when containing nitrogen, the metal oxide easily becomes n-type by generation of electrons serving as carriers and an increase in carrier density. As a result, a transistor using a metal oxide containing nitrogen for its channel formation region is likely to have normally-on characteristics. Thus, nitrogen in the channel formation region of the metal oxide is preferably reduced as much as possible; for example, the nitrogen concentration in the metal oxide is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$ in SIMS.

Furthermore, hydrogen contained in a metal oxide reacts with oxygen bonded to a metal atom to be water, and thus forms an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using the metal oxide that contains hydrogen for its channel formation region is likely to have normally-on characteristics. Accordingly, hydrogen in the metal oxide is preferably reduced as much as possible. Specifically, the hydrogen concentration of the metal oxide, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When a metal oxide in which impurities are sufficiently reduced is used in a channel formation region of a transistor, stable electrical characteristics can be given.

<Manufacturing Method of Memory Cell Array>

Next, a method for manufacturing the above semiconductor device is described with reference to FIG. 8 to FIG. 29. FIG. 8 to FIG. 29 are diagrams illustrating manufacturing process of the memory cell 700 which is part of the memory cell array 790 of the semiconductor device.

Note that the description in <Constituent material of semiconductor device> can be referred to for insulating materials and conductive materials that are used below.

In each of the drawings, (A) is a top view of the memory cell array 790. Moreover, (B) of each drawing is a cross-sectional view of a portion indicated by the dashed-dotted lines A1-A2, A3-A4, and A5-A6 in (A) of each drawing. Furthermore, (C) of each drawing is a cross-sectional view of a portion indicated by the dashed-dotted line A7-A8 in (A) of each drawing. Note that in the following description, rectangular coordinates using an x-axis, a y-axis, and a z-axis are set as illustrated in the drawings for the sake of convenience. Here, the x-axis and the y-axis are parallel to the top surface of a base provided with the memory cell array 790 and the z-axis is perpendicular to the top surface of the base.

First, a substrate (not illustrated) is prepared, and the insulator 712 is formed over the substrate. The insulator 712 can be formed by a sputtering method, a chemical vapor deposition (CVD) method, a molecular beam epitaxy (MBE) method, a pulsed laser deposition (PLD) method, an atomic layer deposition (ALD) method, or the like.

Note that CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By a plasma CVD method, a high-quality film can be formed at a relatively low temperature. Furthermore, a thermal CVD method does not use plasma and thus is a deposition method that enables less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method is also a deposition method that can enables less plasma damage to an object. Thus, a film with few defects can be obtained. Note that a precursor used in an ALD method sometimes contains impurities such as carbon. Thus, a film provided by an ALD method contains impurities such as carbon in a larger amount than a film provided by another deposition method, in some cases. Note that impurities can be quantified by X-ray photoelectron spectroscopy (XPS).

Unlike a deposition method in which particles ejected from a target or the like are deposited, in a CVD method and an ALD method, a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation is unnecessary because time taken for transfer and pressure adjustment is omitted. Thus, semiconductor devices can be manufactured with improved productivity in some cases.

Next, the insulator 713 is formed over the insulator 712. The insulator 713 can be formed by a sputtering method, a CVD method, an MBE method, a PLD method, an ALD method, or the like.

Then, opening portions reaching the insulator 712 are formed in the insulator 713. Examples of the opening portions include grooves and slits. Regions where the opening portions are formed may be referred to as opening portions. The opening portions can be formed by a wet etching method; however, a dry etching method is preferably used for microfabrication. As the insulator 712, it is preferable to select an insulator that functions as an etching stopper film used in forming the opening portion by etching the insulator 713. For example, in the case where a silicon oxide film is used as the insulator 713 in which the opening portion is to be formed, it is preferable to use, as the insulator 712, a silicon nitride film, an aluminum oxide film, or a hafnium oxide film as an insulating film functioning as an etching stopper film.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power is applied to one of the parallel plate type electrodes. Alternatively, a structure may employed different high-frequency powers are applied to one of the parallel plate type electrodes. Alternatively, a structure may be employed in which high-frequency powers with the same frequency are applied to the parallel plate type electrodes. Alternatively, a structure may be employed in which high-frequency powers with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

After the formation of the opening portion, a conductive film to be the conductor 714 is deposited. For example, tantalum nitride, tungsten nitride, or titanium nitride can be used for the conductive film. Alternatively, a layered film formed using the conductor and tantalum, tungsten, titanium, molybdenum, aluminum, copper, or a molybdenum-tungsten alloy can be used. The use of a low-resistant conductive material such as copper is particularly preferable. The conductive film to be the conductor 714 can be formed by a sputtering method, a CVD method, an MBE method, a PLD method, an ALD method, or the like.

Next, CMP (chemical mechanical polishing) treatment is performed to remove part of the conductive film to be the conductor 714, so that the insulator 713 is exposed. As a result, the conductive film to be the conductor 714 remains only in the opening portion. In this way, the conductor 714 with a flat top surface can be formed (see FIG. 8). Note that the insulator 713 is partly removed by the CMP treatment in some cases.

Figure 8A:
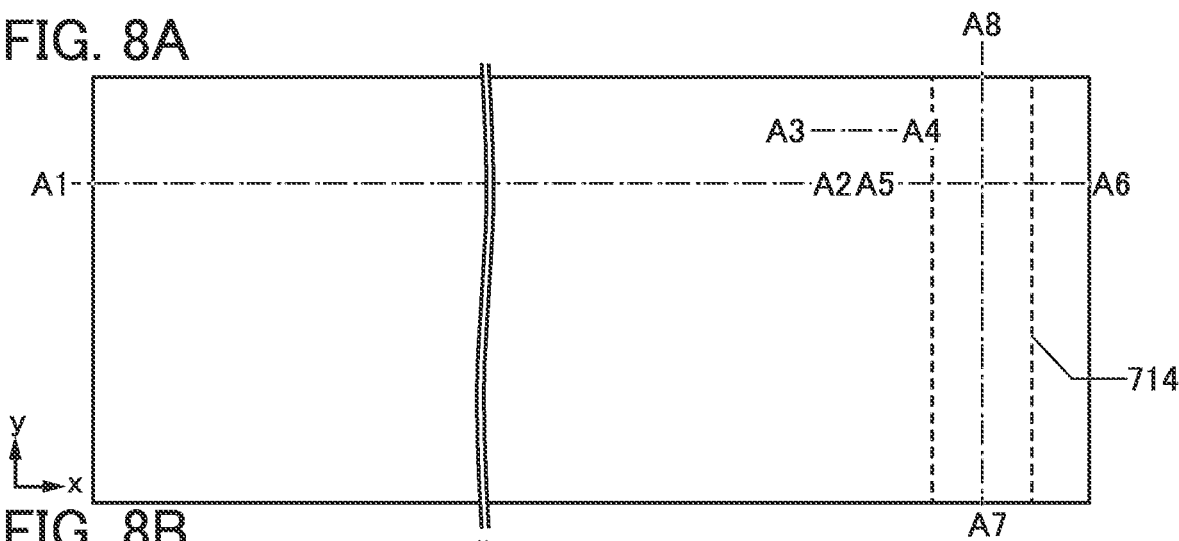
FIGS. 8A-8C A plan view and cross-sectional views illustrating a method for manufacturing a semiconductor device of one embodiment of the present invention.
Figure 8B:
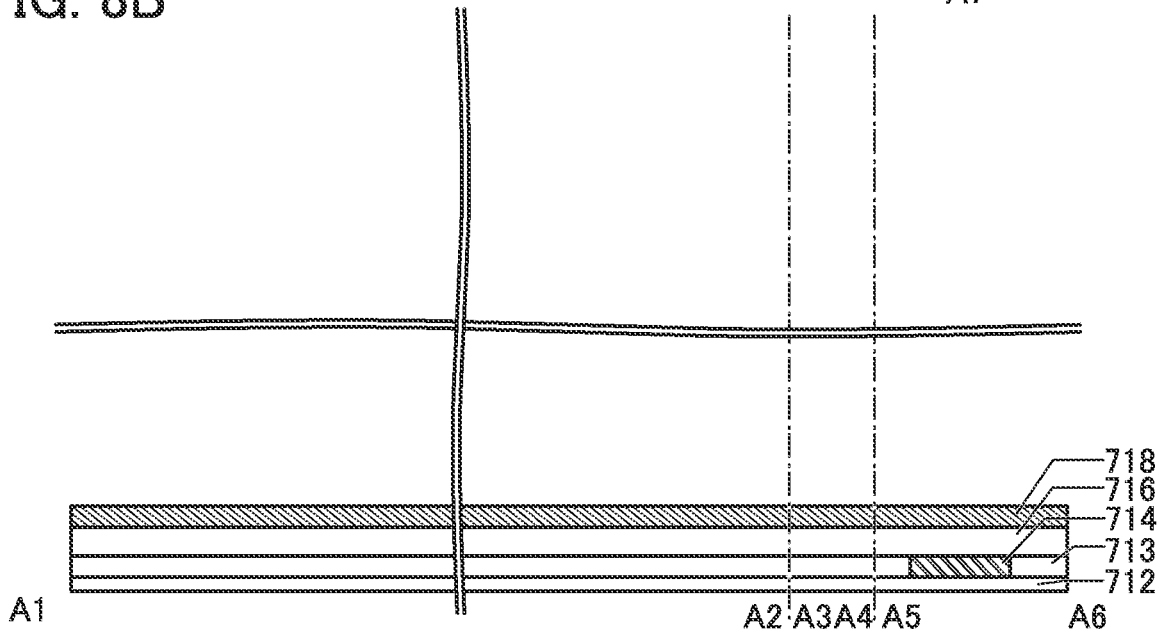
Figure 8C:
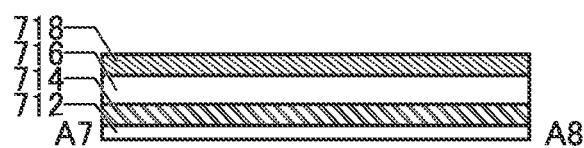

Next, an insulating film 713A and a conductive film 718A are formed to be stacked in this order (see FIG. 8). The insulating film and the conductive film can be formed by a sputtering method, a CVD method, an MBE method, a PLD method, an ALD method, or the like.

Figure 9A:
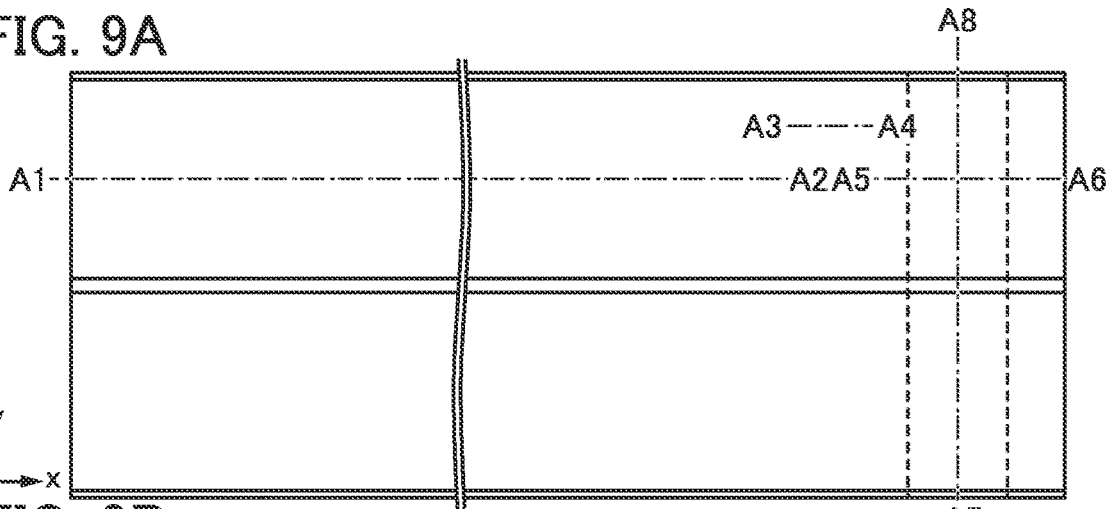
FIGS. 9A-9C A plan view and cross-sectional views illustrating a method for manufacturing a semiconductor device of one embodiment of the present invention.
Figure 9B:
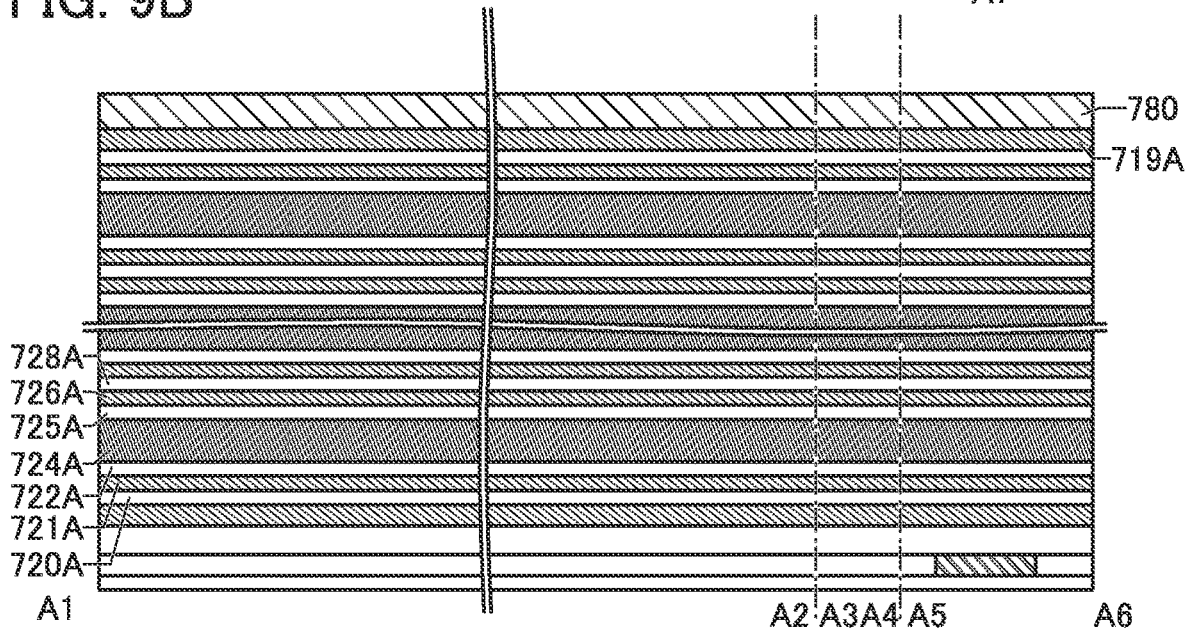
Figure 9C:
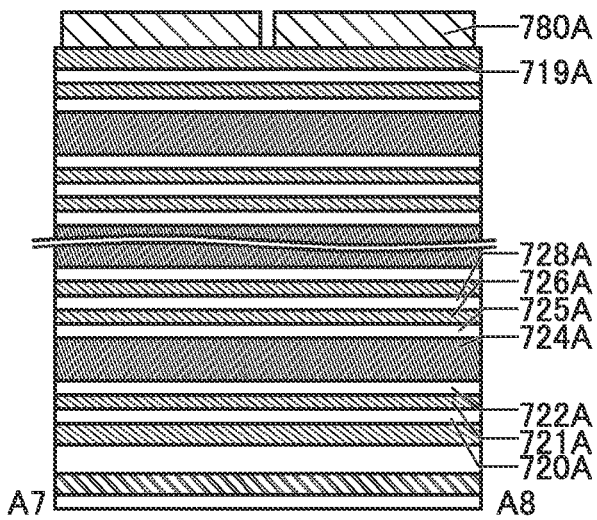

Next, over the conductive film 718A, an insulating film 720A, a conductive film 721A, an insulating film 722A, a conductive film 724A, an insulating film 725A, a conductive film 726A, and the insulator 728A are formed to be stacked in this order (see FIG. 9). Furthermore, the stack is repeatedly formed in accordance with the number of memory cells 700 ($m_3$) of the string 792. The insulating film and the conductive film can be formed by a sputtering method, a CVD method, an MBE method, a PLD method, an ALD method, or the like.

Next, a conductive film 719A is formed over the insulator 728A, which is to be the uppermost layer of the stack. The conductive film 719A can be formed by a sputtering method, a CVD method, an MBE method, a PLD method, an ALD method, or the like. Note that an insulating film, a conductive film, a semiconductor film, or the like may be provided over the conductive film 719A as appropriate in accordance with the circuit configuration or the like.

In a step described later, the conductive film 724A, the conductive film 721A, the conductive film 726A, the conductive film 718A, and the conductive film 719A are selectively etched. In the etching treatment, the etching rate of a conductive film 734A is preferably remarkably higher than the etching rate of the conductive film 721A, the conductive film 726A, the conductive film 718A, and the conductive film 719A. When the etching rate of the conductive film 721A, the conductive film 726A, the conductive film 718A, and the conductive film 719A is 1, the etching rate of the conductive film 724A is preferably 5 or more, further preferably 10 or more. Therefore, conductive materials used for the conductive film 721A, the conductive film 726A, the conductive film 718A, the conductive film 719A, and the conductive film 724A are preferably selected as appropriate in accordance with the etching conditions or the like so that the above-described etching rates are satisfied.

Figure 10A:
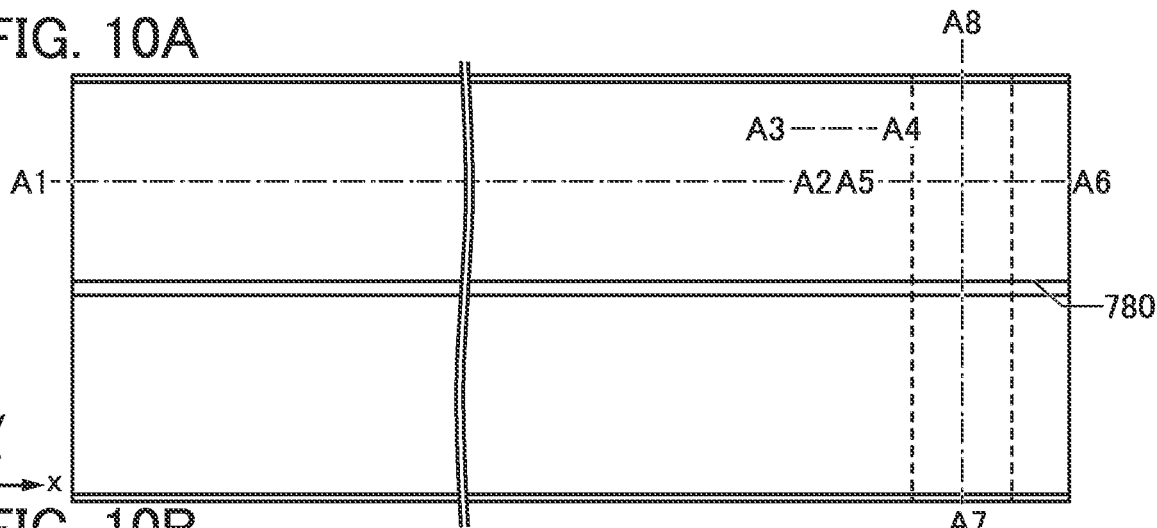
FIGS. 10A-10C A plan view and cross-sectional views illustrating a method for manufacturing a semiconductor device of one embodiment of the present invention.
Figure 10B:
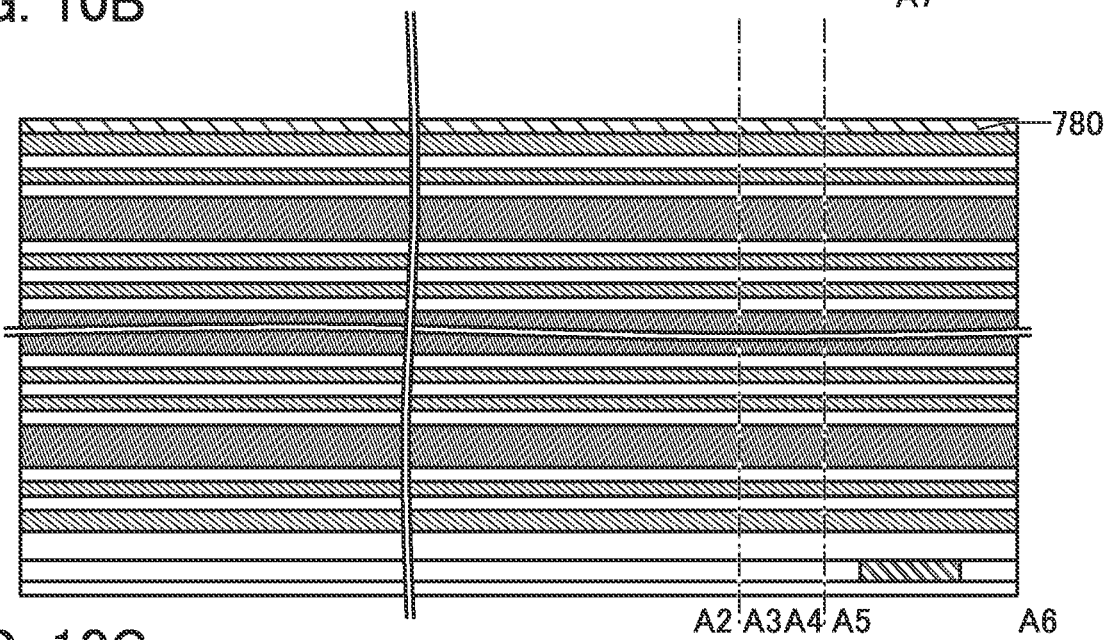
Figure 10C:
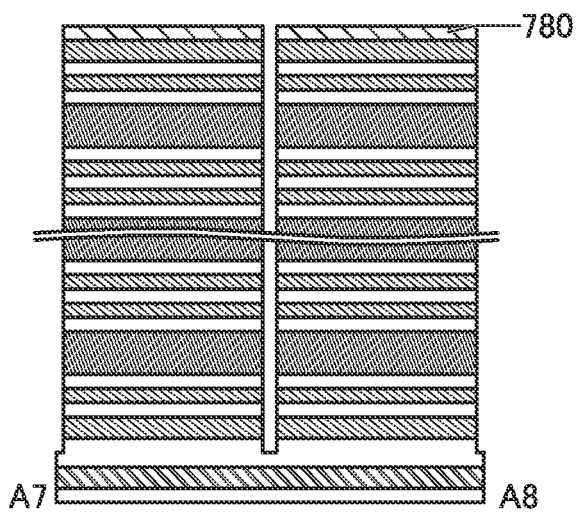

Then, with use of a mask 780, the stack including the insulator 716, the conductor 718, the conductor 719, the insulating film 720A, the conductive film 721A, the insulating film 722A, the conductive film 724A, the insulating film 725A, the conductive film 726A, and the insulator 728A is processed to be divided (see FIG. 10). The stack including the insulator 716, the conductor 718, the conductor 719, the insulating film 720A, the conductive film 721A, the insulating film 722A, the conductive film 724A, the insulating film 725A, the conductive film 726A, and the insulator 728A is divided by an opening portion in which the insulator 750 is embedded in a later step. The opening portion is a groove-like opening portion extending in the x-axis direction. Accordingly, the insulator 716, the conductor 718, the conductor 719, the insulating film 720A, the conductive film 721A, the insulating film 722A, the conductive film 724A, the insulating film 725A, the conductive film 726A, and the insulator 728A have a plate-like shape extending in the x-axis direction. For forming the opening portion, for example, highly anisotropic etching treatment such as dry etching treatment is performed.

The processing may be performed by a lithography method. In the lithography method, first, a resist is exposed to light through a mask. Next, a region exposed to light is removed or left using a developing solution, so that a resist mask is formed. Then, etching through the resist mask is conducted. The resist mask is formed by, for example, exposure of the resist to light using KrF excimer laser light, ArF excimer laser light, EUV (Extreme Ultraviolet) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that the above mask for the exposure of the resist to light is unnecessary in the case of using an electron beam or an ion beam because direct writing is performed on the resist. Note that for removal of the resist mask, dry etching treatment such as ashing can be performed, wet etching treatment can be performed, wet etching treatment can be performed after dry etching treatment, or dry etching treatment can be performed after wet etching treatment, for example.

A hard mask formed of an insulator or a conductor may be used instead of the resist mask. In the case where a hard mask is used, a hard mask with a desired shape can be formed by forming an insulating film or a conductive film to be the hard mask material over the component, forming a resist mask thereover, and then etching the hard mask material. The etching of the component may be performed after removal of the resist mask or while the resist mask remains. In the latter case, the resist mask may be removed during the etching. The hard mask may be removed by etching after the etching of the component. The hard mask does not need to be removed in the case where the material of the hard mask does not affect the following process or can be utilized in the following process.

Figure 11A:
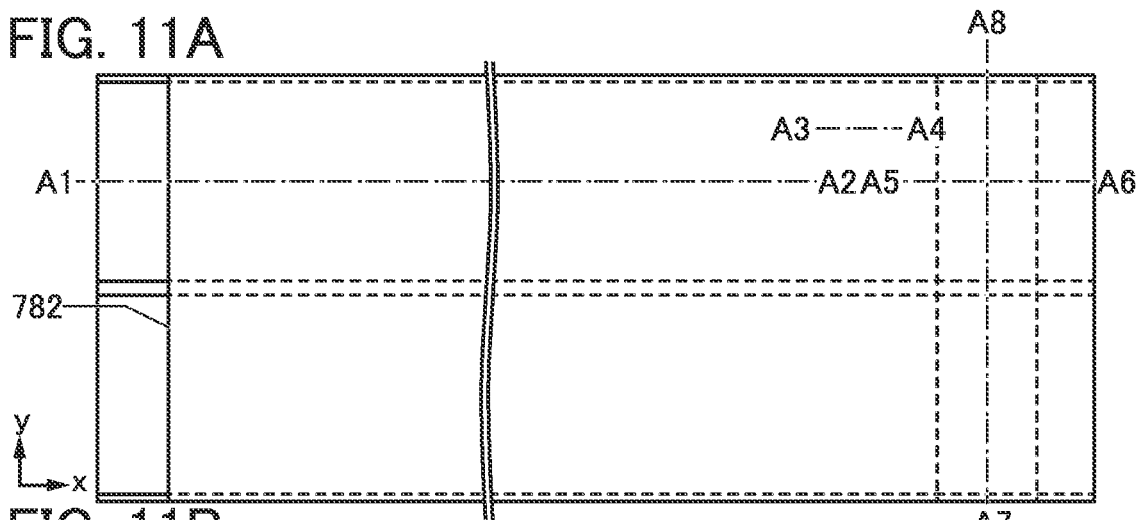
FIGS. 11A-11C A plan view and cross-sectional views illustrating a method for manufacturing a semiconductor device of one embodiment of the present invention.
Figure 11B:
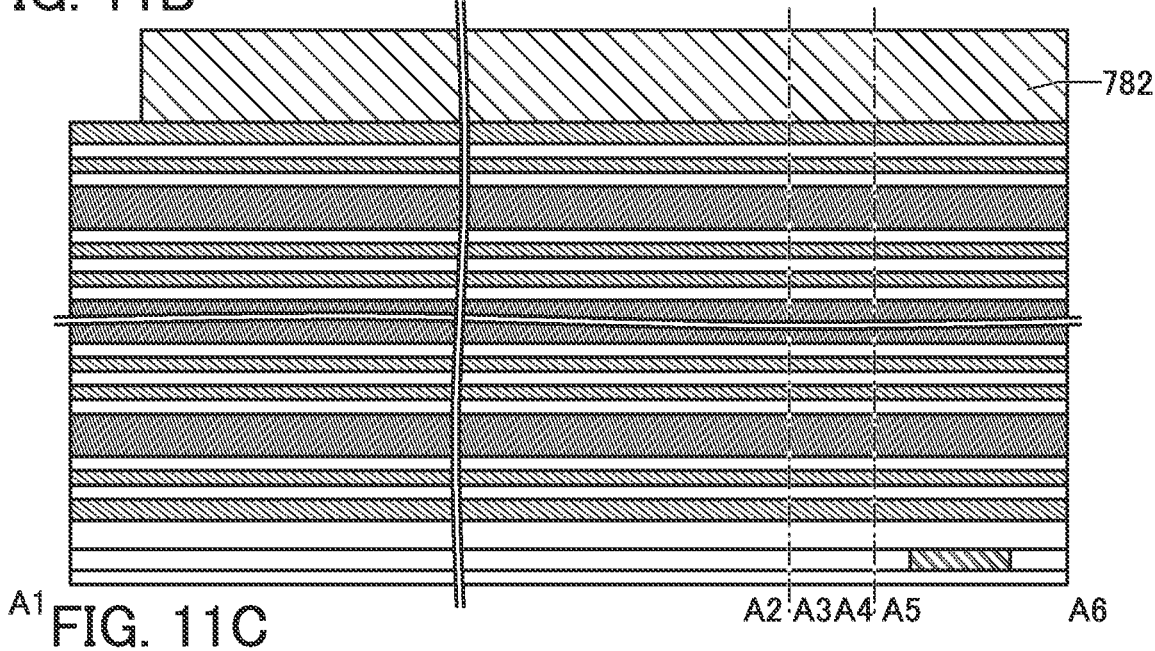
Figure 11C:
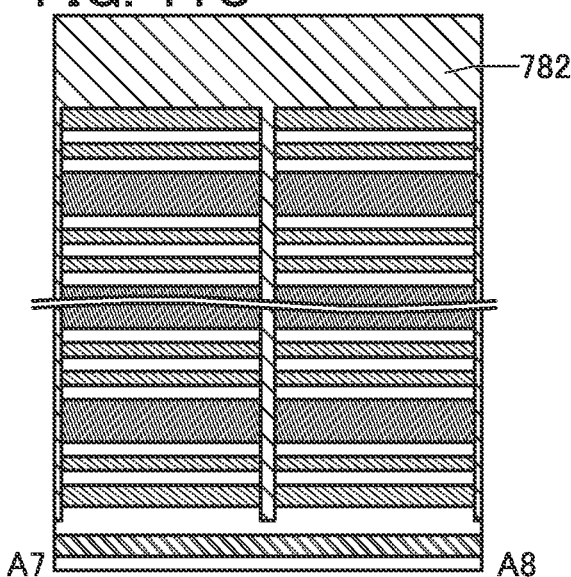
Figure 12A:
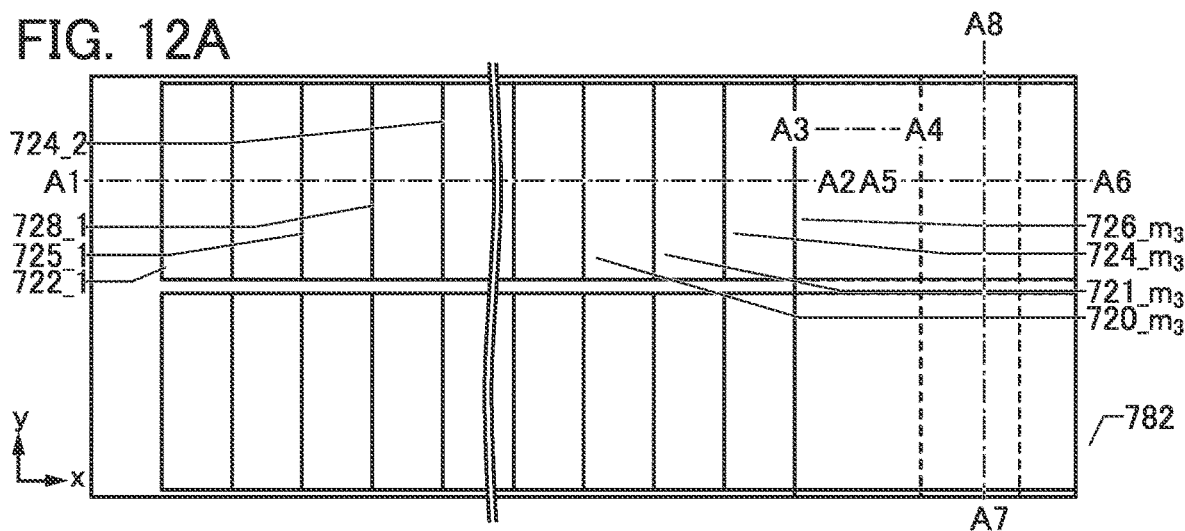
FIGS. 12A-12C A plan view and cross-sectional views illustrating a method for manufacturing a semiconductor device of one embodiment of the present invention.
Figure 12B:
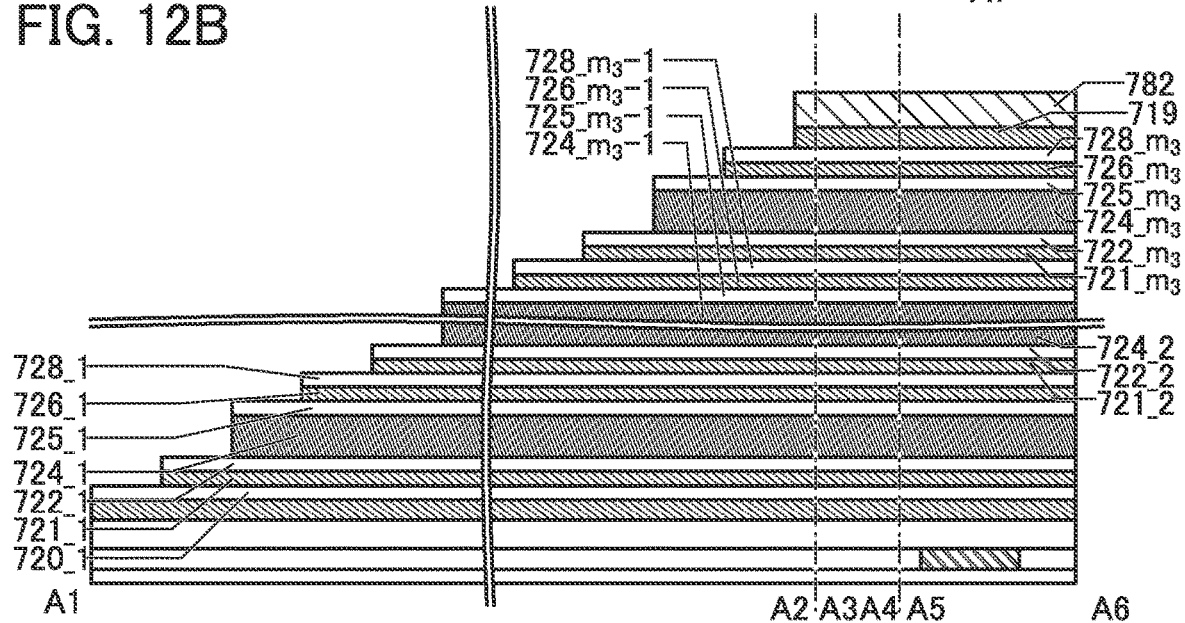
Figure 12C:
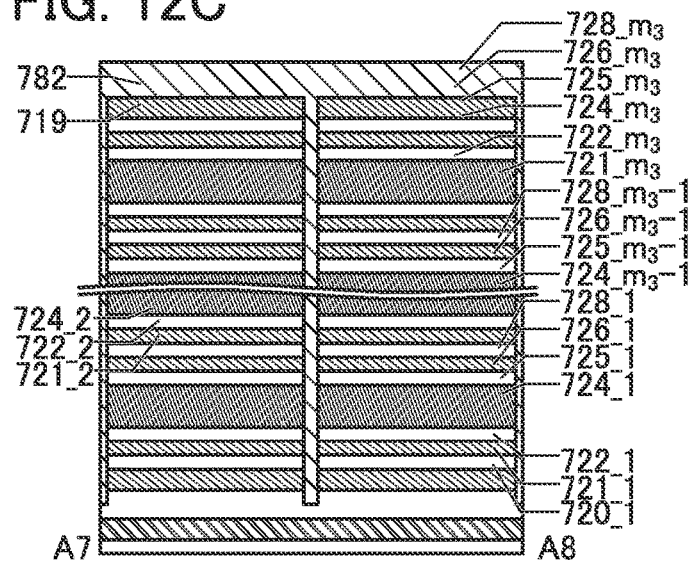

Next, the mask 780 is removed and a mask 782 is formed (see FIG. 11). Next, end portions extending in the x-axis direction of the conductor 718, the conductive film 721A, the conductive film 724A, the conductive film 726A, and the conductor 719 are processed into a step-like shape, whereby the conductor 718, the conductor 721, the conductor 724, the conductor 726, and the conductor 719 are formed (see FIG. 12).

In processing of the conductor 718, the conductor 721, the conductor 724, the conductor 726, and the conductor 719 into a step-like shape, etching of the conductor 718, the conductive film 721A, the conductive film 724A, the conductive film 726A, and the conductor 719 and slimming of the mask 782 are performed alternately; thus, the conductor 718, the conductor 721, the conductor 724, the conductor 726, and the conductor 719 having a step-like shape can be formed. The width and thickness of the mask 782 are reduced in some cases by processing the conductor 718, the insulator 720, the conductor 721, the insulator 722, the conductor 724, the insulator 725, the conductor 726, the insulator 728, and the conductor 719 (see FIG. 12).

In the above structure, the step-like portions of the conductor 718, the conductor 721, the conductor 724, the conductor 726, and the conductor 719 are portions in contact with a wiring connected to the driver circuit. Therefore, the conductor 718, the conductor 721, the conductor 724, the conductor 726, and the conductor 719 can be easily in contact with a plug connected to the wiring.

Figure 13A:
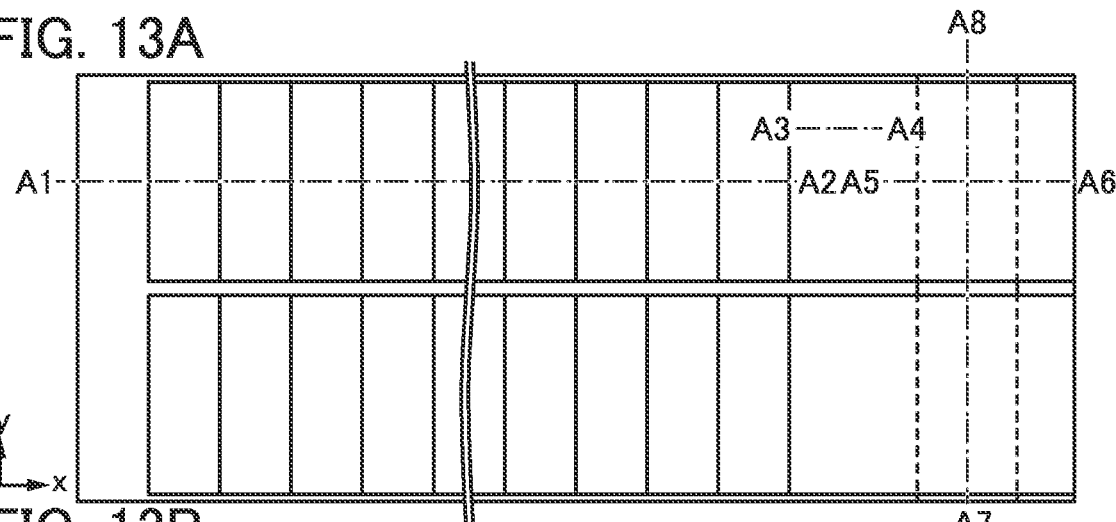
FIGS. 13A-13C A plan view and cross-sectional views illustrating a method for manufacturing a semiconductor device of one embodiment of the present invention.
Figure 13B:
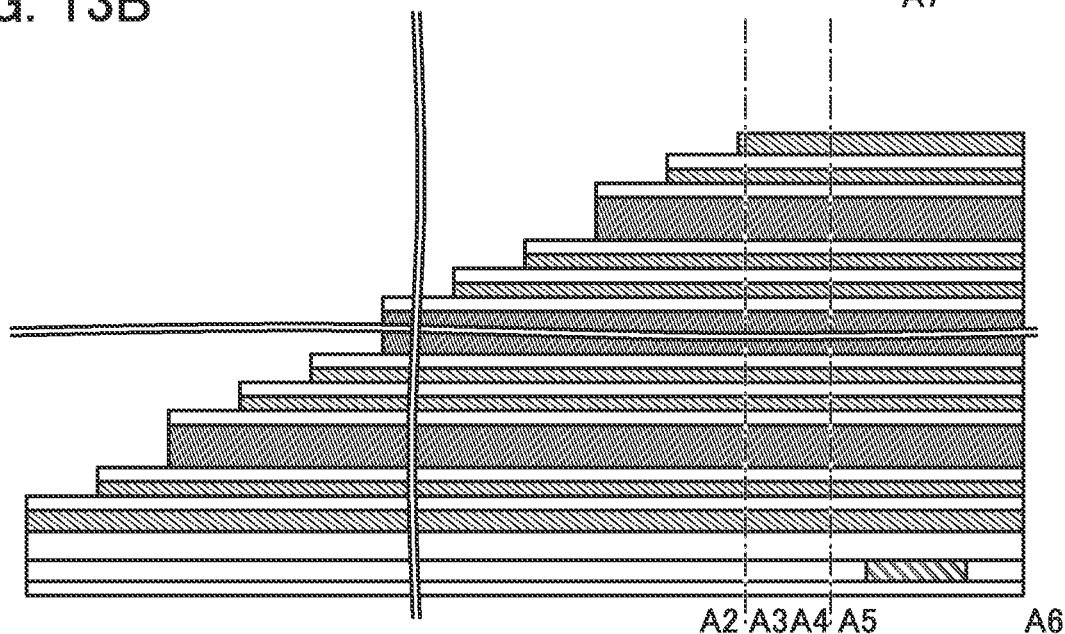
Figure 13C:
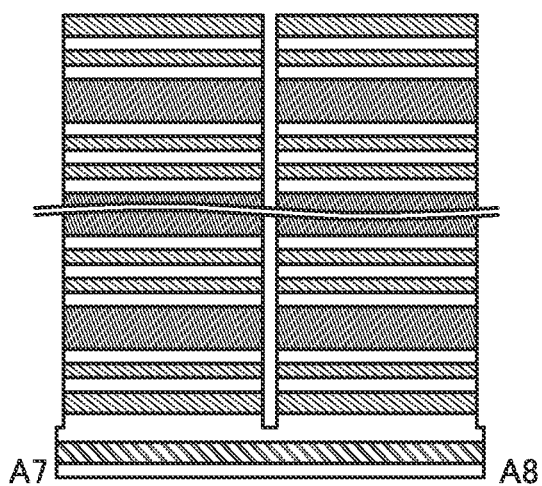
Figure 14A:
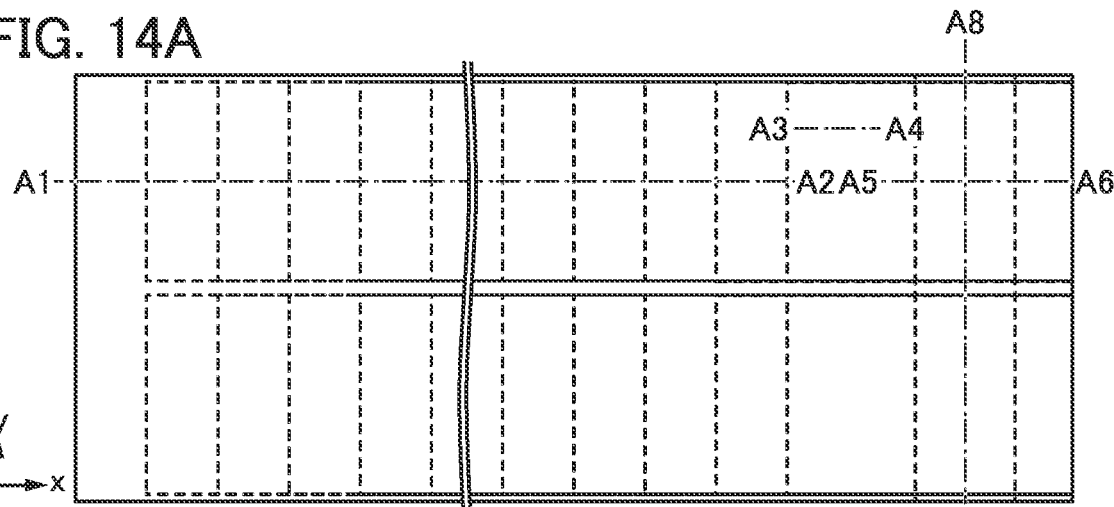
FIGS. 14A-14C A plan view and cross-sectional views illustrating a method for manufacturing a semiconductor device of one embodiment of the present invention.
Figure 14B:
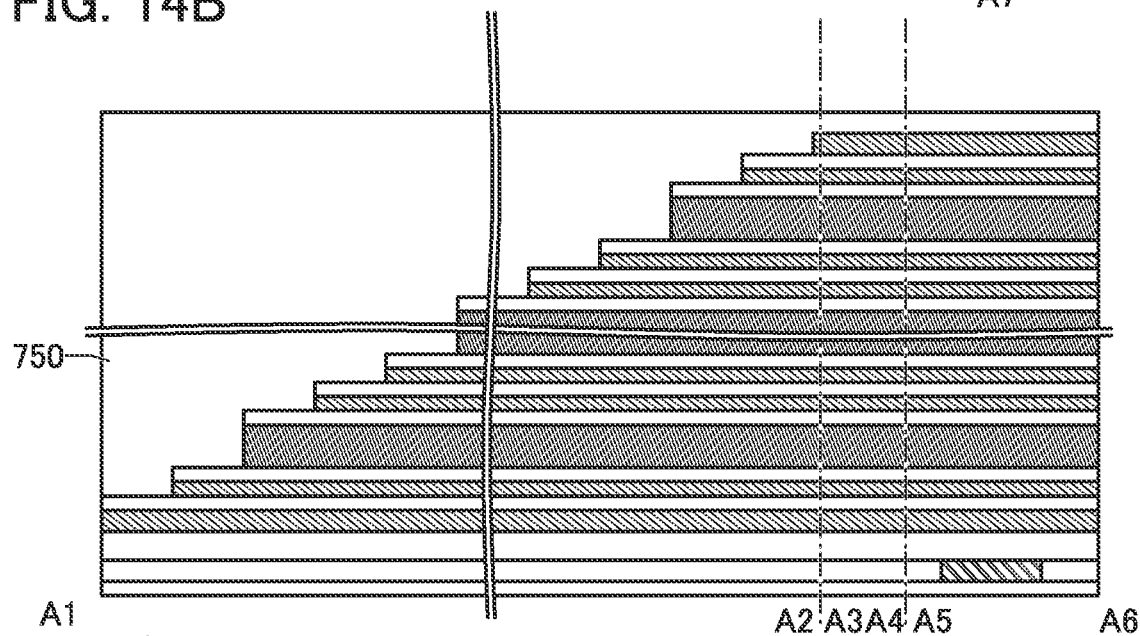
Figure 14C:
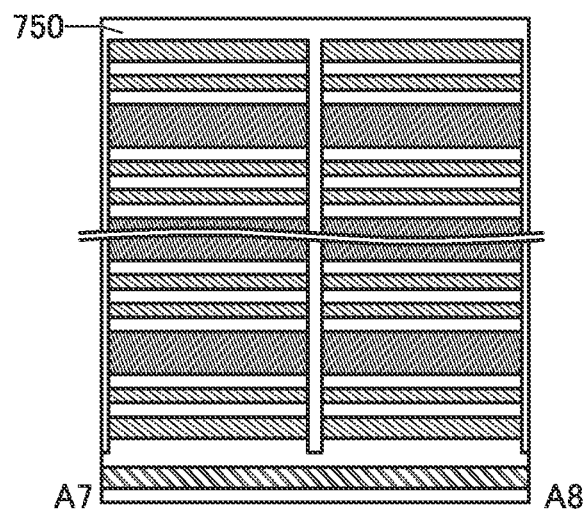

Then, the mask 782 is removed (see FIG. 13). After that, the insulator 750 is formed to fill the groove-like opening portion extending in the x-axis direction of the conductor 718, the insulator 720, the conductor 721, the insulator 722, the conductor 724, the insulator 725, the conductor 726, the insulator 728, and the conductor 719 (see FIG. 14). The insulator 750 can be formed by a sputtering method, a CVD method, an MBE method, a PLD method, an ALD method, or the like. It is particularly preferable to employ an ALD method, in which case a film with a uniform thickness can be formed even in a groove or an opening portion having a large aspect ratio. Alternatively, the insulator 750 may be formed by a combination of an ALD method and a CVD method. The insulator 750 is preferably subjected to planarization treatment by a CMP method or a reflow method.

Figure 15A:
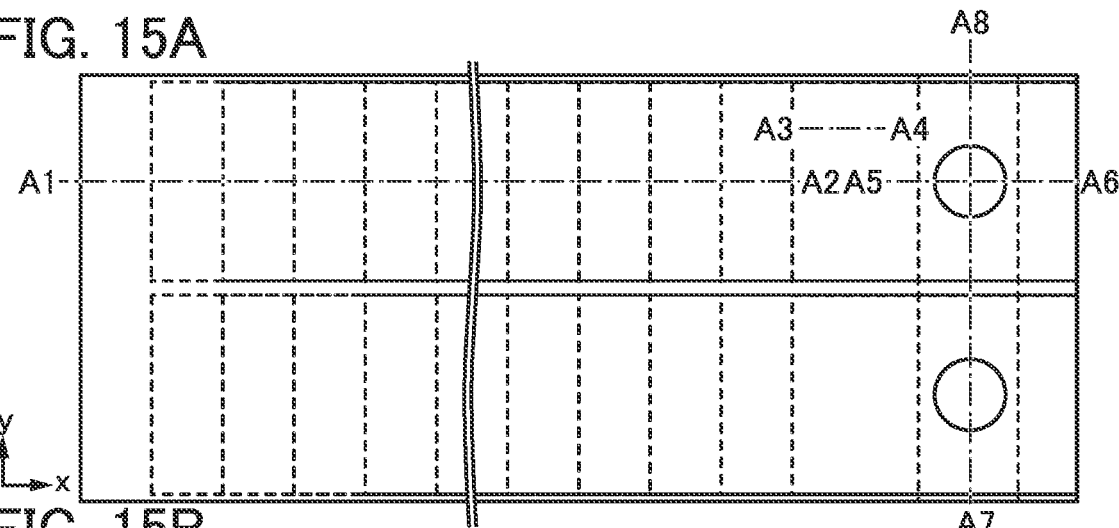
FIGS. 15A-15C A plan view and cross-sectional views illustrating a method for manufacturing a semiconductor device of one embodiment of the present invention.
Figure 15B:
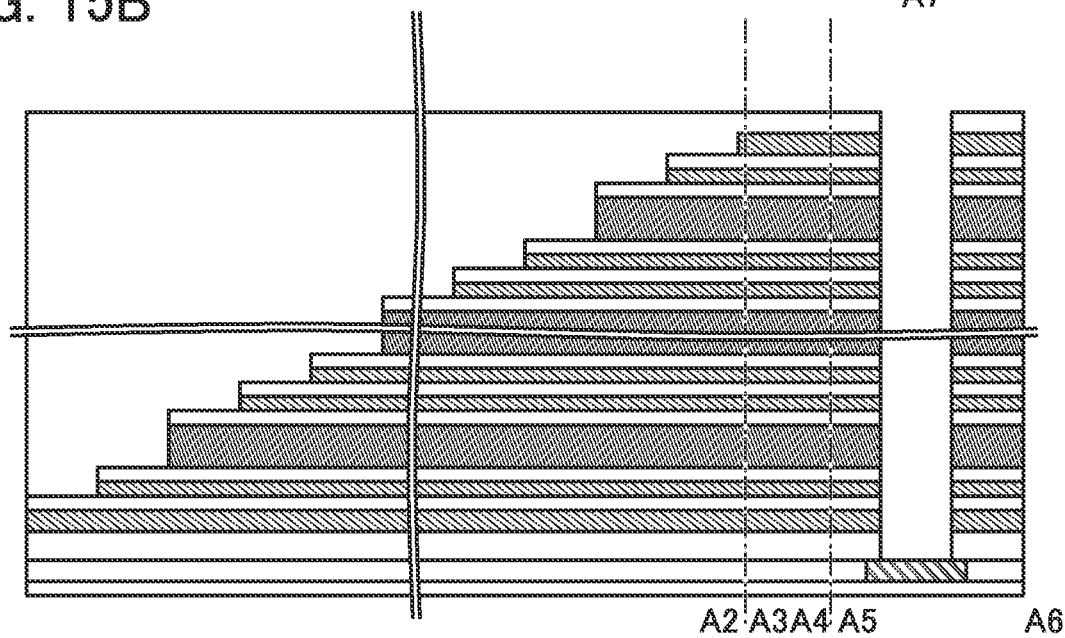
Figure 15C:
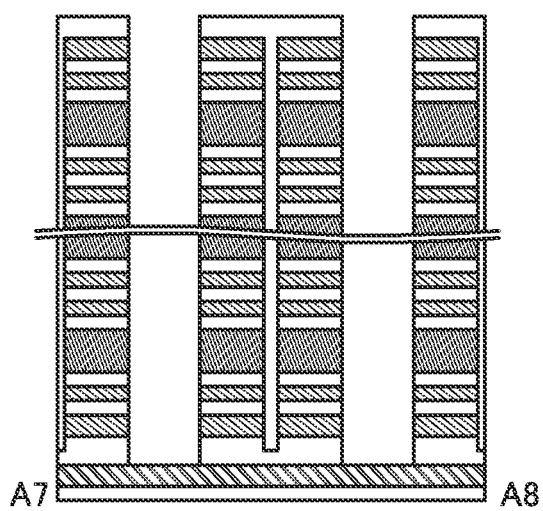

Next, opening portions reaching the conductor 714 are formed in the conductor 718, the insulator 720, the conductor 721, the insulator 722, the conductor 724, the insulator 725, the conductor 726, the insulator 728, and the conductor 719 (see FIG. 15). The opening portions may be formed by a wet etching method; however, a dry etching method is preferably used for microfabrication.

Then, side-etching treatment is performed on the conductor 724, whereby part of the conductor 724 is selectively removed. A conductive material different from that for the conductor 718, the conductor 719, the conductor 721, and the conductor 726 is used for the conductor 724, so that the side etching rate of the conductor 724 and the side etching rate of the conductor 718, the conductor 721, and the conductor 726 are made to be different; therefore, the opening portion formed in the conductor 724 is larger than the opening portion formed in the conductor 718, the conductor 721, and the conductor 726. Accordingly, in the penetrating opening portion, the side surface of the conductor 724 can be located outward from the side surfaces of the conductor 718, the conductor 721, and the conductor 726. For side etching of the conductor 724, a wet etching method or a highly isotropic dry etching method can be used.

Note that as highly isotropic dry etching, etching using reactive gas is used, for example. In etching using reactive gas, the isotropy of the etching is made high without intentionally applying a bias to a substrate or the like. In etching using reactive gas, the reactivity of etching gas may be improved by increasing the temperature of the reactive gas or making the reactive gas to be a plasma.

Figure 17A:
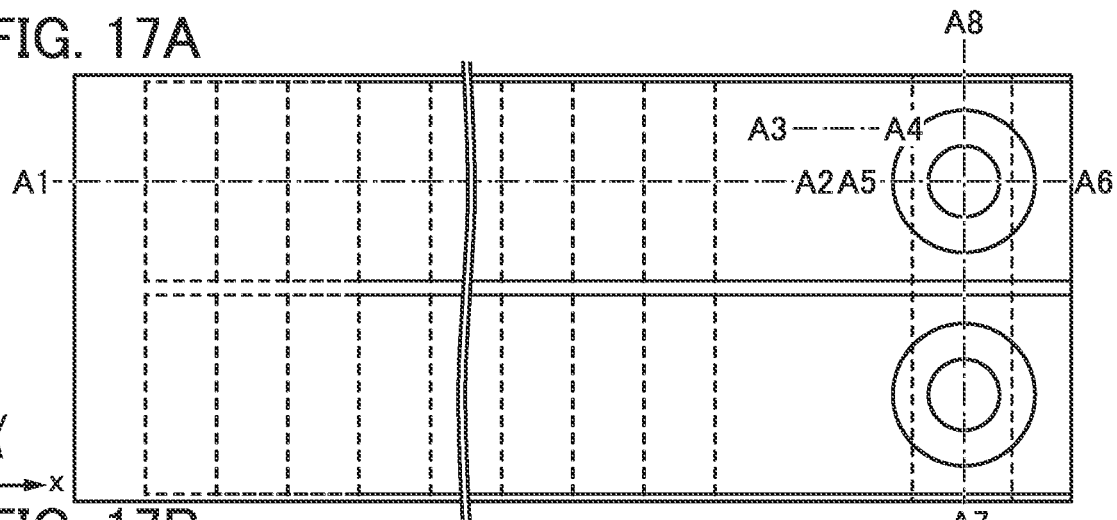
FIGS. 17A-17C A plan view and cross-sectional views illustrating a method for manufacturing a semiconductor device of one embodiment of the present invention.
Figure 17B:
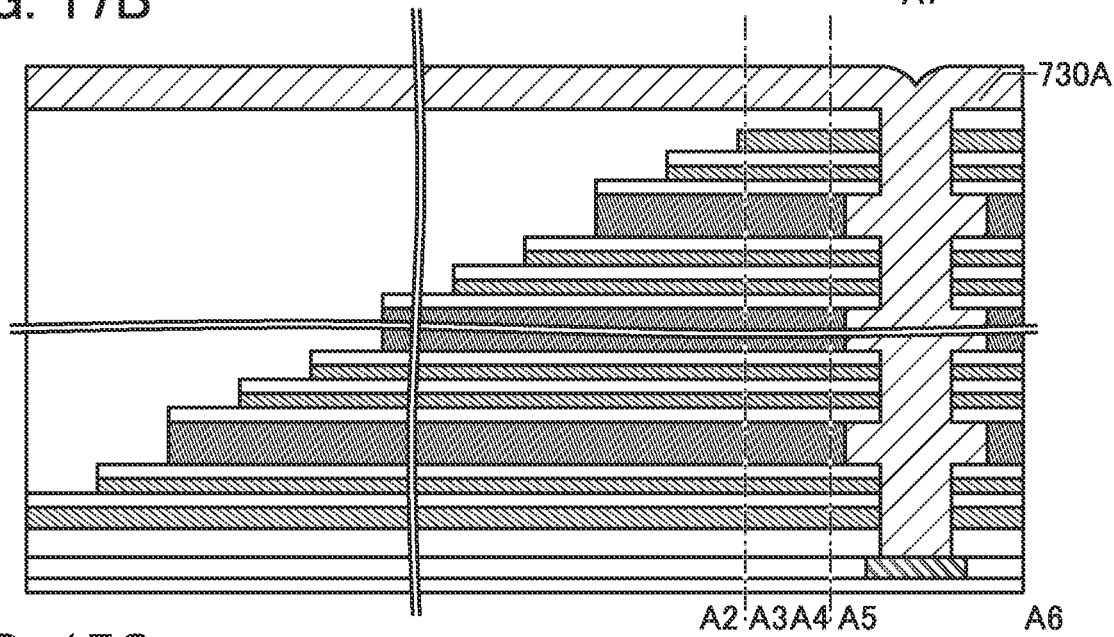
Figure 17C:
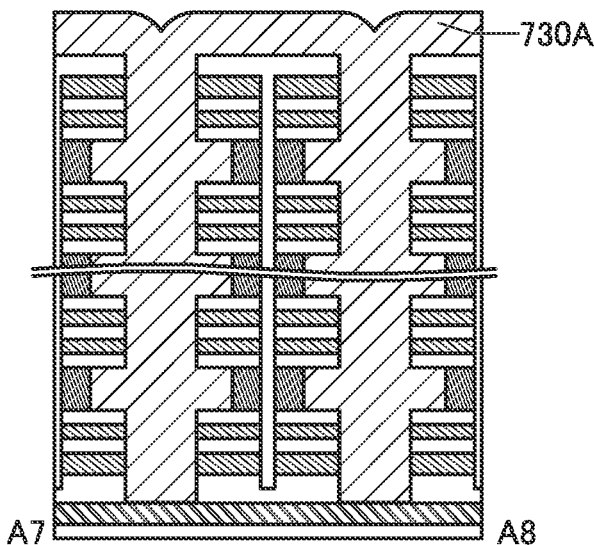

Next, the oxide 730A is formed in the opening portions formed in the stack including the conductor 718, the insulator 720, the conductor 721, the insulator 722, the conductor 724, the insulator 725, the conductor 726, the insulator 728, and the conductor 719 (see FIG. 17). The oxide 730A can be formed by a sputtering method, a CVD method, or an ALD method. It is particularly preferable to employ an ALD method, in which case a film with a uniform thickness can be formed even in a groove or an opening portion having a large aspect ratio. Alternatively, the oxide 730A may be formed by a combination of an ALD method and a CVD method. In the case where a CVD method is employed, an MOCVD method or an MCVD method may be employed. When the oxide 730A is a stacked film, films may be formed in the same deposition apparatus or different deposition apparatuses.

Figure 18A:
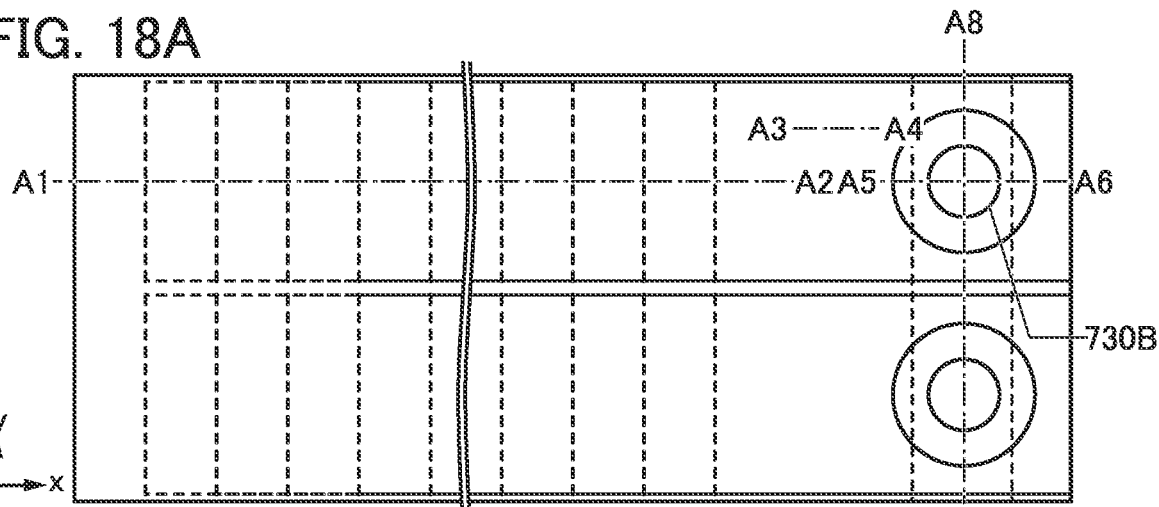
FIGS. 18A-18C A plan view and cross-sectional views illustrating a method for manufacturing a semiconductor device of one embodiment of the present invention.
Figure 18B:
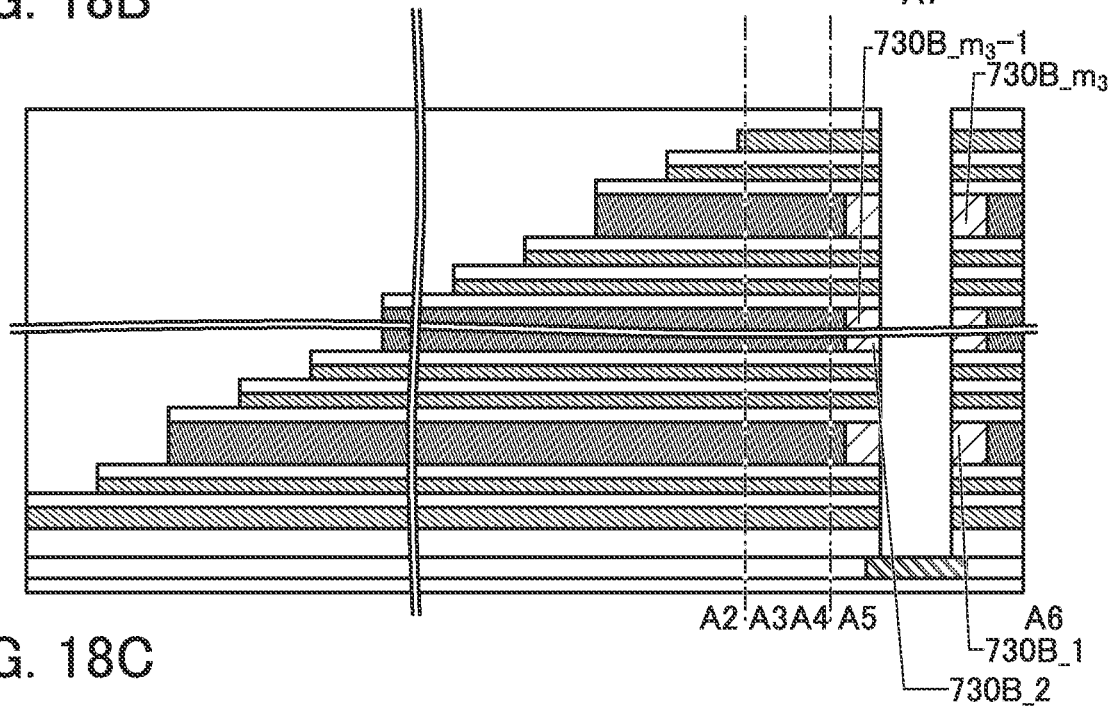
Figure 18C:
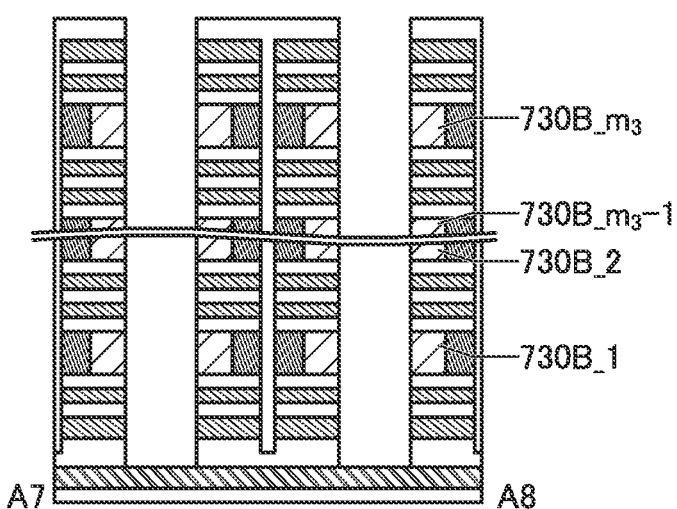
Figure 19A:
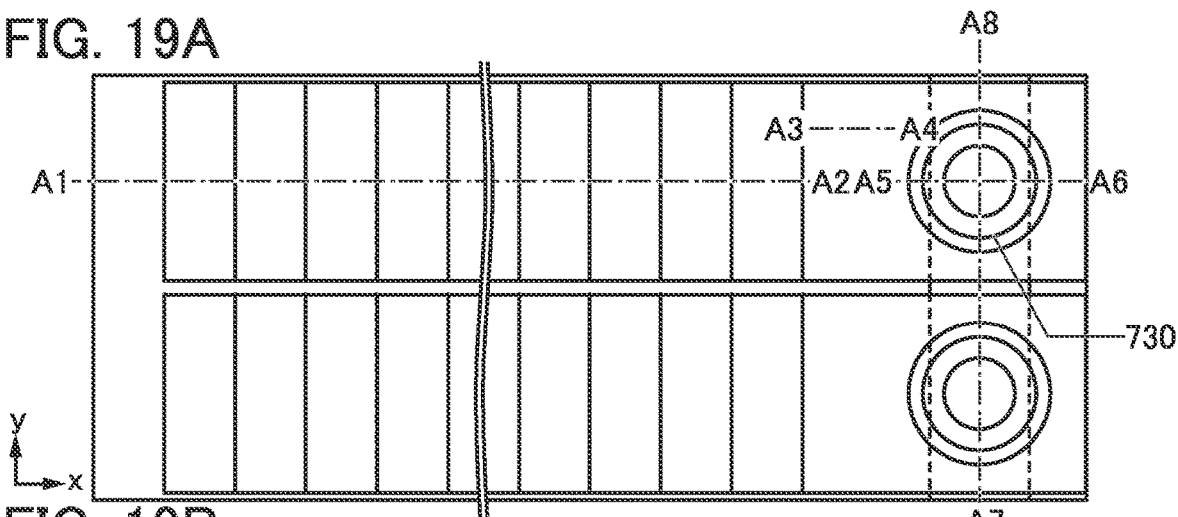
FIGS. 19A-19C A plan view and cross-sectional views illustrating a method for manufacturing a semiconductor device of one embodiment of the present invention.

Next, anisotropic etching is performed to selectively remove the oxide 730A, whereby the ring-like oxide 730B is formed (see FIG. 18). As illustrated in FIG. 18, the oxide 730B is formed on the side surface of the opening portion of the conductor 724, and the side surface of the opening portion of the conductor 718, the insulator 720, the conductor 721, the insulator 722, the insulator 725, the conductor 726, the insulator 728, and the conductor 719 is exposed. That is, the oxide 730A is divided into $m_3$ oxides to be an oxide 730B_1 to an oxide 730B_$m_3$. As illustrated in FIG. 19(A), the oxide 730B has a cylindrical shape including an opening portion concentric to the opening portion of the conductor 718, the insulator 720, the conductor 721, the insulator 722, the conductor 724, the insulator 725, the conductor 726, the insulator 728, and the conductor 719. Note that when the oxide 730A is selectively removed, part of the opening portion formed in the stack including the conductor 718, the insulator 720, the conductor 721, the insulator 722, the conductor 724, the insulator 725, the conductor 726, the insulator 728, and the conductor 719 may be etched to widen the diameter of the opening portion so that the side surfaces of the conductor 718, the insulator 720, the conductor 721, the insulator 722, the conductor 724, the insulator 725, the conductor 726, the insulator 728, and the conductor 719 are aligned to each other.

Figure 19B:
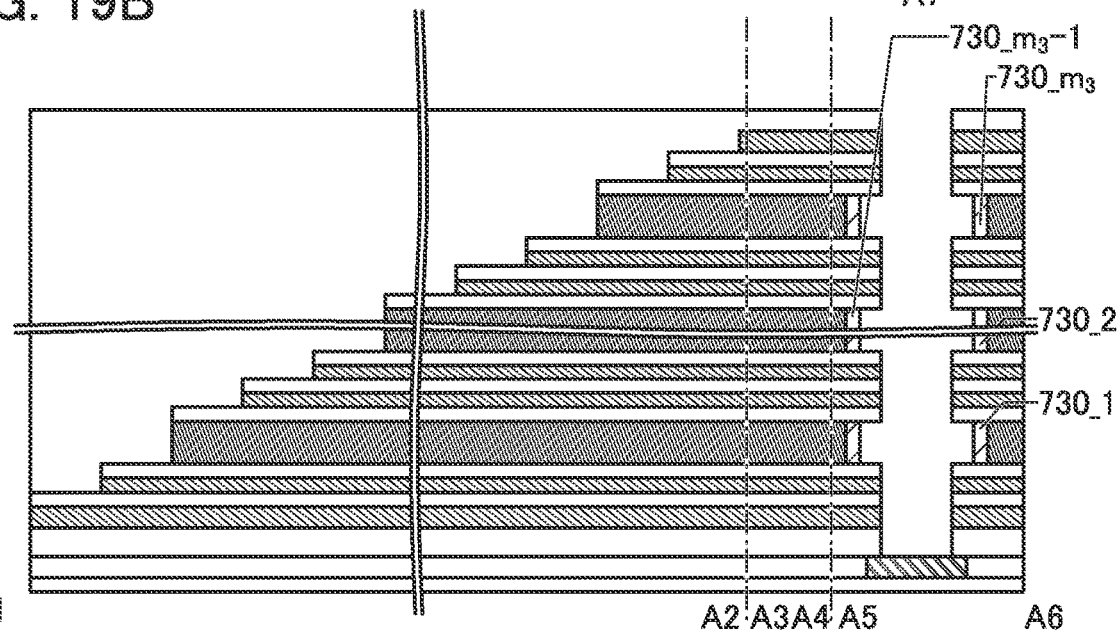
Figure 19C:
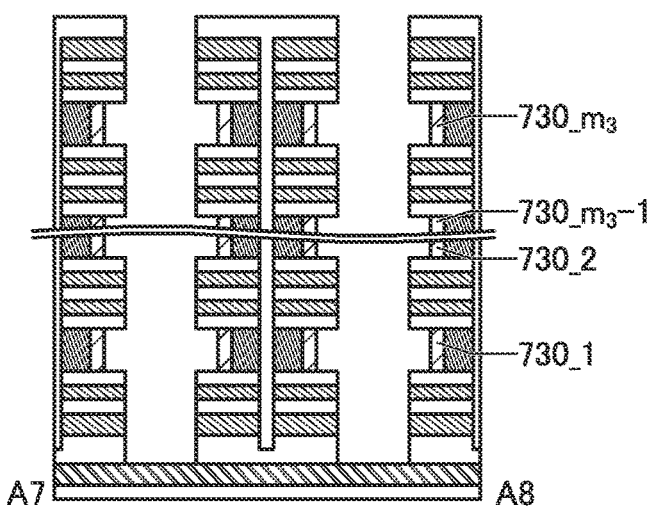

Then, side-etching treatment is performed on the oxide 730B_1 to the oxide 730B_$m_3$, whereby the ring-like oxide 730_1 to the ring-like oxide 730_$m_3$ are formed (see FIG. 19). Part of the oxide 730B is removed, so that the exposed side surface of the oxide 730 can be located outward from the side surface of the opening portion of the conductor 718, the insulator 720, the conductor 721, the insulator 722, the insulator 725, the conductor 726, the insulator 728, and the conductor 719. Thus, the opening portion of the oxide 730 is larger than the opening portion formed in the conductor 718, the conductor 721, and the conductor 726.

The etching treatment is preferably performed by wet etching or a highly isotropic dry etching method. In the etching treatment, the etching rate of the oxide 730 in the side surface direction is preferably remarkably higher than the etching rate of the conductor 718, the insulator 720, the conductor 721, the insulator 722, the insulator 725, the conductor 726, the insulator 728, and the conductor 719. When the etching rate of the conductor 718, the insulator 720, the conductor 721, the insulator 722, the insulator 725, the conductor 726, the insulator 728, and the conductor 719 is 1, the etching rate of the oxide 730 is preferably 5 or more, further preferably 10 or more. Therefore, etching conditions are selected as appropriate so that the above-described etching rates are satisfied.

Figure 20A:
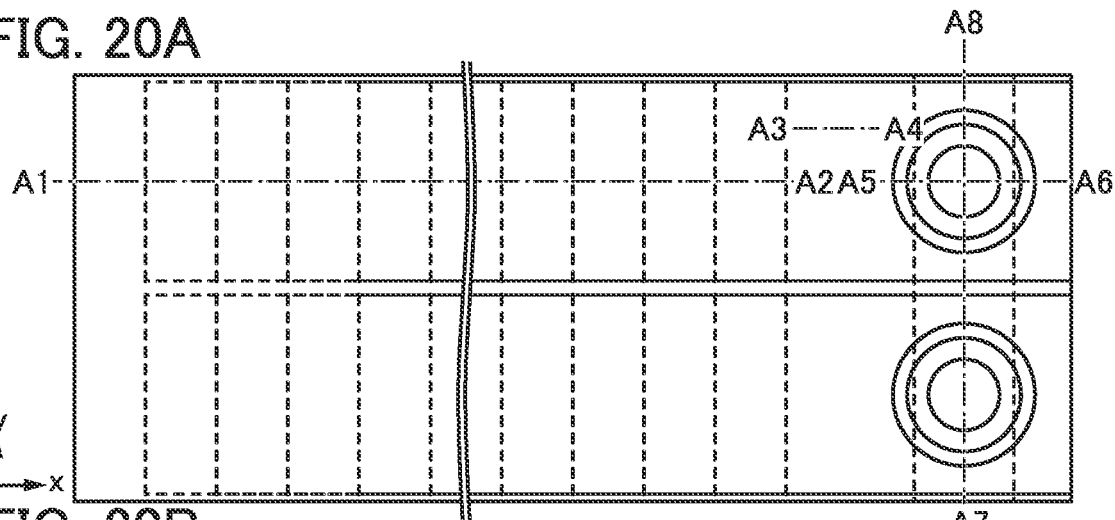
FIGS. 20A-20C A plan view and cross-sectional views illustrating a method for manufacturing a semiconductor device of one embodiment of the present invention.
Figure 20B:
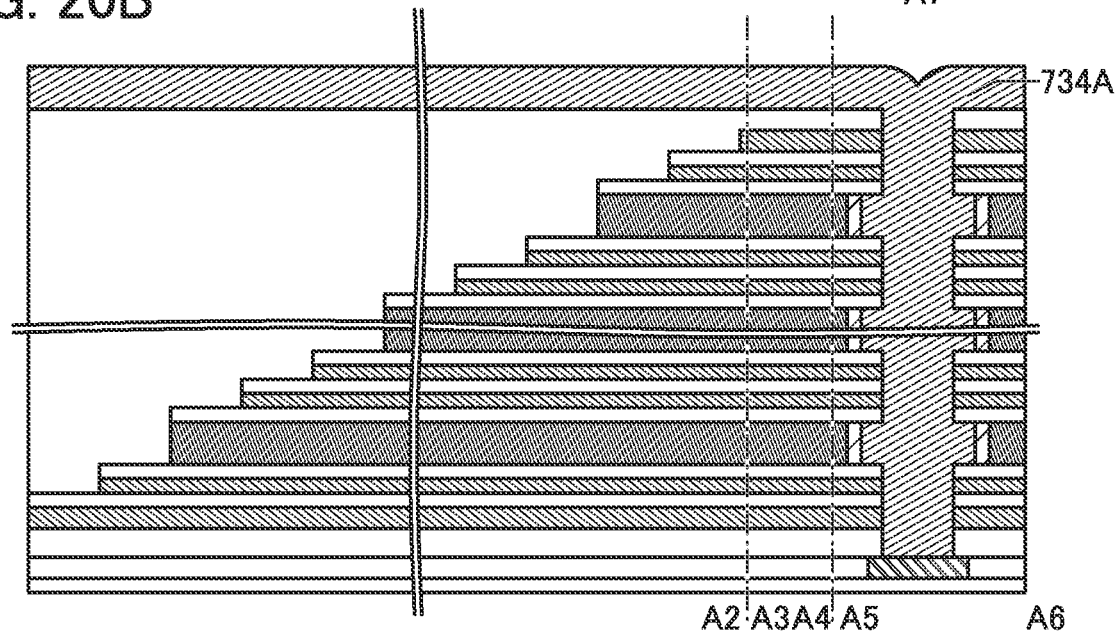
Figure 20C:
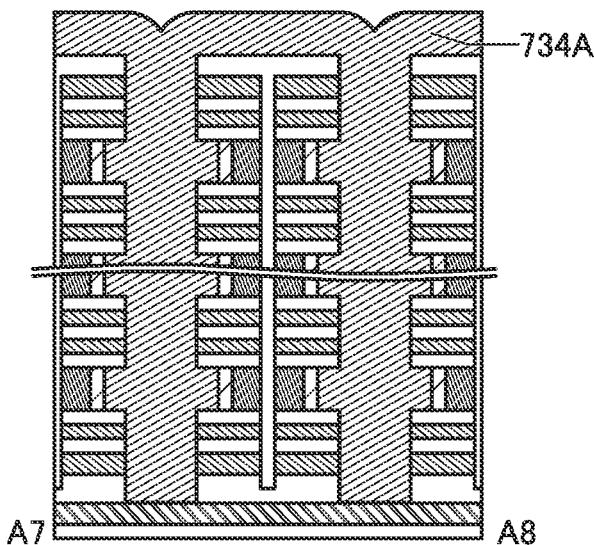

Next, the conductive film 734A is formed in the opening portions formed in the stack including the conductor 718, the insulator 720, the conductor 721, the insulator 722, the oxide 730, the insulator 725, the conductor 726, the insulator 728, and the conductor 719 (see FIG. 20). The conductive film 734A can be formed by a CVD method or an ALD method. It is particularly preferable to employ an ALD method, in which case a film with a uniform thickness can be formed even in a groove or an opening portion having a large aspect ratio. Alternatively, the conductive film 734A may be formed by a combination of an ALD method and a CVD method. In the case where a CVD method is employed, an MOCVD method or an MCVD method may be employed. When the conductive film 734A is a stacked film, films may be formed in the same deposition apparatus or different deposition apparatuses.

Figure 21A:
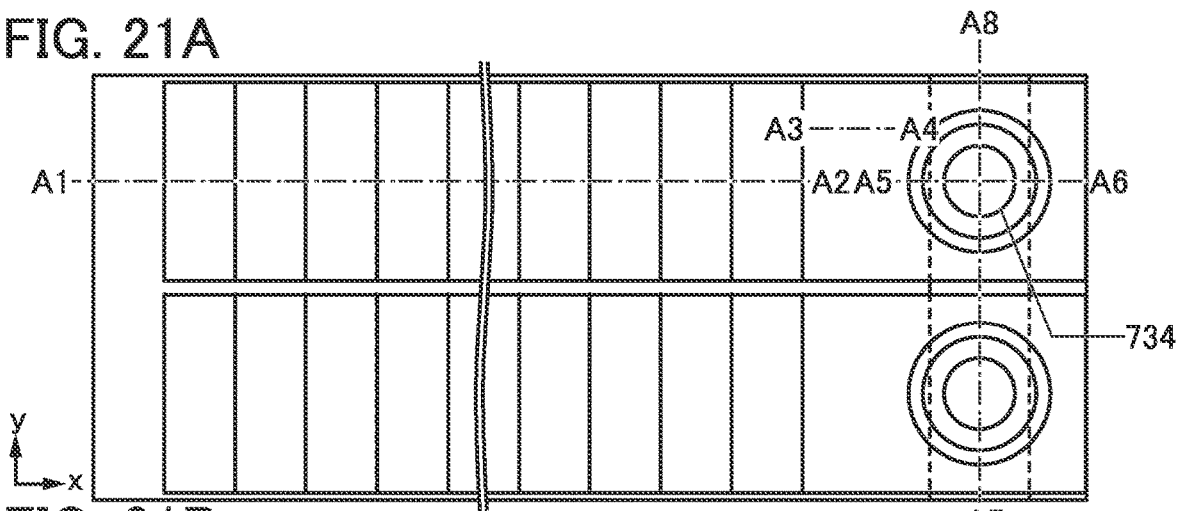
FIGS. 21A-21C A plan view and cross-sectional views illustrating a method for manufacturing a semiconductor device of one embodiment of the present invention.
Figure 21B:
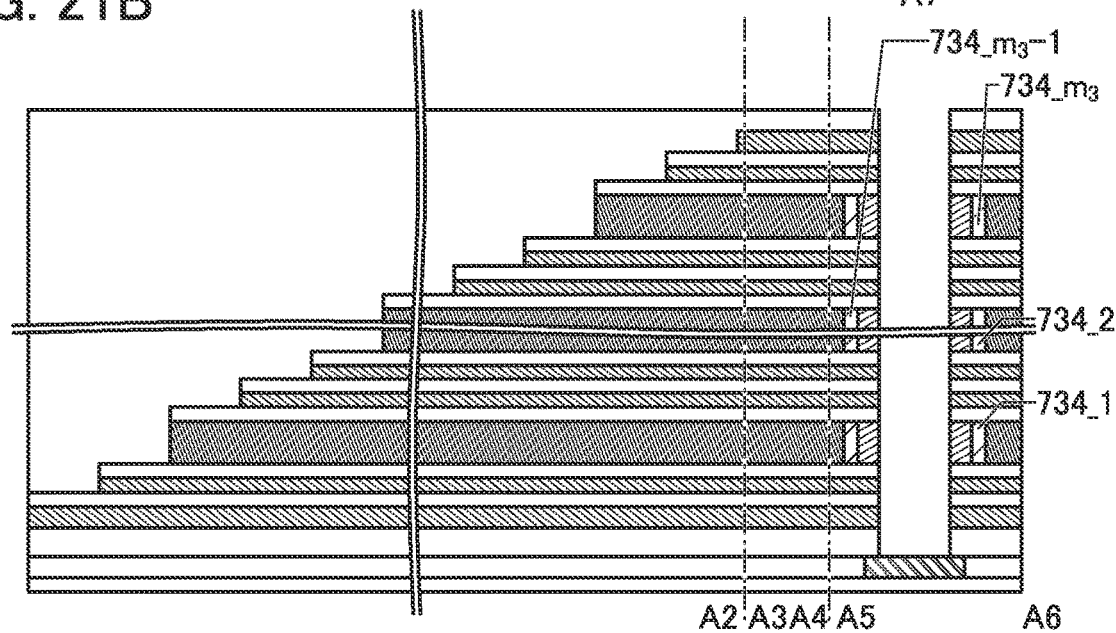
Figure 21C:
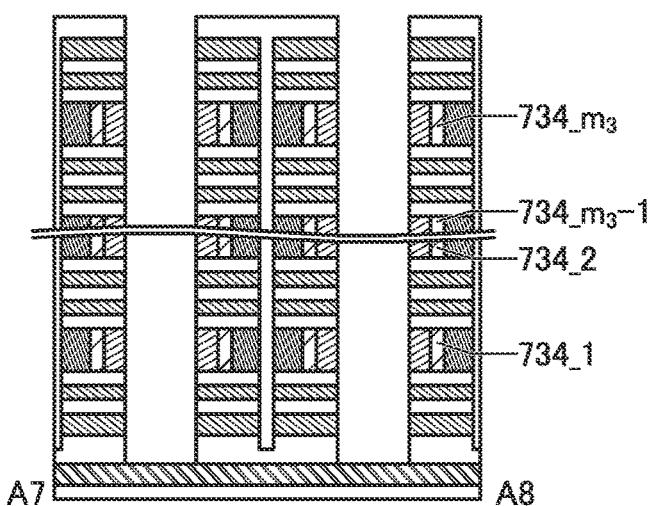

Next, anisotropic etching is performed to selectively remove the conductive film 734A, whereby the ring-like conductor 734 is formed (see FIG. 21). As illustrated in FIG. 21, the conductor 734 is formed on the side surface of the opening portion of the oxide 730, and the side surface of the opening portion of the conductor 718, the insulator 720, the conductor 721, the insulator 722, the insulator 725, the conductor 726, the insulator 728, and the conductor 719 is exposed. That is, the conductor 734 is divided into $m_3$ conductors to be a conductor 734_1 to a conductor 734_$m_3$. As illustrated in FIG. 21(A), the conductor 734 has a cylindrical shape including an opening portion concentric to the opening portion of the conductor 718, the insulator 720, the conductor 721, the insulator 722, the conductor 724, the oxide 730, the insulator 725, the conductor 726, the insulator 728, and the conductor 719. The side surface of the opening portion of the conductor 734 is preferably on the same surface as the side surface of the opening portion of the conductor 718, the insulator 720, the conductor 721, the insulator 722, the insulator 725, the conductor 726, the insulator 728, and the conductor 719. Note that when the conductive film 734A is selectively removed, part of the opening portion formed in the stack including the conductor 718, the insulator 720, the conductor 721, the insulator 722, the conductor 724, the insulator 725, the conductor 726, the insulator 728, and the conductor 719 may be etched to widen the diameter of the opening portion so that the side surfaces of the conductor 718, the insulator 720, the conductor 721, the insulator 722, the conductor 724, the insulator 725, the conductor 726, the insulator 728, and the conductor 719 are aligned to each other.

Figure 22A:
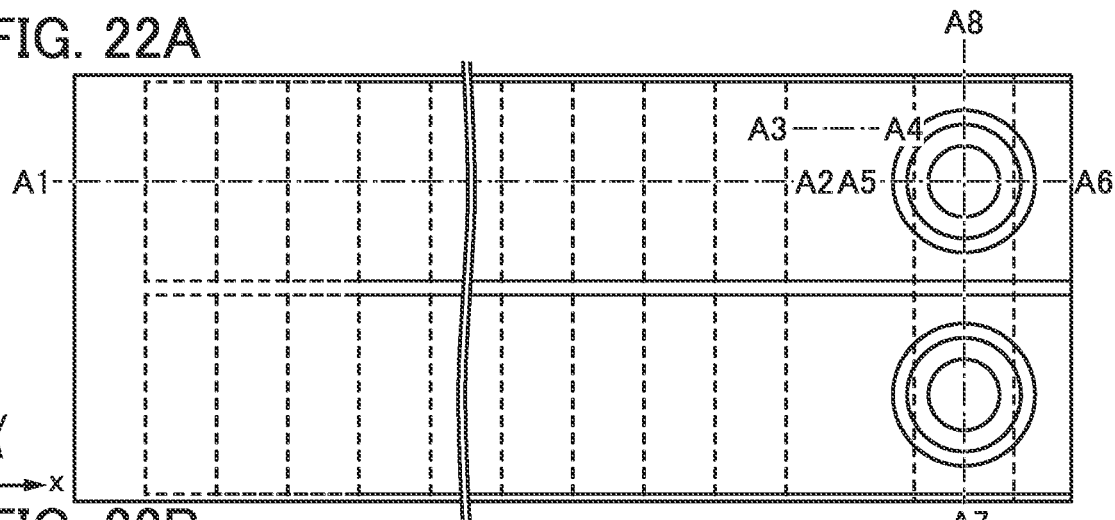
FIGS. 22A-22C A plan view and cross-sectional views illustrating a method for manufacturing a semiconductor device of one embodiment of the present invention.
Figure 22B:
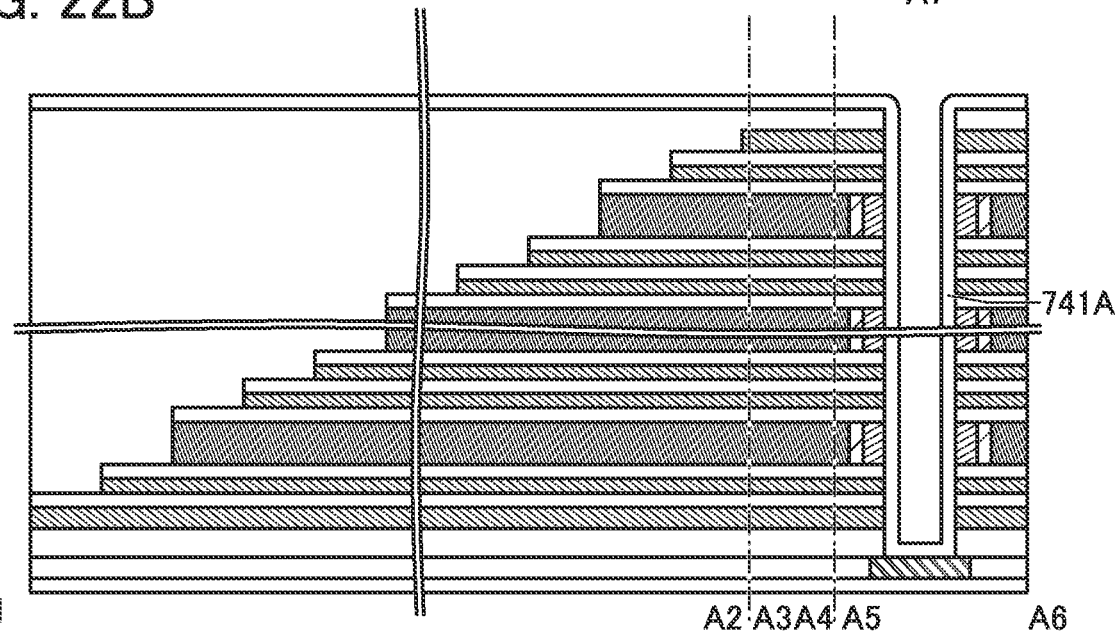
Figure 22C:
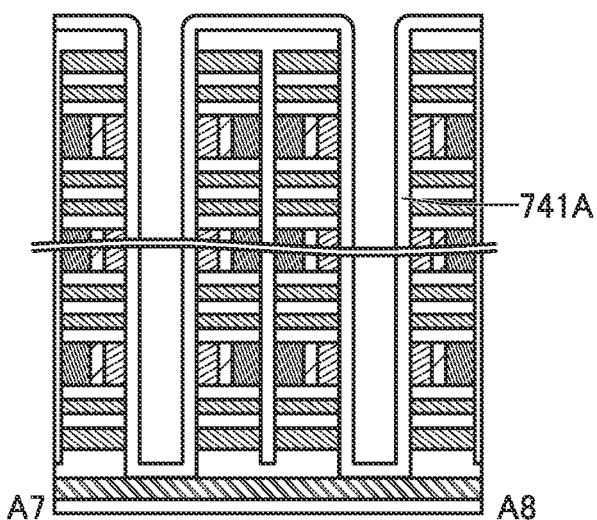

Next, the insulator 741A is formed in the opening portion of the stack including the conductor 718, the insulator 720, the conductor 721, the insulator 722, the conductor 724, the oxide 730, the conductor 734, the insulator 725, the conductor 726, the insulator 728, and the conductor 719 (see FIG. 22).

The insulator 741A can be formed by a sputtering method, a CVD method, an MBE method, a PLD method, an ALD method, or the like. It is particularly preferable to employ an ALD method, in which case a film with a uniform thickness can be formed even in a groove or an opening portion having a large aspect ratio. Alternatively, the insulator 741A may be formed by a combination of an ALD method and a CVD method.

Figure 23A:
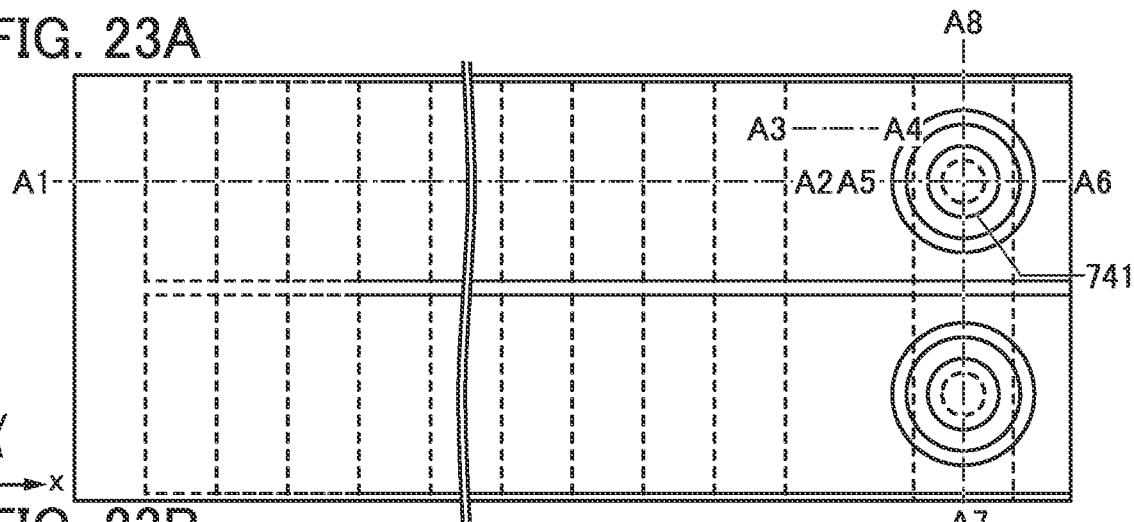
FIGS. 23A-23C A plan view and cross-sectional views illustrating a method for manufacturing a semiconductor device of one embodiment of the present invention.
Figure 23B:
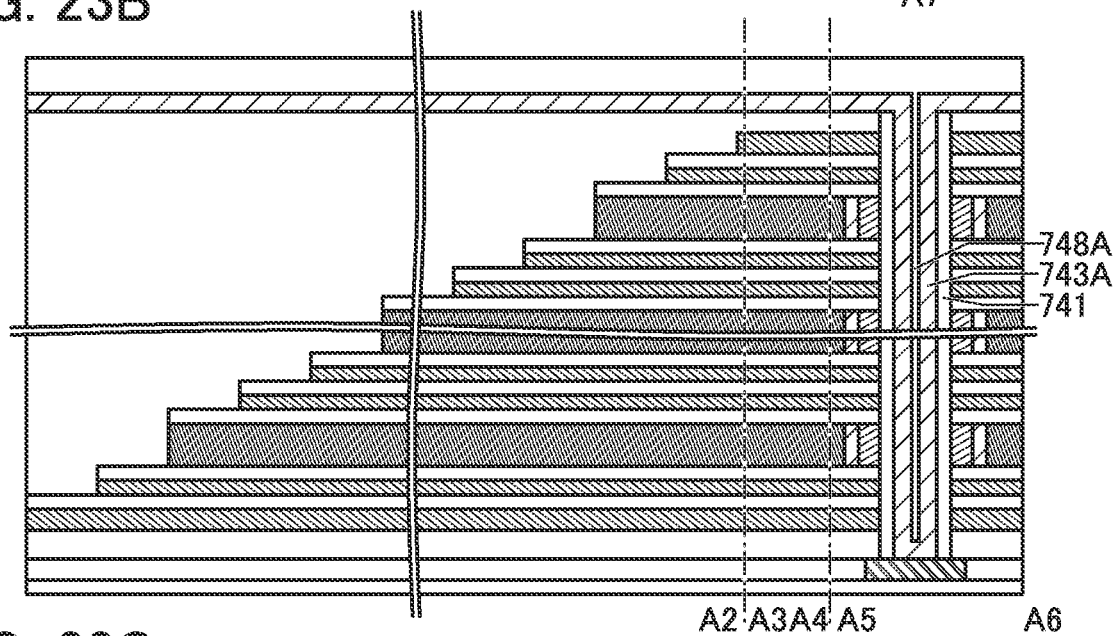
Figure 23C:
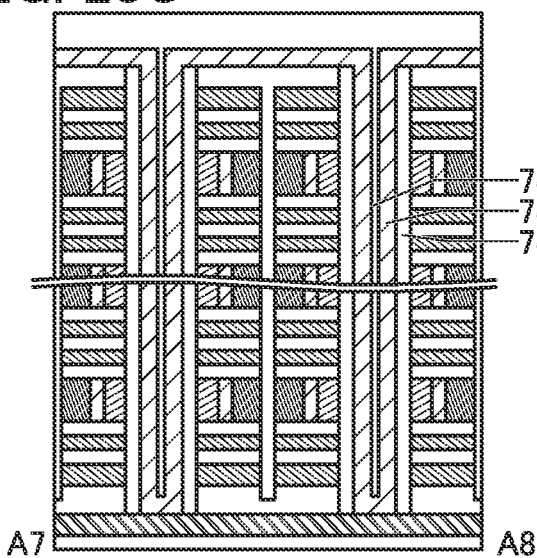

Next, an unnecessary portion of the insulator 741A is removed to form the insulator 741 (see FIG. 23). In this step, etch-back treatment or the like can be employed. It is preferable to remove part of the insulator 741A until the conductor 714 is exposed. Accordingly, as illustrated in FIG. 23, the insulator 741 has a cylindrical shape including an opening portion concentric to the opening portion of the conductor 718, the insulator 720, the conductor 721, the insulator 722, the conductor 724, the oxide 730, the conductor 734, the insulator 725, the conductor 726, the insulator 728, and the conductor 719.

Then, the oxide 743A and the insulator 748A are formed in the opening portion of the stack including the conductor 718, the insulator 720, the conductor 721, the insulator 722, the conductor 724, the oxide 730, the conductor 734, the insulator 725, the conductor 726, the insulator 728, and the conductor 719 (see FIG. 23). A bottom portion of the oxide 743 is in contact with the conductor 714 as illustrated in FIG. 24.

The oxide 743A and the insulator 748A can be formed by a sputtering method, a CVD method, an MBE method, a PLD method, an ALD method, or the like. It is particularly preferable to employ an ALD method, in which case a film with a uniform thickness can be formed even in a groove or an opening portion having a large aspect ratio. Alternatively, the oxide 743A and the insulator 748A may be formed by a combination of an ALD method and a CVD method.

Figure 24A:
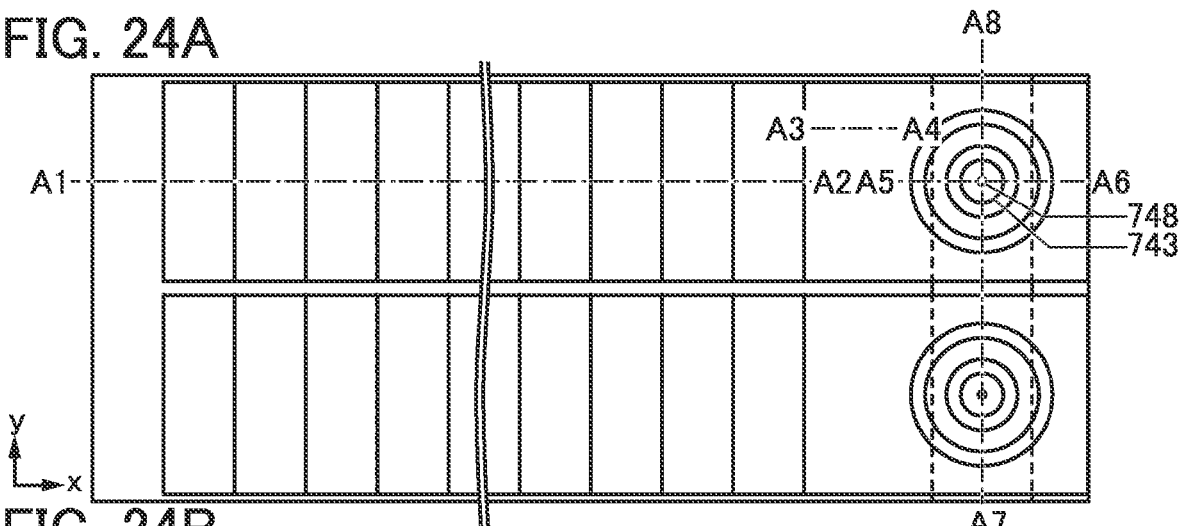
FIGS. 24A-24C A plan view and cross-sectional views illustrating a method for manufacturing a semiconductor device of one embodiment of the present invention.
Figure 24B:
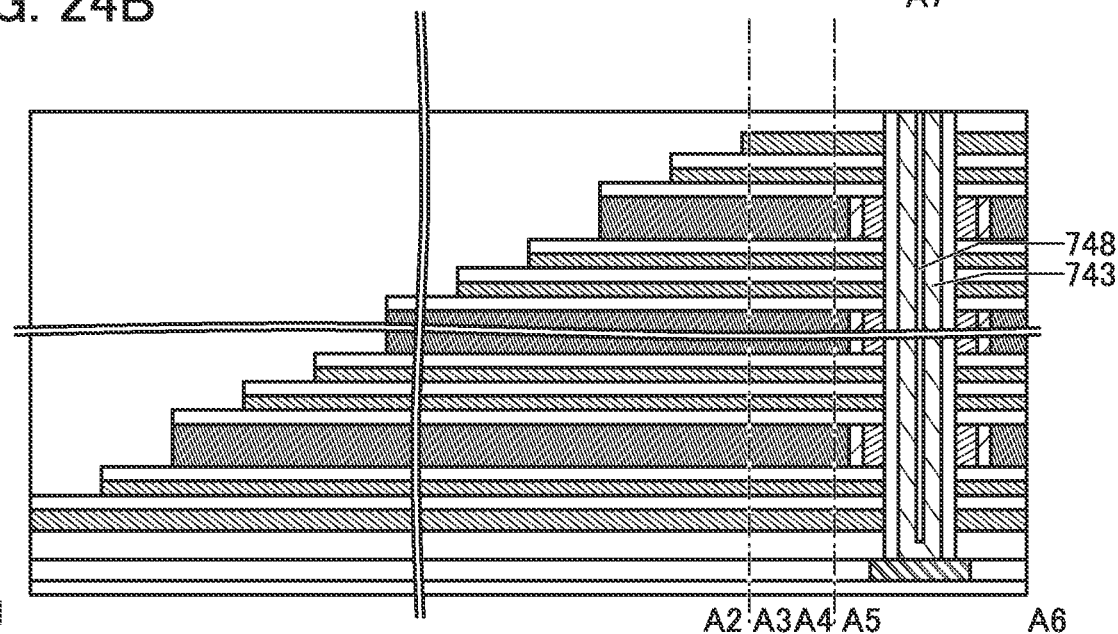
Figure 24C:
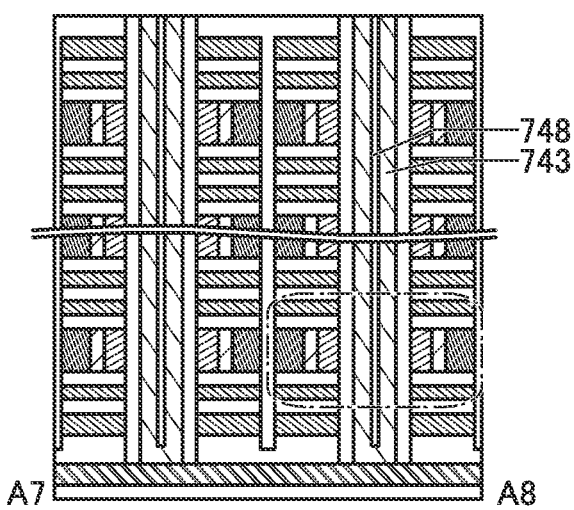

Then, unnecessary portions of the oxide 743A and the insulator 748A are removed to form the oxide 743 and the insulator 748 (see FIG. 24). In this processing, for example, the oxide 743A and the insulator 748A are partly removed by chemical mechanical polishing treatment or the like until the insulator 750 is exposed, so that the oxide 743 and the insulator 748 are formed. At this time, the insulator 750 can be used as a stopper layer, and the thickness of the insulator 750 is reduced in some cases.

Figure 25A:
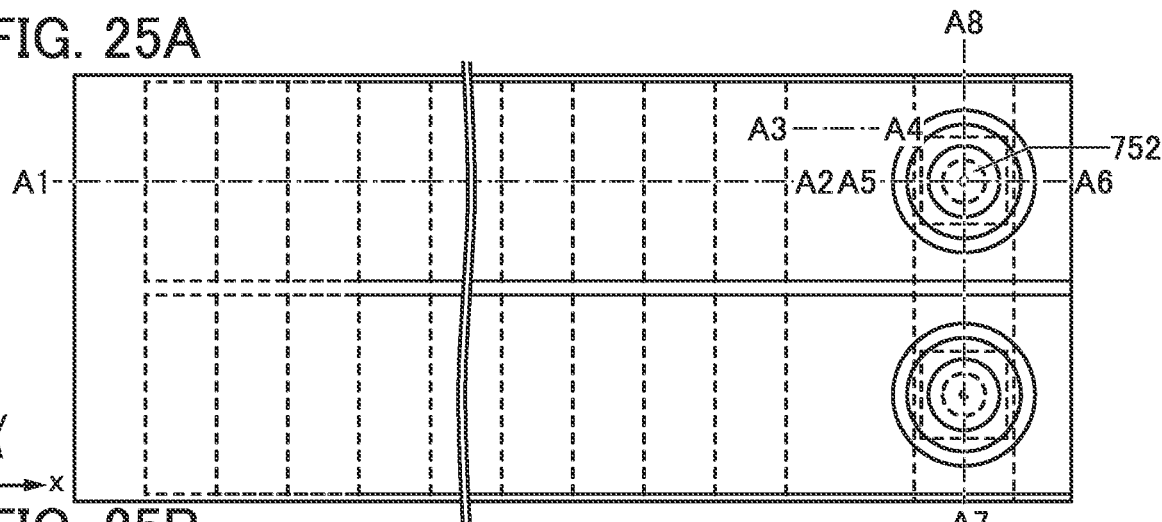
FIGS. 25A-25C A plan view and cross-sectional views illustrating a method for manufacturing a semiconductor device of one embodiment of the present invention.
Figure 25B:
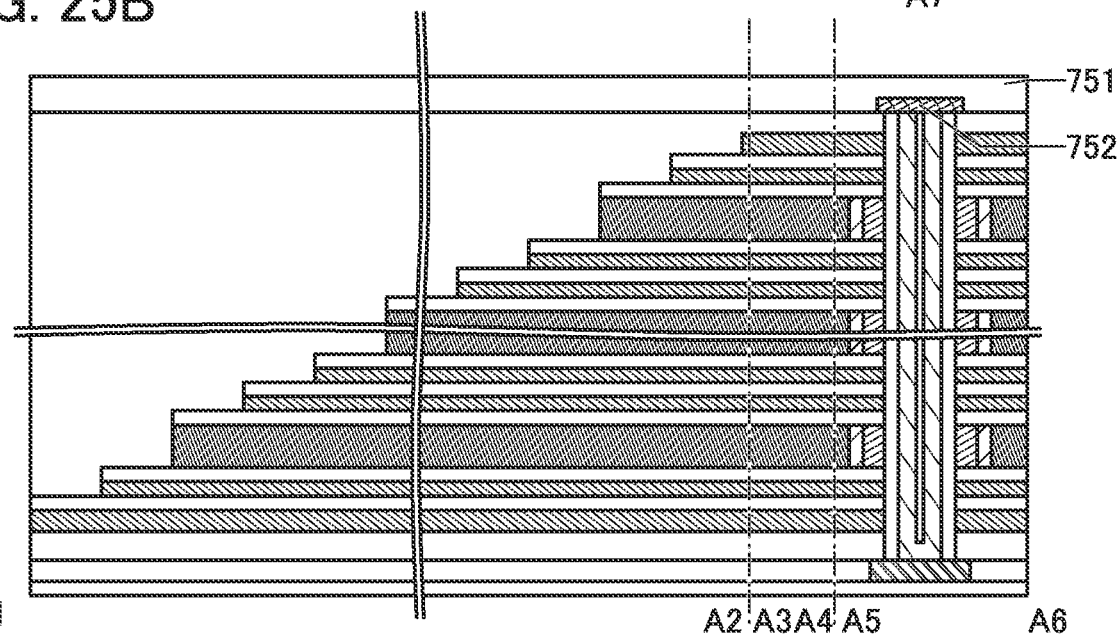
Figure 25C:
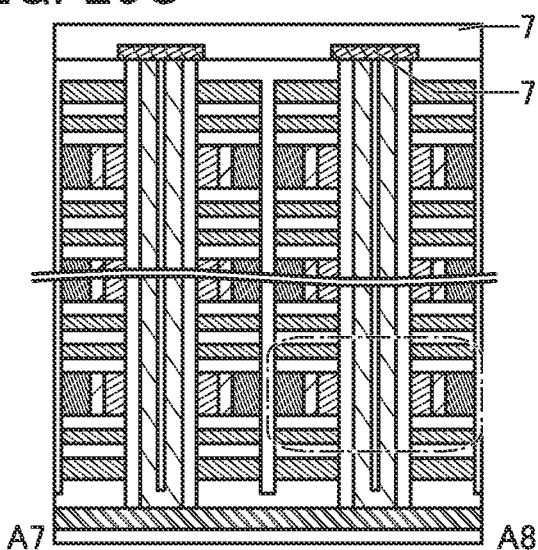

Next, the conductor 752 and the insulator 751 are formed (see FIG. 25). The conductor 752 is preferably formed by forming a film to be the conductor 752 and then processing the film by a lithography method or the like. The insulator 751 can be formed by a CVD method or an ALD method. The insulator 751 is preferably subjected to planarization treatment by a CMP method or a reflow method.

Figure 26A:
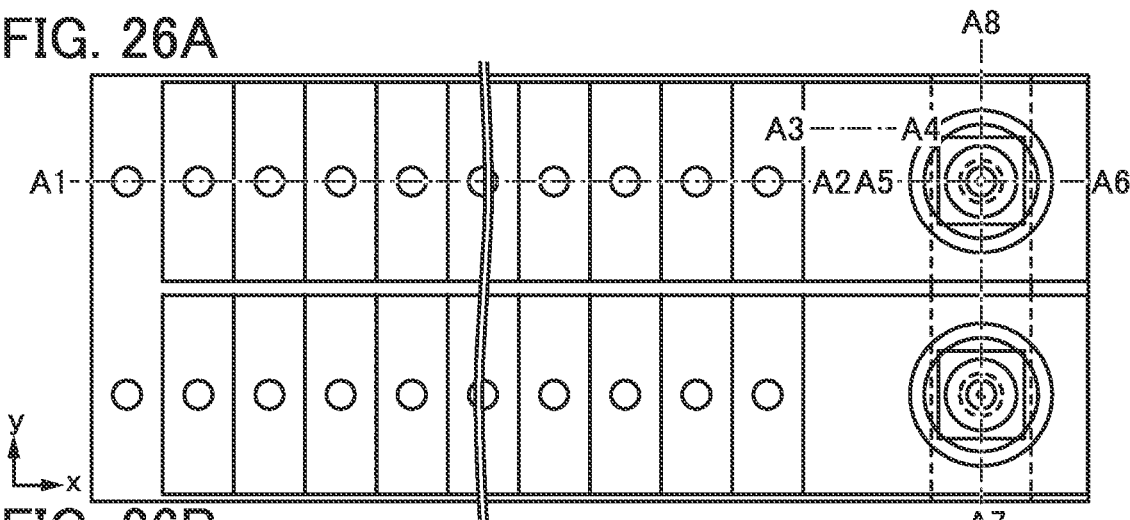
FIGS. 26A-26C A plan view and cross-sectional views illustrating a method for manufacturing a semiconductor device of one embodiment of the present invention.
Figure 26B:
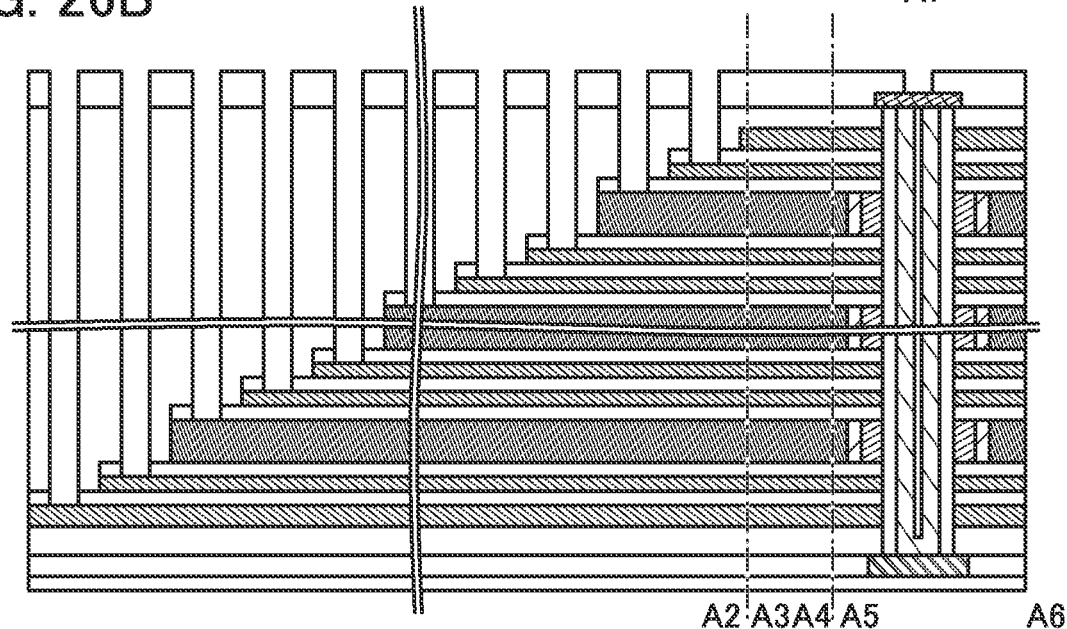
Figure 26C:
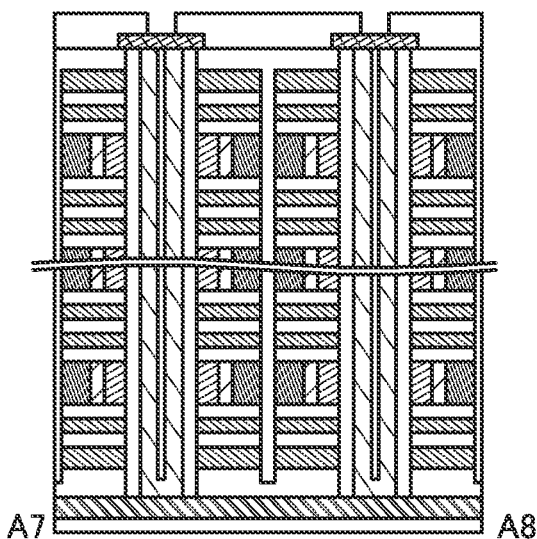

Next, the insulator 751 and the insulator 750 are processed by a lithography method to form opening portions so that the conductor 718, the conductor 721, the conductor 724, the conductor 726, and the conductor 752 are exposed (see FIG. 26). The opening portion is formed for each of the conductor 721, the conductor 724, and the conductor 726, which are formed in a step-like shape.

Figure 27A:
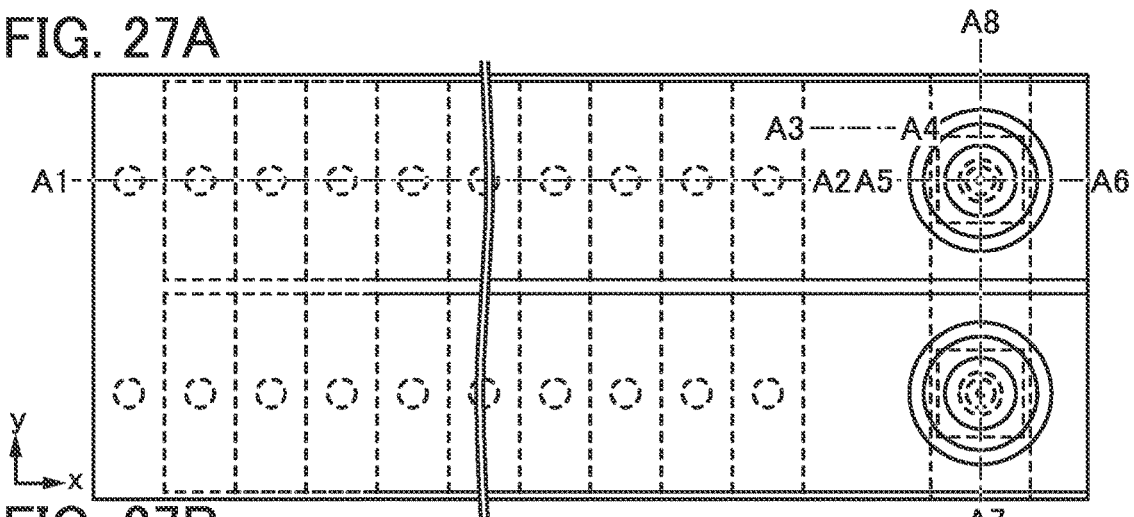
FIGS. 27A-27C A plan view and cross-sectional views illustrating a method for manufacturing a semiconductor device of one embodiment of the present invention.
Figure 27B:
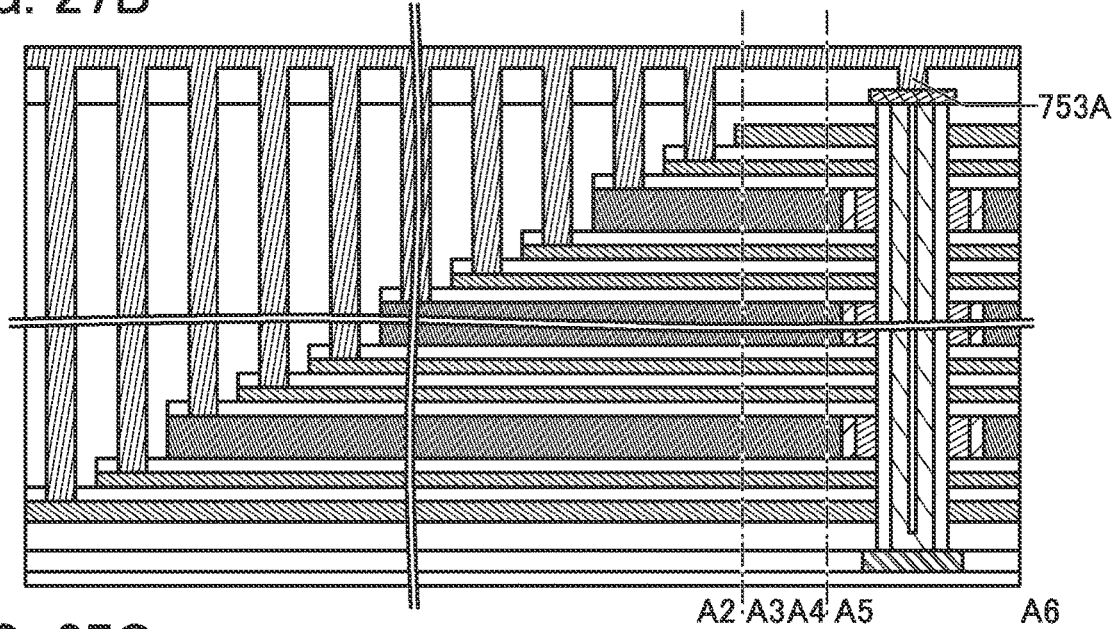
Figure 27C:
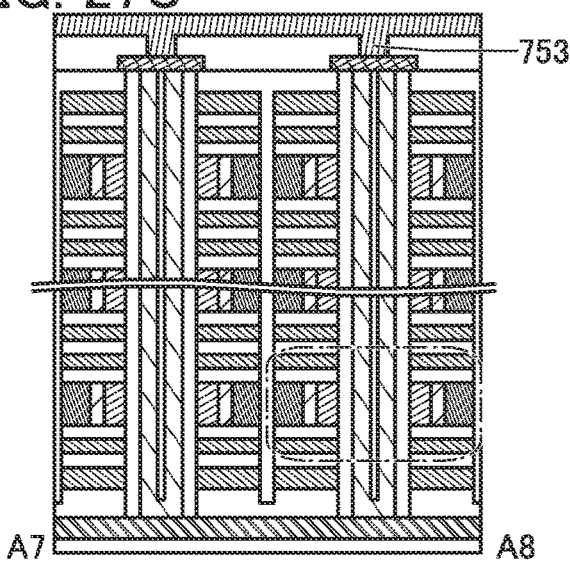

Then, a conductive film 753A is formed over the insulator 751 and in the opening portions of the insulator 750 and the insulator 751 (see FIG. 27). The conductive film 753A can be formed by a CVD method or an ALD method. It is particularly preferable to employ an ALD method, in which case a film with a uniform thickness can be formed even in a groove or an opening portion having a large aspect ratio. Alternatively, the conductive film 753A may be formed by a combination of an ALD method and a CVD method. The conductive film 753A may have a stacked-layer structure of a plurality of layers.

Figure 28A:
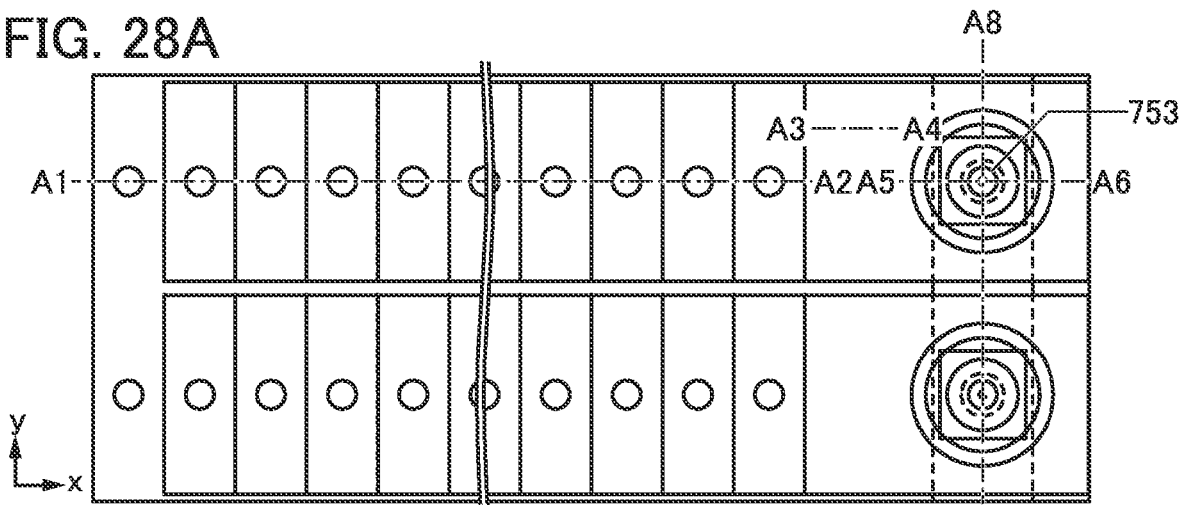
FIGS. 28A-28C A plan view and cross-sectional views illustrating a method for manufacturing a semiconductor device of one embodiment of the present invention.
Figure 28B:
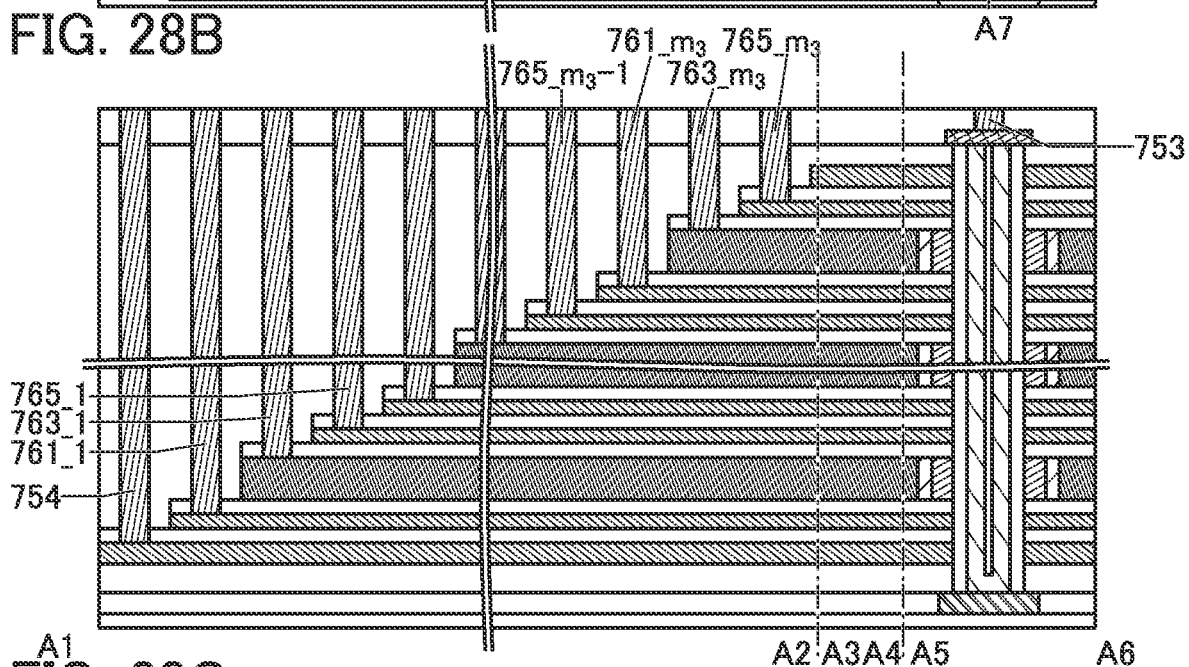
Figure 28C:
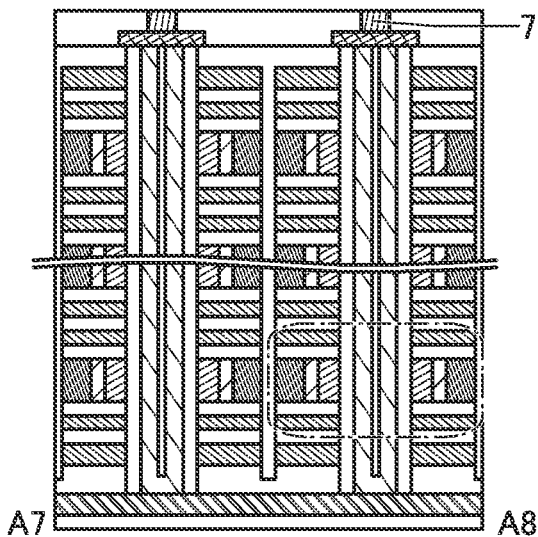

Next, part of the conductive film 753A is removed, and the conductor 753, the conductor 754, the conductor 761, the conductor 763, and the conductor 765 are formed to be embedded in the opening portions (see FIG. 28). In this processing, the conductors can be formed by removing an unnecessary portion of the conductive film 753A by CMP or the like.

Figure 29A:
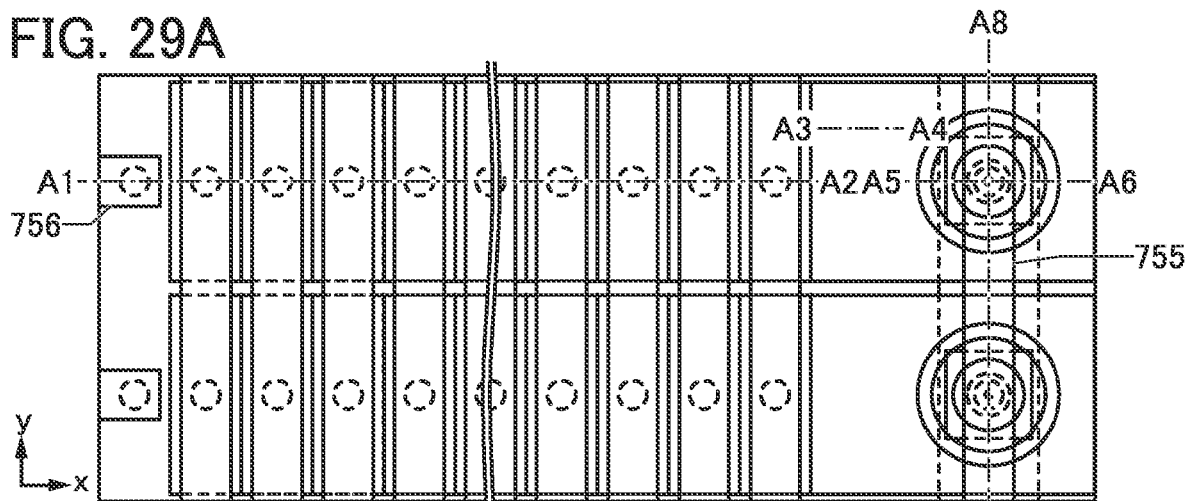
FIGS. 29A-29C A plan view and cross-sectional views illustrating a method for manufacturing a semiconductor device of one embodiment of the present invention.
Figure 29B:
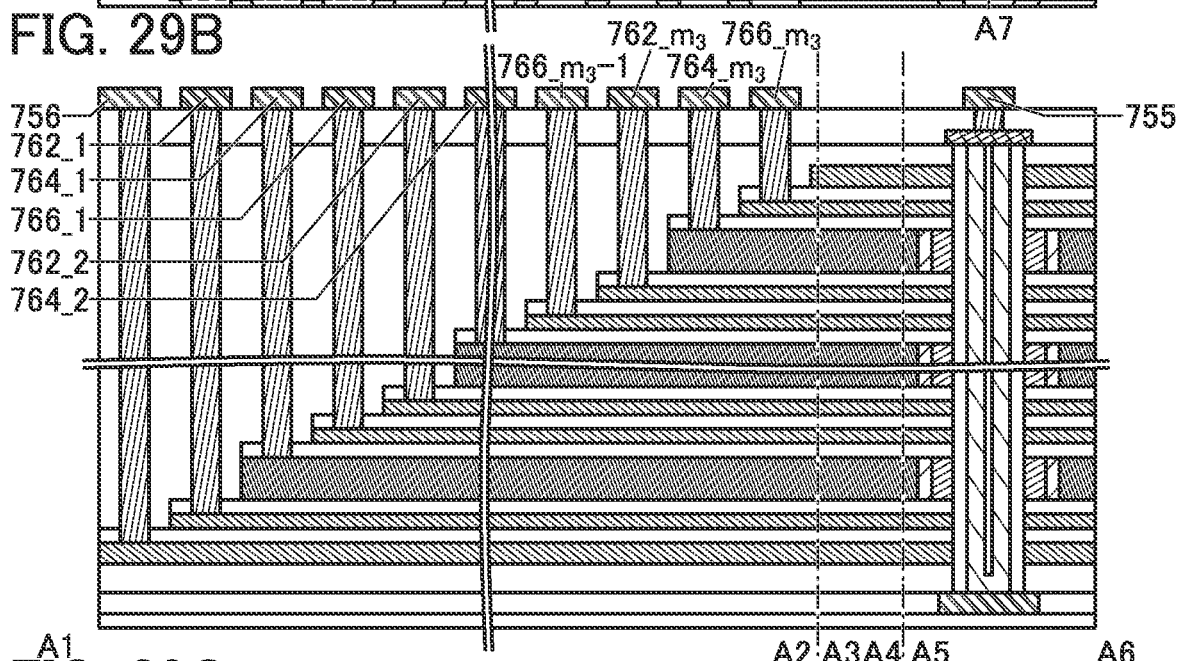
Figure 29C:
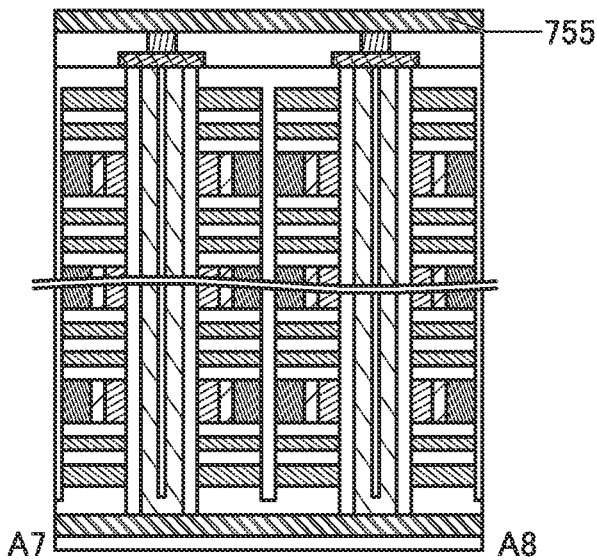

Next, the conductor 755, the conductor 756, the conductor 762, the conductor 764, and the conductor 766 are formed (see FIG. 29). It is preferable that the film to be the conductor 755, the conductor 756, the conductor 762, the conductor 764, and the conductor 766 be formed and then the film be processed by a lithography method or the like.

Next, the insulator 757 is formed (see FIG. 30). The insulator 757 can be formed by a CVD method or an ALD method. The insulator 751 is preferably subjected to planarization treatment by a CMP method or a reflow method.

Next, the conductor 758 and the conductor 759 are formed (see FIG. 30). Opening portions reaching the conductor 719 are provided in the insulator 757, the insulator 751, and the insulator 750. The conductor 758 is formed in the opening portions. The conductor 759 can be formed by a lithography method or the like.

The memory cell array is manufactured in the above manner, whereby the memory transistors in a plurality of layers can be formed at a time without patterning for forming the memory transistors for the plurality of layers. Furthermore, in the case where a memory cell array is formed by the above method, even when the number of layers of the memory transistors is increased, the number of steps of patterning and etching of the memory transistors is not increased. In this manner, the number of manufacturing steps of the memory cell array can be reduced; thus, a semiconductor device with high productivity can be provided.

Moreover, a three-dimensional memory cell array in which the memory cells are stacked in the direction perpendicular to the top surface of a substrate can be provided. Stacking the memory cells can increase storage capacity per unit area in accordance with the number of stacked memory cells. The memory cell includes two transistors and one capacitor; thus, the number of elements is relatively large. In regard to this, with the semiconductor device described in this embodiment, a semiconductor device with a storage capacity per unit area larger than or equal to that of a conventional memory in addition to the favorable characteristics described above can be provided.

<Modification Example of Semiconductor Device>

An example of a semiconductor device including the memory cell array 790 of one embodiment of the present invention is described below with reference to FIG. 30 to FIG. 32. Note that in the semiconductor device illustrated in FIG. 30 to FIG. 32, components having the same functions as the components included in the semiconductor device described in <Structure example of semiconductor device> are denoted by the same reference numerals.

A structure of the semiconductor device is described with reference to FIG. 30 to FIG. 32. Note that also in this section, the materials described in detail in <Structure example of semiconductor device> can be used as materials of the semiconductor device.

FIG. 30(D) illustrates an enlarged view of the memory cell 700 of FIG. 30(C). The memory cell 700 includes the transistor 701, the transistor 703, the transistor 705, the transistor 707, the capacitor 704, and the capacitor 706. The transistor 701 includes the conductor 721 and the conductor 726 functioning as gates, the oxide 730 functioning as a channel formation region, the insulator 722 and the insulator 725 functioning as gate insulators, the conductor 724 functioning as one of a source and a drain, and 734 functioning as the other of the source and the drain.

The memory cell array 790 illustrated in FIG. 30 is different from the memory cell array 790 described in <Structure example of semiconductor device> in the shapes of the oxide 730 and the conductor 734. Unlike in the memory cell 700 illustrated in FIG. 7, the conductor 734 and the insulator 722 or the insulator 725 are provided with the oxide 730 therebetween. Therefore, the side surface of the oxide 730 has a region on the same surface as the side surfaces of the conductor 718, the insulator 720, the conductor 721, the insulator 722, the conductor 724, the conductor 734, the insulator 725, the conductor 726, the insulator 728, and the conductor 719.

A method for manufacturing the memory cell array 790 illustrated in FIG. 30 will be described below with reference to FIG. 31 and FIG. 32.

Figure 16A:
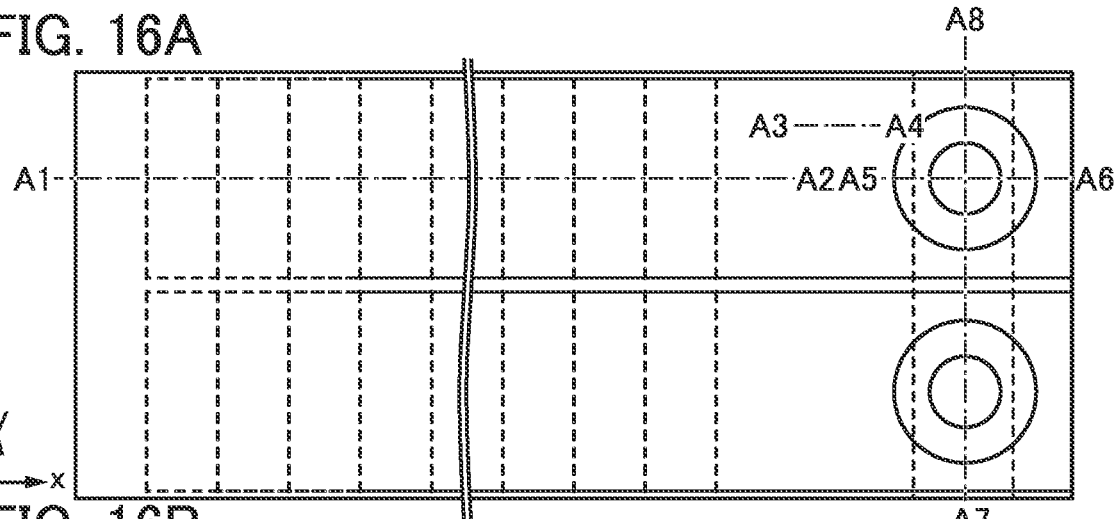
FIGS. 16A-16C A plan view and cross-sectional views illustrating a method for manufacturing a semiconductor device of one embodiment of the present invention.
Figure 16B:
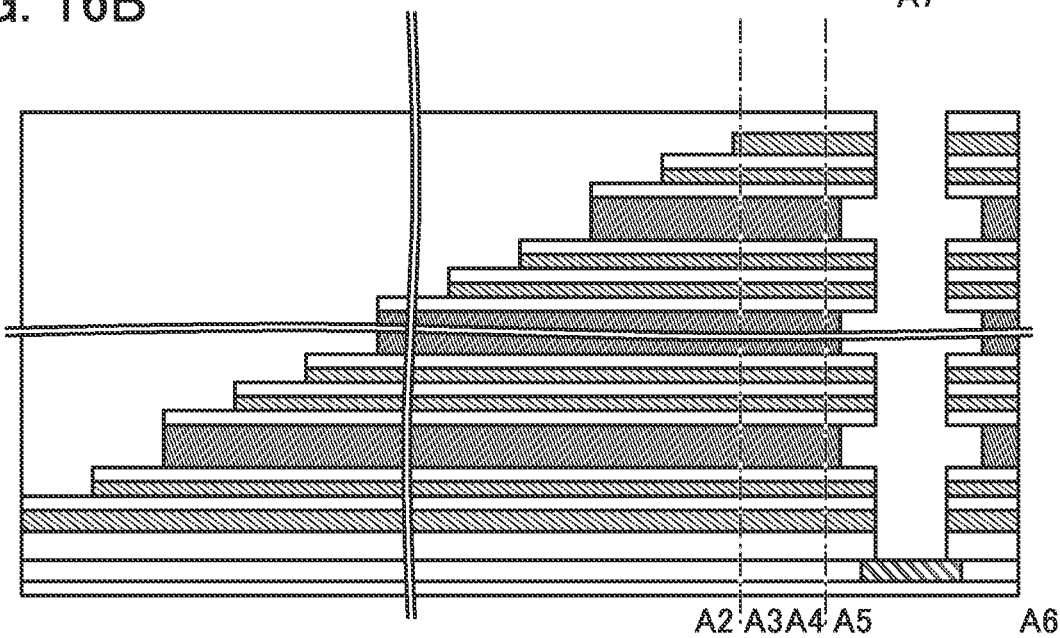
Figure 16C:
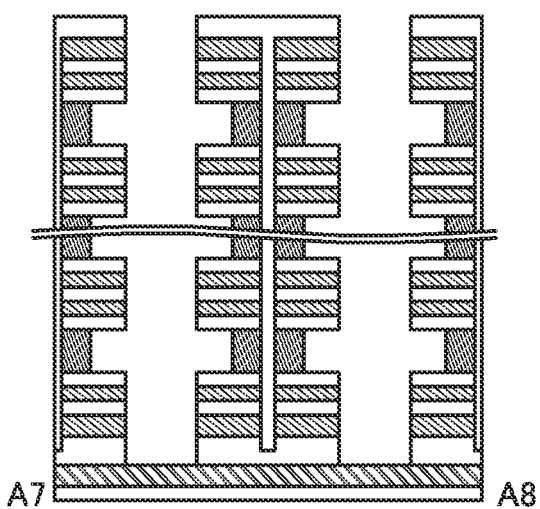

The same manufacturing method as the manufacturing method of the memory cell array 790 illustrated in FIG. 8 to FIG. 29 can be used for the memory cell array 790 described in this section up to the step illustrated in FIG. 16. That is, the above description can be referred to for the steps up to the step of removing part of the conductor 724.

Figure 31A:
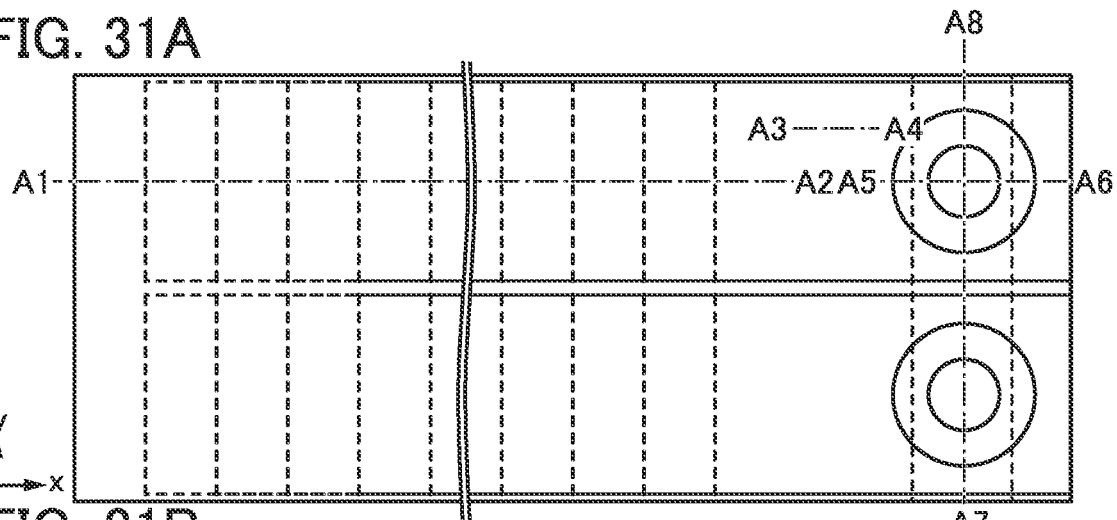
FIGS. 31A-31C A plan view and cross-sectional views illustrating a method for manufacturing a semiconductor device of one embodiment of the present invention.
Figure 31B:
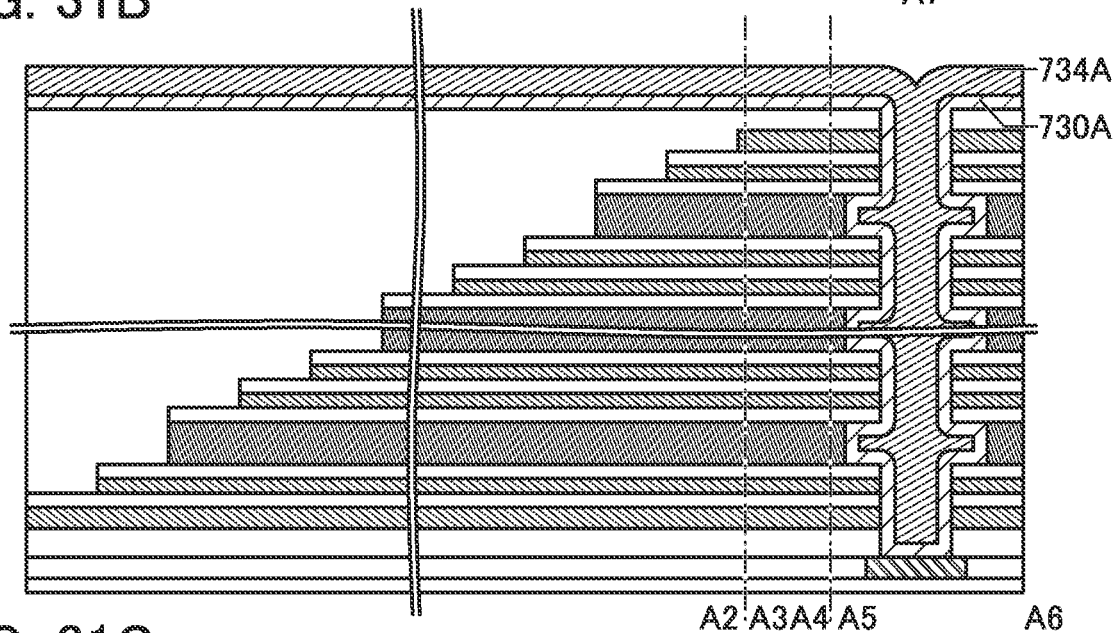
Figure 31C:
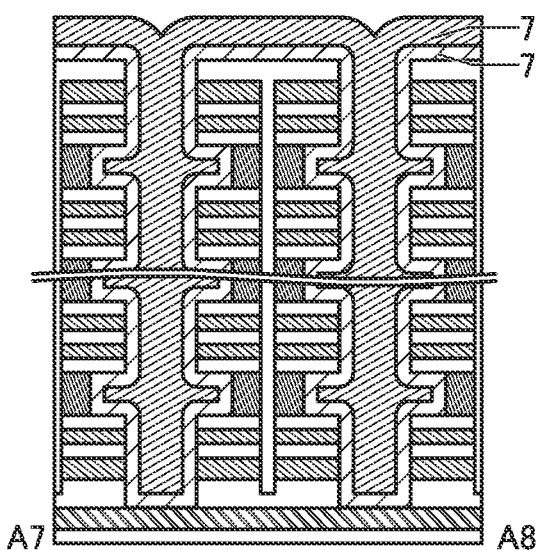

After part of the conductor 724 is removed, the oxide 730A and the conductive film 734A are formed (see FIG. 31). The oxide 730A and the conductive film 734A can be formed by a sputtering method, a CVD method, an MBE method, a PLD method, an ALD method, or the like. It is particularly preferable to employ an ALD method, in which case a film with a uniform thickness can be formed even in a groove or an opening portion having a large aspect ratio. Alternatively, the oxide 730A and an insulating film 750A may be formed by a combination of an ALD method and a CVD method.

Figure 32A:
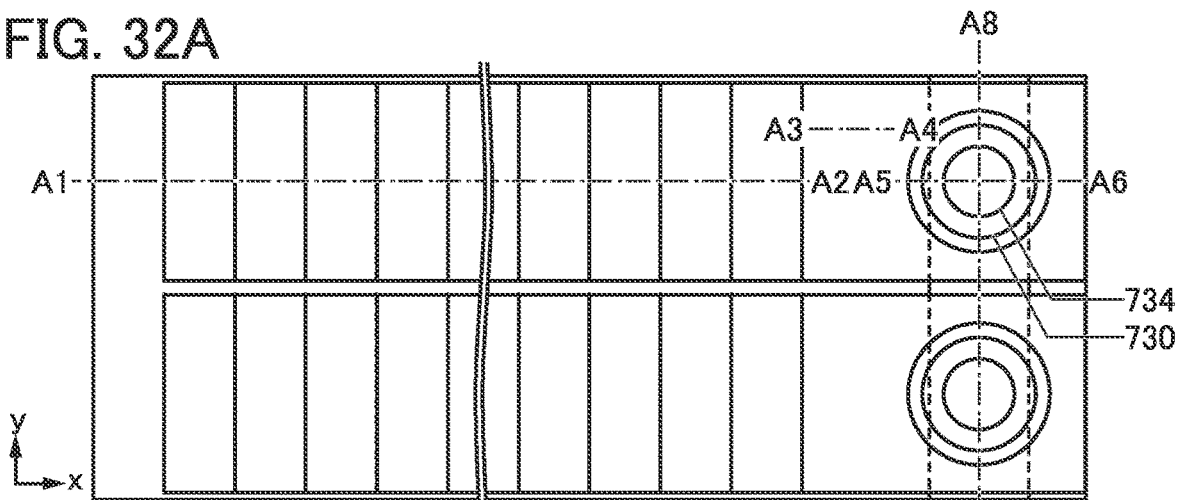
FIGS. 32A-32C A plan view and cross-sectional views illustrating a method for manufacturing a semiconductor device of one embodiment of the present invention.
Figure 32B:
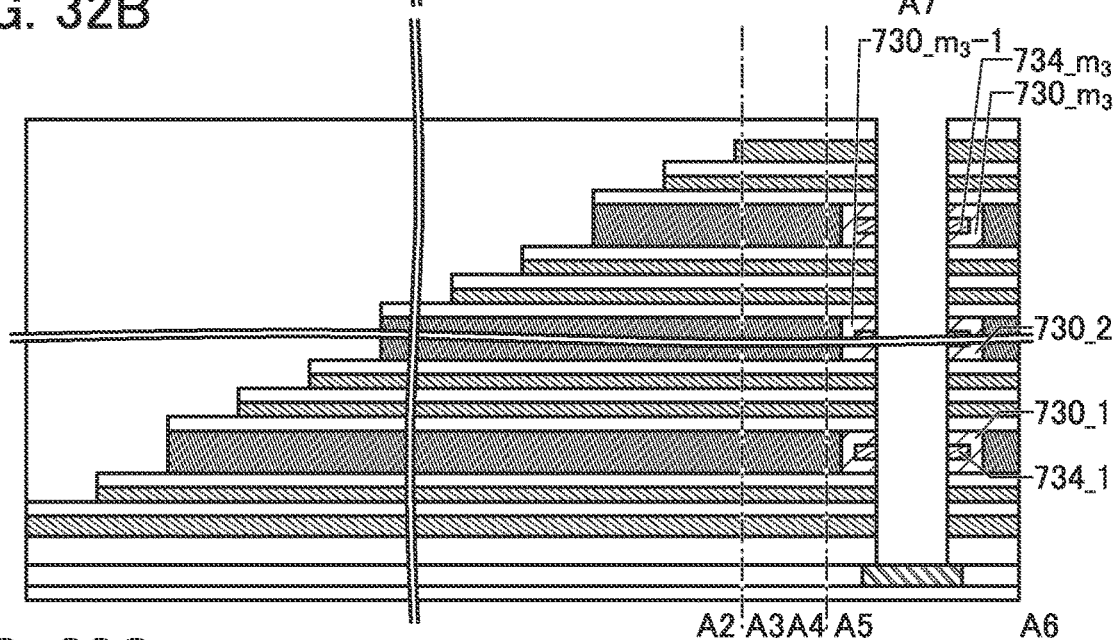
Figure 32C:
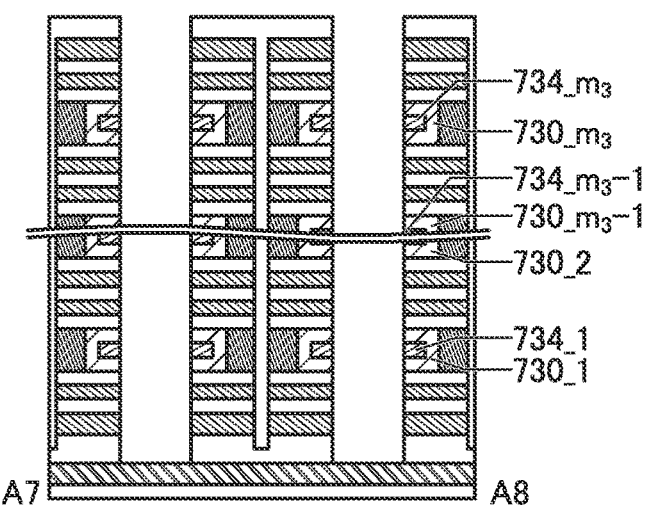
Figure 33A:
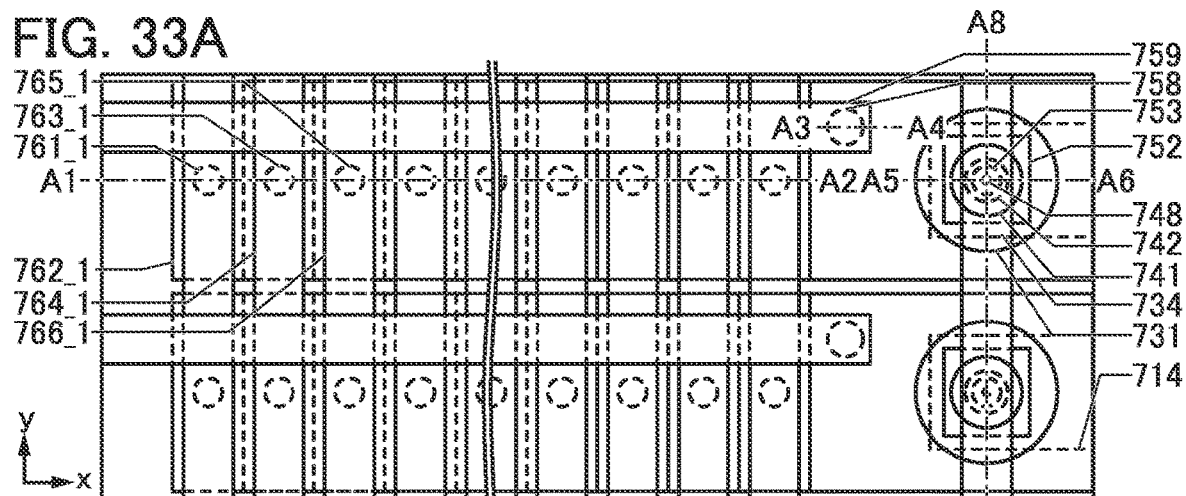
FIGS. 33A-33D A plan view and cross-sectional views illustrating a method for manufacturing a semiconductor device of one embodiment of the present invention.
Figure 33B:
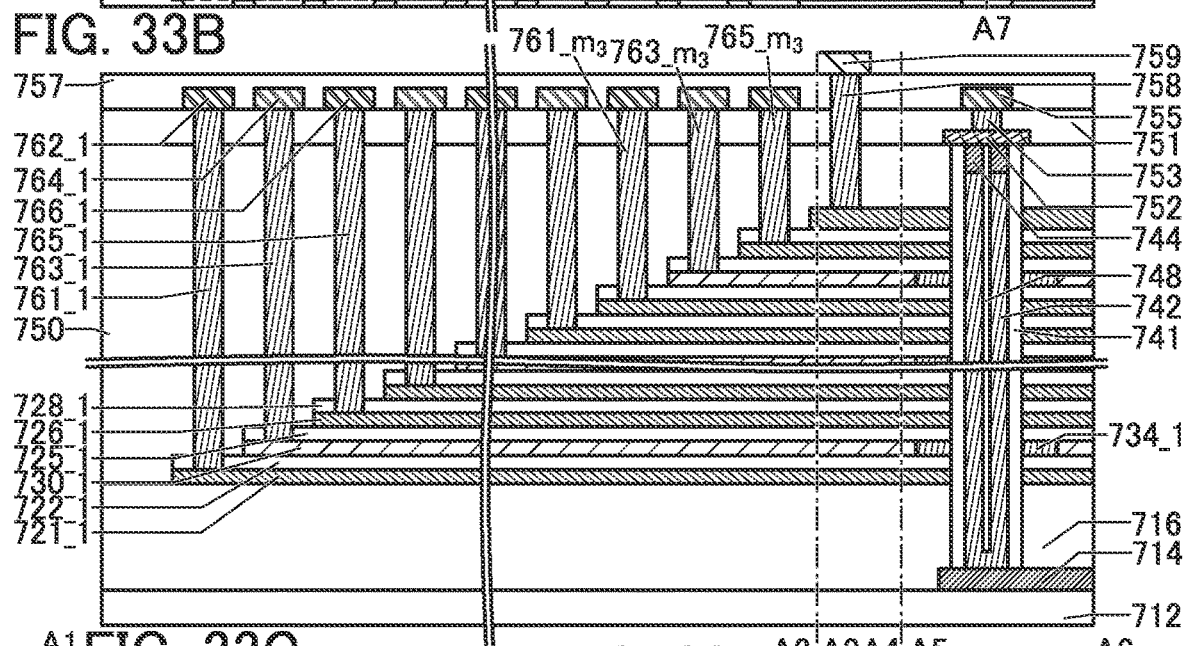
Figure 33C:
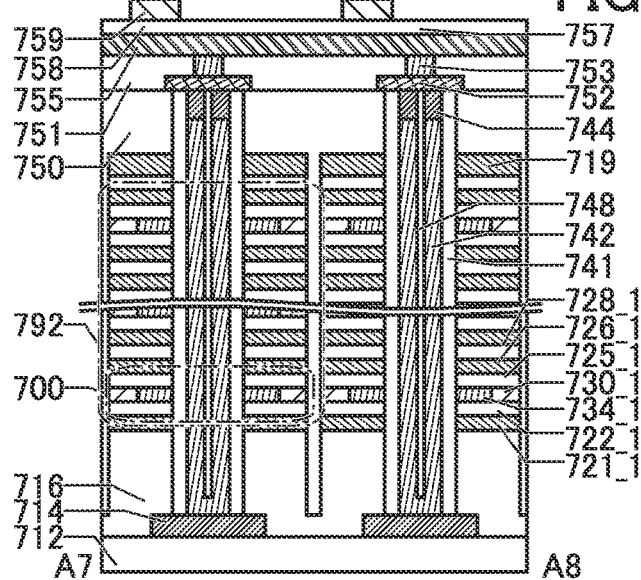
Figure 33D:
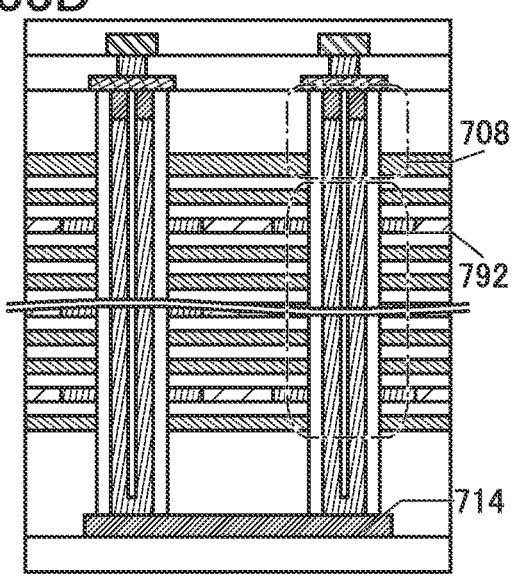

Next, anisotropic etching is performed to selectively remove the oxide 730A and the conductive film 734A, whereby the oxide 730 and the conductor 734 are formed (see FIG. 32). As illustrated in FIG. 32, the oxide 730 and the conductive film 734 are formed on the side surface of the opening portion of the conductor 724, and the side surface of the opening portion of the conductor 718, the insulator 720, the conductor 721, the insulator 722, the insulator 725, the conductor 726, the insulator 728, and the conductor 719 is exposed. That is, the oxide 730A and the conductive film 734A are divided into $m_3$ oxides and $m_3$ conductive films to be the oxide 730_1 to the oxide 730_$m_3$ and the conductor 734_1 to the conductor 734_$m_3$. As illustrated in FIG. 32(A), the oxide 730 and the conductor 734 have a cylindrical shape including an opening portion concentric to the opening portion of the conductor 718, the insulator 720, the conductor 721, the insulator 722, the insulator 725, the conductor 726, the insulator 728, and the conductor 719. Note that when the oxide 730A and the conductive film 734A are selectively removed, part of the opening portion formed in the stack including the conductor 718, the insulator 720, the conductor 721, the insulator 722, the conductor 724, the insulator 725, the conductor 726, the insulator 728, and the conductor 719 may be etched to widen the diameter of the opening portion so that the side surfaces of the conductor 718, the insulator 720, the conductor 721, the insulator 722, the conductor 724, the insulator 725, the conductor 726, the insulator 728, and the conductor 719 are aligned to each other.

Accordingly, the process of the memory cell array 790 illustrated in FIG. 32 can be shorter than that of the memory cell array illustrated in FIG. 7.

Note that the structure of the semiconductor device in this embodiment is an example, and the present invention is not limited to the number, the position, and the like of the circuit element, the wiring, and the like illustrated in the drawings and the like according to this embodiment. The number, the position, and the like of the circuit element, the wiring, and the like included in the semiconductor device in this embodiment can be set as appropriate in accordance with the circuit configuration and the driving method.

The structure, method, and the like described above in this embodiment can be used in combination as appropriate with the structures, methods, and the like described in the other embodiments.

Embodiment 3

In this embodiment, structures of a semiconductor device of one embodiment of the present invention are described with reference to FIG. 33 to FIG. 37. Note that in the semiconductor device illustrated in FIG. 33 to FIG. 37, components having the same functions as the components included in the semiconductor device described in <Structure example of semiconductor device> are denoted by the same reference numerals. Note that also in this section, the materials described in detail in <Structure example of semiconductor device> can be used as materials of the semiconductor device.

Application Example 1 of Semiconductor Device

An example of a semiconductor device including the memory cell array 790 of one embodiment of the present invention is described below with reference to FIG. 33 to FIG. 40. The structure of the semiconductor device is described below with reference to FIG. 33.

The semiconductor device illustrated in FIG. 33 includes the memory cell 700 and the transistor 708. FIG. 33(D) illustrates a cross section of a portion indicated by the dashed-dotted line A5-A6 in FIG. 33(A) and a cross section of a portion beyond A6. As illustrated in FIG. 33(D), one conductor 714 may be shared by at least two strings 792 in the semiconductor device.

The transistor 708 illustrated in FIG. 33 differs from the memory cell array 790 described in Embodiment 1 in the structures of the memory cell 700 and the transistor 708. Specifically, a semiconductor 742 is used instead of the oxide 743.

Here, as the semiconductor 742, silicon, germanium, or the like can be used. Furthermore, a compound semiconductor such as silicon germanium, silicon carbide, gallium arsenide, an oxide semiconductor, or a nitride semiconductor, an organic semiconductor, or the like can be used. In the case of using an organic semiconductor for a semiconductor layer, for example, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used. The same material as the oxide 743 may be used for the semiconductor 742.

That is, in the semiconductor device illustrated in FIG. 33, a p-channel transistor can be provided by using a semiconductor such as silicon as the semiconductor 742. Specifically, in the semiconductor device, the transistor 703, the transistor 705, the transistor 707, and the transistor 708 can be provided as p-channel transistors. On the contrary, the transistor 701 can be an n-channel transistor. Note that as in Embodiment 1, the transistor 703, the transistor 705, the transistor 707, and the transistor 708 may be n-channel transistors.

Specifically, polysilicon is used as the semiconductor 742. Selective addition of a dopant to the semiconductor 742 enables one part of the semiconductor 742 to be used as a conductor. Accordingly, as illustrated in FIG. 33, a region 744 can be formed by selective addition of a dopant to one part of the semiconductor 742. As the conductor 714, polysilicon to which a p-type dopant is added can be used. Alternatively, as in Embodiment 1, polysilicon to which an n-type dopant is added can be used as the conductor 714 in the case where the transistor 703, the transistor 705, the transistor 707, and the transistor 708 are n-channel transistors.

Furthermore, one string 792 shares the conductor 721 functioning as the wiring WBL and the conductor 726 functioning as the wiring WWL with another string 792. In the structure illustrated in FIG. 33, two strings 792 sharing the conductor 721 functioning as the wiring WBL and the conductor 726 functioning as the wiring WWL store the same data. Consequently, the redundancy of the stored data is improved, whereby the retention characteristics or reliability of the memory can be improved.

Application Example 2 of Semiconductor Device

An example of a semiconductor device including the memory cell array 790 of one embodiment of the present invention is described below with reference to FIG. 34.

Figure 34A:
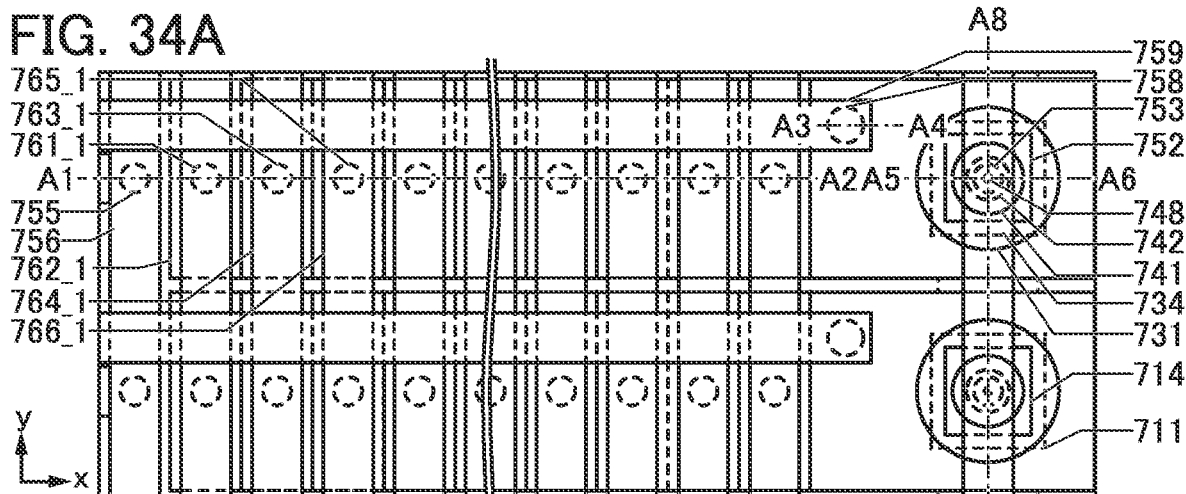
FIGS. 34A-34C A plan view and cross-sectional views illustrating a method for manufacturing a semiconductor device of one embodiment of the present invention.
Figure 34B:
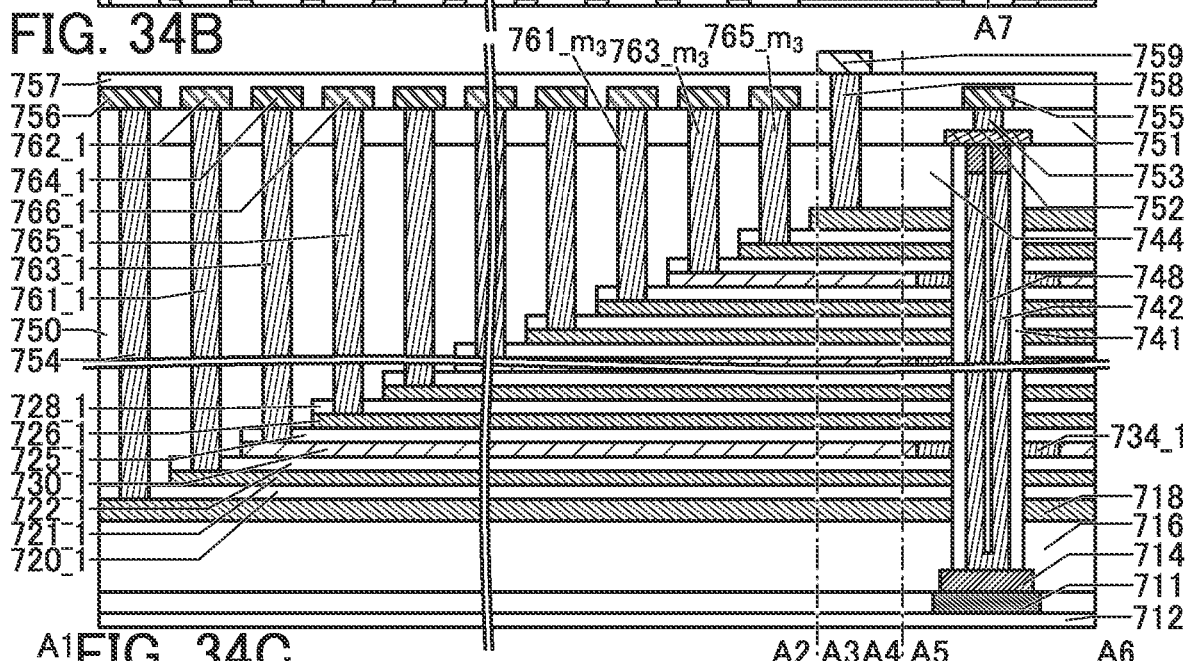
Figure 34C:
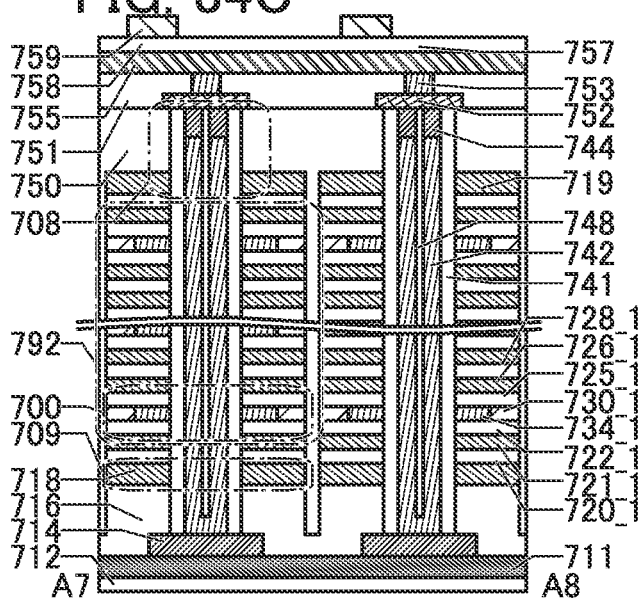

The semiconductor device illustrated in FIG. 34 includes the transistor 709 in addition to the semiconductor device illustrated in FIG. 33. That is, the transistor 708 and the transistor 709 each of which functions as a selection transistor are provided above and below the string 792. Therefore, while operation is performed by two strings 792 sharing the conductor 726 functioning as the wiring WWL in Application example 1 of semiconductor device, operation can be performed by one string 792 in this application example; thus, stored data can be highly integrated compared with that in the semiconductor device described in FIG. 33.

Application Example 3 of Semiconductor Device

An example of a semiconductor device including the memory cell array 790 of one embodiment of the present invention is described below with reference to FIG. 35.

Figure 35A:
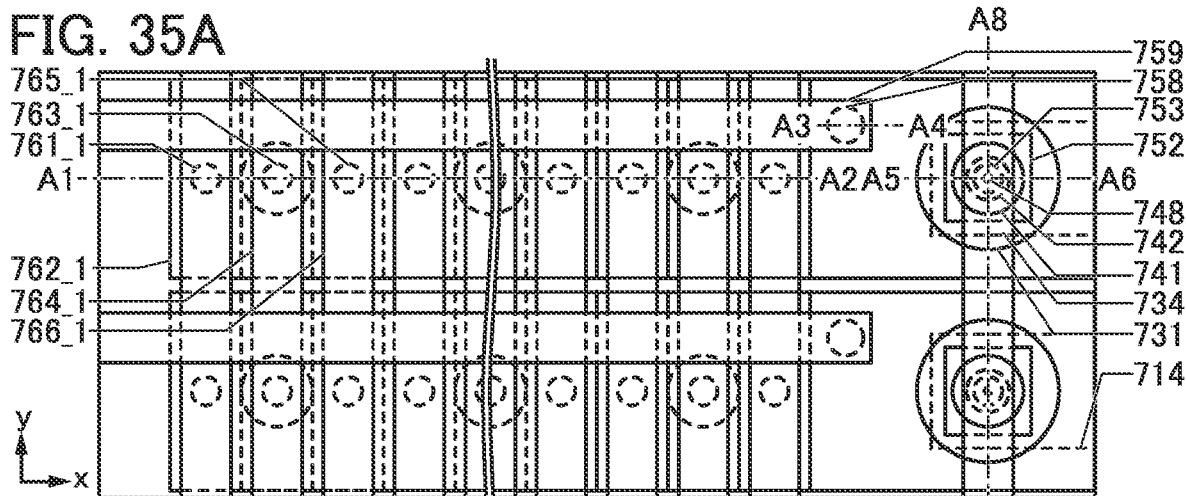
FIGS. 35A-35C A plan view and cross-sectional views illustrating a method for manufacturing a semiconductor device of one embodiment of the present invention.
Figure 35B:
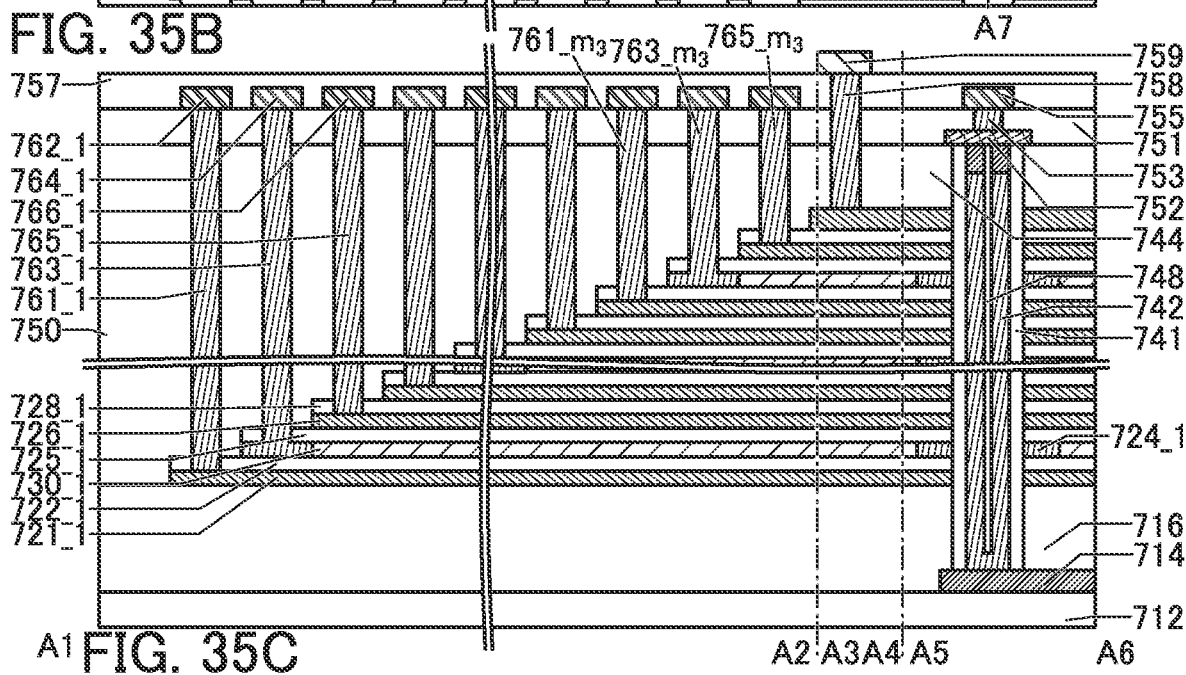
Figure 35C:
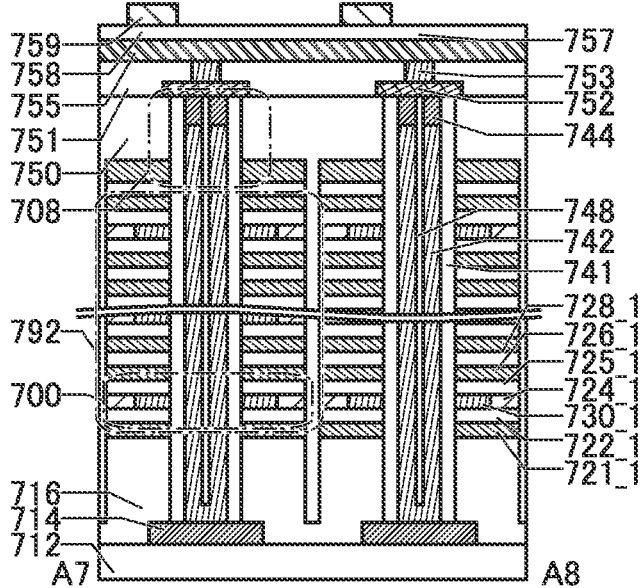

In the semiconductor device illustrated in FIG. 35, the conductor 763 is in contact with the side surface of the oxide 730 included in the transistor 701. Specifically, after a via is opened in a region indicated by the dashed-dotted line A1-A2, isotropic side etching is performed on the oxide 730 included in the transistor 701 and the conductor 763 is embedded. This structure can reduce the area of an offset region between the oxide 730 and the conductor 721 and the conductor 726 functioning as gates. Therefore, the drive capability of the transistor 701 is improved, so that rewriting speed of the memory can be improved.

Note that also in this structure, the transistor 709 may be provided as in the semiconductor device illustrated in FIG. 34.

Application Example 4 of Semiconductor Device

An example of a semiconductor device including the memory cell array 790 of one embodiment of the present invention is described below with reference to FIG. 36.

Figure 36A:
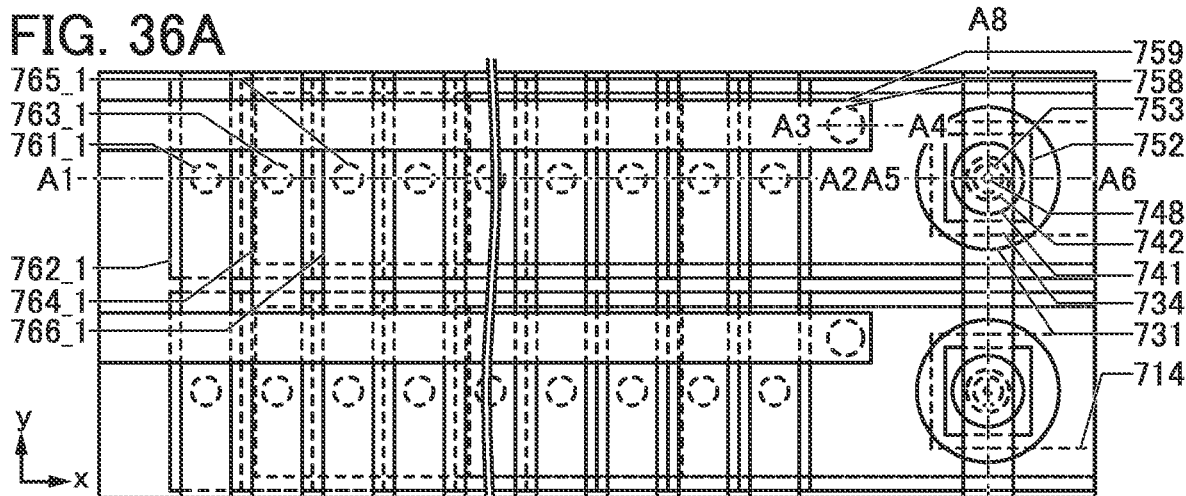
FIGS. 36A-36C A plan view and cross-sectional views illustrating a method for manufacturing a semiconductor device of one embodiment of the present invention.
Figure 36B:
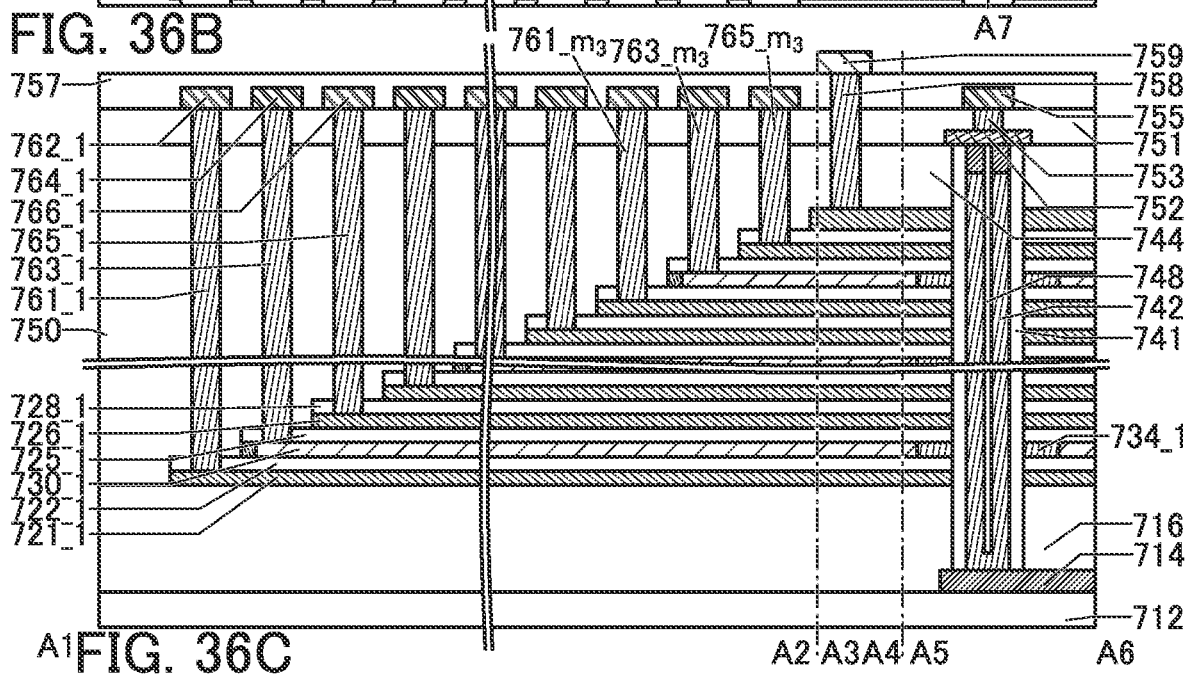
Figure 36C:
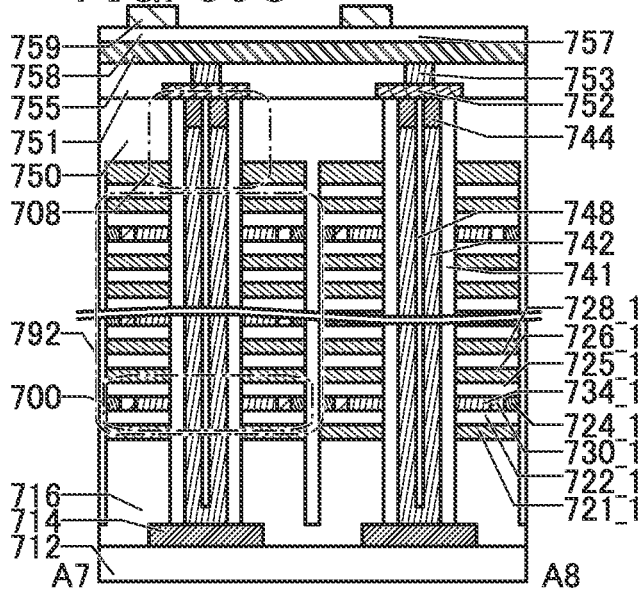

In the semiconductor device illustrated in FIG. 36, including the conductor 724 can contribute to improvement in the conductivity of the oxide 730 extending in the x-axis direction when a current is made flow through the oxide 730. Therefore, the drive capability of the transistor 701 is improved, so that rewriting speed of the memory can be improved.

The conductor 724 can be formed by separating the conductor 721, the insulator 722, the oxide 730, the insulator 725, and the conductor 726 in the string 792 in the y-axis direction, removing part of the oxide 730 by isotropic etching, and embedding a conductor. An unnecessary portion of the embedded conductor is removed by anisotropic or isotropic etching, whereby the conductor 724 can be formed.

Note that also in this structure, the transistor 709 may be provided as in the semiconductor device illustrated in FIG. 34. Furthermore, the conductor 763 of FIG. 35 and the conductor 724 of FIG. 36 may be provided in combination.

Application Example 5 of Semiconductor Device

An example of a semiconductor device including the memory cell array 790 of one embodiment of the present invention is described below with reference to FIG. 37. FIG. 37(D) illustrates a cross section of a portion indicated by the dashed-dotted line A5-A6 in FIG. 37(A) and a cross section of a portion beyond A6.

In the semiconductor device illustrated in FIG. 37, the conductor 763 is in contact with the side surface of the oxide 730 included in the transistor 701. Specifically, after a via is opened in a region indicated by the dashed-dotted line A1-A2, isotropic side etching is performed on the oxide 730 included in the transistor 701 and the conductor 763 is embedded. This structure can reduce the area of an offset region between the oxide 730 and the conductor 721 and the conductor 726 functioning as gates. Therefore, the drive capability of the transistor 701 is improved, so that rewriting speed of the memory can be improved.

With the conductor 724, a channel length between the conductor 763 functioning as one of the source electrode and the drain electrode of the transistor 701 and the conductor 734 functioning as the other of the source electrode and the drain electrode can be reduced. That is, when the distance between the conductor 763 and the conductor 734 is reduced, the length of the oxide 730 that functions as a channel and is surrounded by the conductor 721 and the conductor 726 functioning as gates can be reduced. Thus, the transistors 701 having different channel lengths between the strings 792 arranged in the x-axis direction can have the same channel length. Accordingly, the driving capability of the slowest transistor 701, which is considered to be a limiting factor in the memory operation, is improved in the memory operation, so that rewriting speed of the memory can be improved.

As illustrated in FIG. 37(D), the semiconductor device illustrated in FIG. 37 includes a region formed by separating the oxide 730 between the strings 792 adjacent in the x-axis direction and embedding the insulator 750. Accordingly, interference between the memory cells 700 of the adjacent strings 792 in the memory operation can be prevented. The separation of the oxide 730 between the adjacent strings 792 is also performed in the x-axis direction as in a manner similar to the separation of the conductor 721, the insulator 722, the oxide 730, the insulator 725, and the conductor 726 in the y-axis direction. Then, the oxide 730 is subjected to isotropic side etching, a conductor is embedded therein, and an unnecessary portion of the conductor is removed by etching, whereby the conductor 724 is formed. As a result, the oxide 730 between the memory cells 700 arranged in the x-axis direction is separated; however, the conductor 763 functioning as a source electrode or a drain electrode is connected to the oxide 730 of each of the memory cells 700 through the conductor 724.

Note that also in this structure, the transistor 709 may be provided as in the semiconductor device illustrated in FIG. 34.

Note that the structure of the semiconductor device in this embodiment is an example, and the present invention is not limited to the number, the position, and the like of the circuit element, the wiring, and the like illustrated in the drawings and the like according to this embodiment. The number, the position, and the like of the circuit element, the wiring, and the like included in the semiconductor device in this embodiment can be set as appropriate in accordance with the circuit configuration and the driving method. The structure described in an embodiment or an application example can be appropriately applied to, combined with, or replaced with any of the other structures in the embodiment or the application example, for example, and the resulting structure may be one embodiment of the present invention.

<<Operation Example of Memory Cell Array>>

Figure 38:
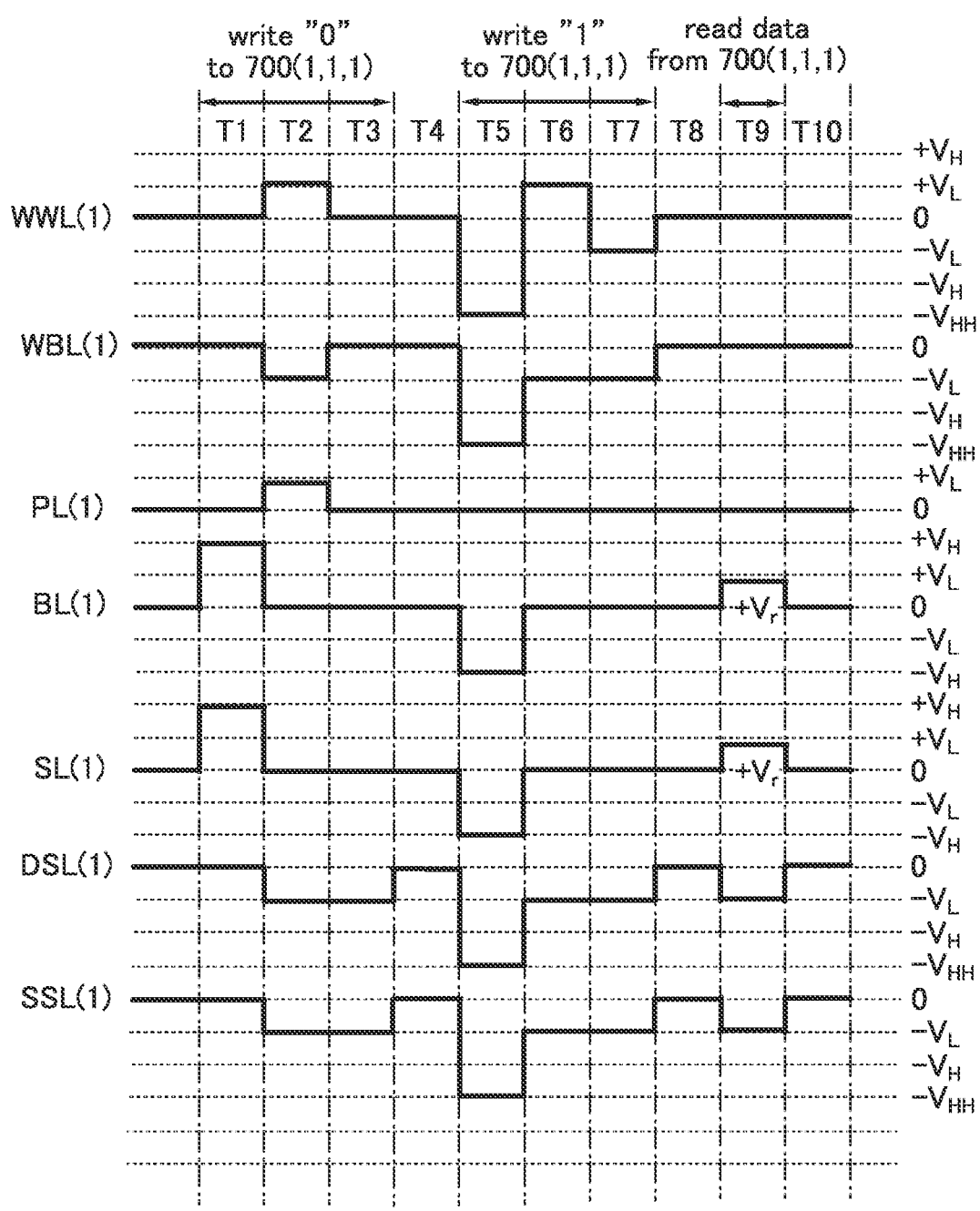
FIG. 38 A timing chart showing a method for driving a semiconductor device of one embodiment of the present invention.
Figure 39:
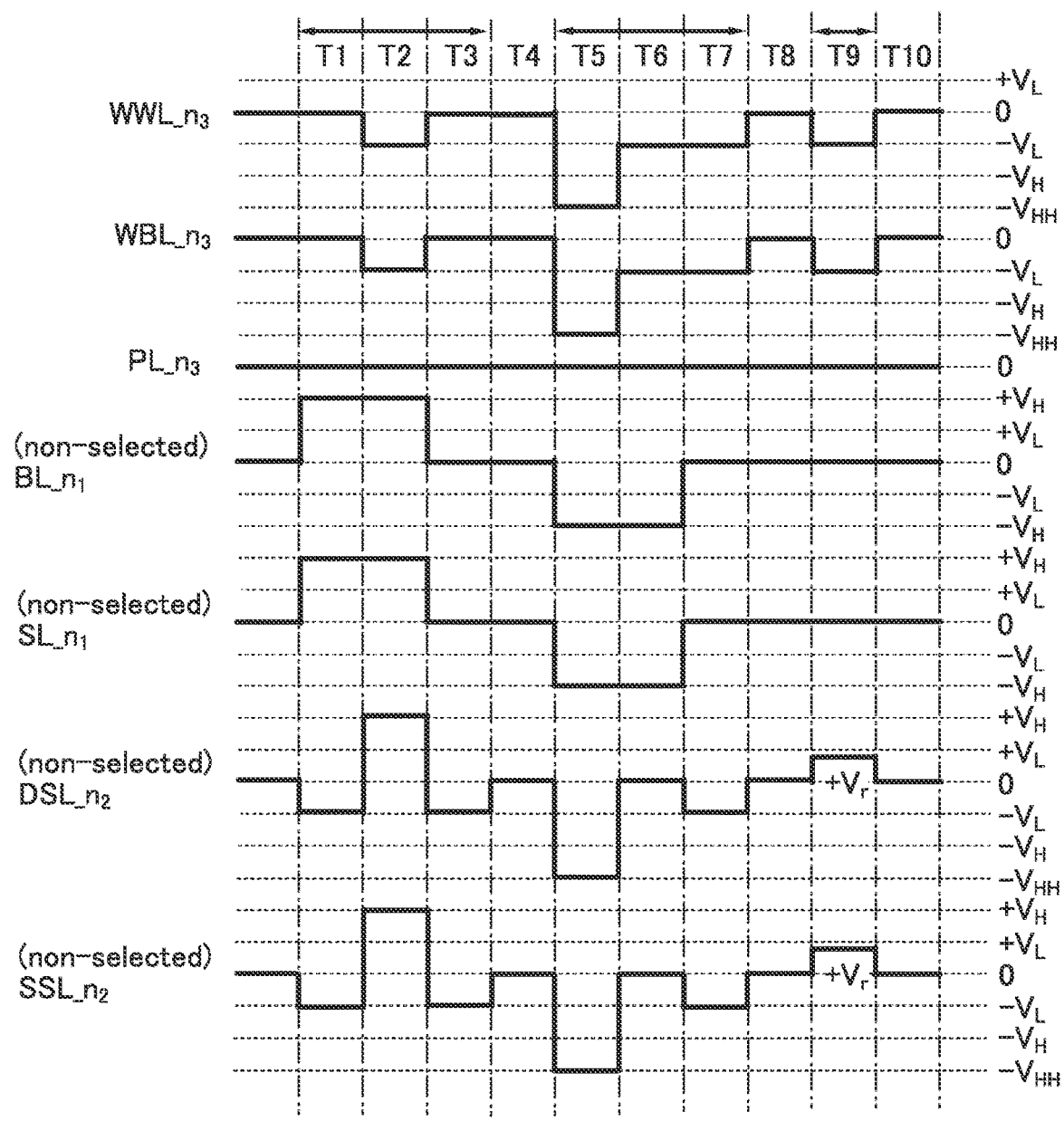
FIG. 39 A timing chart showing a method for driving a semiconductor device of one embodiment of the present invention.
Figure 40:
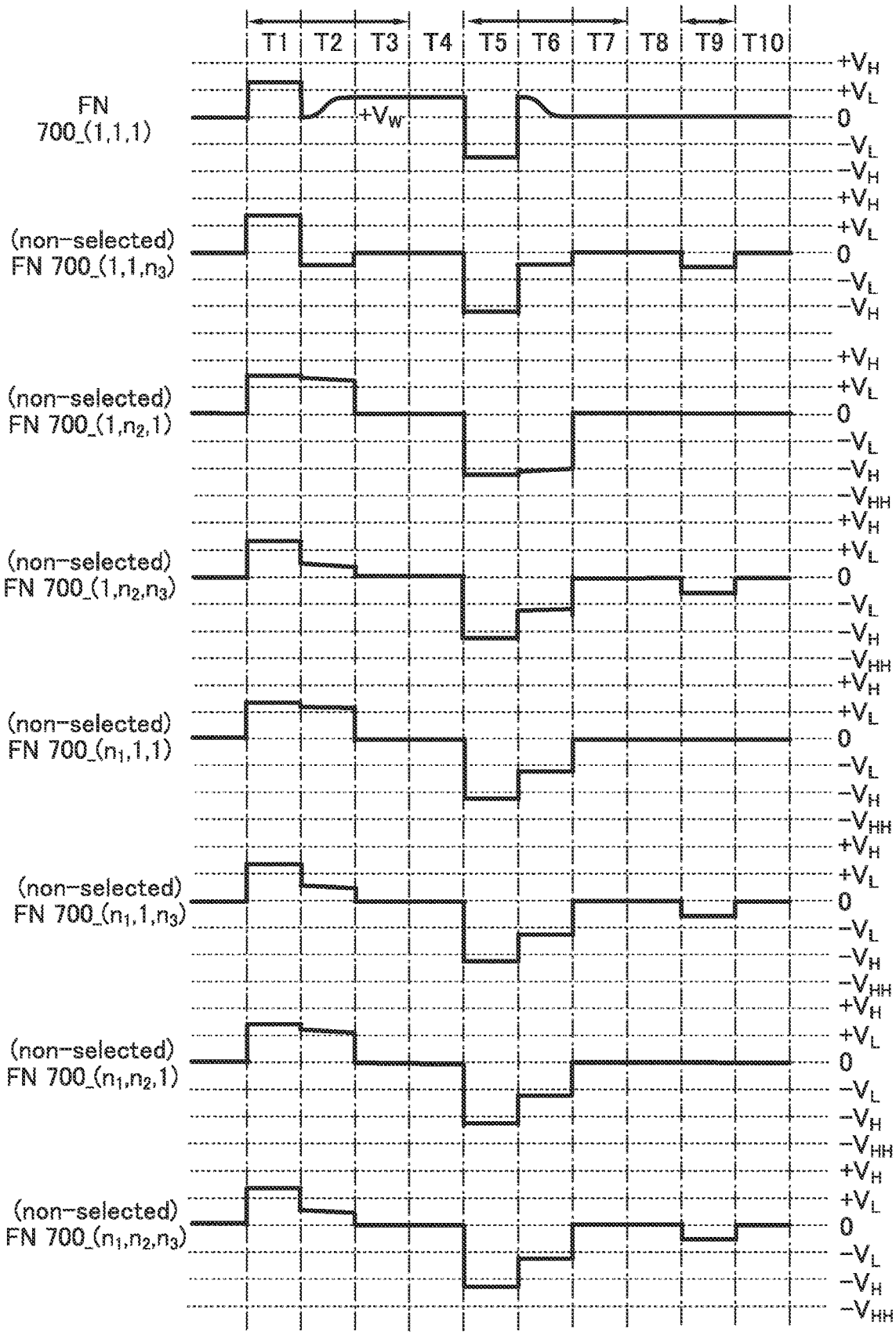
FIG. 40 A timing chart showing a method for driving a semiconductor device of one embodiment of the present invention.

FIG. 38 to FIG. 40 show examples of timing charts showing examples of data writing operation, data retention operation, and data reading operation on the memory cell 700 of the semiconductor device illustrated in FIG. 35. FIG. 38 and FIG. 39 show timing charts of potentials supplied to the respective wirings in operation of a selected memory cell 700 to which data is written (here, the memory cell 700(1,1,1) and the memory cell 700(1,1,$n_3$)) and a selected memory cell 700 from which data is read (here, the memory cell 700(1,1,1)). Here, an example in which p-channel transistors are provided as the transistor 703, the transistor 705, the transistor 707, the transistor 708, and the transistor 709 in the memory cell 700 is described.

Here, when the memory cell 700(1,1,1) is a 1-bit (2-level) memory cell that can retain a positive charge with a certain size (data "0") or a vacant state (data "1"), the node FN(1,1,1) has either a positive potential or 0 V when data is retained. That is, the gate electrode of the transistor 705(1,1) connected to the node FN(1,1,1) has either a positive potential or 0 V when data is retained.

FIG. 40 shows a timing chart of potentials supplied to the node FN(1,1,1) included in the memory cell 700(1,1,1) and the nodes FN of non-selected memory cells.

Note that in FIG. 38 to FIG. 40, a series of operations of writing of the data "1" defined in the above, retention of the data, and reading of the data is shown in a period T1 to a period T10.

Note that data that can be retained by the memory cell 700 is not limited to the two values defined in the above. By broadening the range of the potential supplied to the node FN and dividing potentials within the range, multilevel data having two or more values can be retained, for example. Consequently, the amount of data that can be stored in the memory cell 700 can be increased.

Respective operation examples of the memory cell 700 using a potential $V_R$, a potential $V_L$, a potential $V_H$, a potential $V_{HH}$, and a potential $V_w$, each of which has a certain level, are described in below as examples.

Note that the potential $V_R$ is a potential for reading, and the potential $V_w$ is a potential for writing. A multi-level memory is possible when the writing potential $+V_w$ corresponds to a gray level.

Note that a potential "$-V_L$", a potential "$-V_w$", a potential "$-V_H$", and a potential "$-V_{HH}$" are potentials lower than the threshold voltages of the transistor 701, the transistor 703, the transistor 705, and the transistor 707, and the potential "$+V_R$" is a potential lower than the potential $V_w$. The transistor 701 has normally-off characteristics. The transistor 703, the transistor 705, and the transistor 707 have normally-off characteristics or normally-on characteristics.

[Data Writing Operation]

First, an operation example of writing data to the memory cell 700(1,1,1) placed in the string 792(1,1) is described using the timing charts shown in FIG. 38 to FIG. 40. In FIG. 38 to FIG. 40, the period T1 to the period T3 are periods for writing the data "0" to the memory cell 700(1,1,1). The period T5 to the period T7 are periods for writing the data "1" to the memory cell 700(1,1,1).

Note that as shown in FIG. 40, the potential of 0 V is retained at each of the nodes FN just before the period T1, and the data "0" is stored in the memory cells 700.

First, to prevent false rewriting on the non-selected cell, precharge is performed on the transistor 703, the transistor 705, and the transistor 707 of the non-selected memory cell 700.

In the period T1, the potential $-V_L$ is supplied to a non-selected wiring SSL($n_2$) and a non-selected wiring DSL($n_2$) other than the wiring SSL(1) and the wiring DSL(1), whereby the transistor 703, the transistor 705, and the transistor 707 are turned on. Moreover, the potential $+V_H$ is supplied to the wiring BL(1) to the wiring BL($m_1$) and the wiring SL(1) to the wiring SL($m_1$), whereby precharge of the potential $+V_H$ is performed on the active layer of the transistor 703, the active layer of the transistor 705, and the active layer of transistor 707 of the non-selected memory cell 700.

At this time, the gate voltages of the transistor 703, the transistor 705, and the transistor 707 become relatively low potentials, and the transistor 703, the transistor 705, and the transistor 707 are turned on. That is, when the potential $+V_H$ is applied to the semiconductor 742 substantially uniformly, the potentials of the nodes FN of, for example, the memory cell 700($n_1$,1,1) including the non-selected node FN($n_1$,1,1), the memory cell 700($n_1$,$n_2$,1) including the non-selected node FN($n_1$,$n_2$,1), the memory cell 700($n_1$, 1,$n_3$) including the non-selected node FN($n_1$,1,$n_3$), and the memory cell 700($n_1$,$n_2$,$n_3$) including the non-selected node FN($n_1$,$n_2$,$n_3$) become high positive potentials by capacitive coupling. Thus, even when a relatively low positive potential is supplied as the gate voltage of the transistor 701 in each memory cell 700, the transistor 701 remains in an off state, so that false rewriting can be prevented. Alternatively, the off state is kept by preventing a potential difference between the source and the drain of the transistor 701 in each of the memory cells 700 from occurring, so that false rewriting on a non-selected cell can be prevented.

Next, the potentials of the non-selected wiring SSL($n_2$) and the non-selected wiring DSL($n_2$) other than the wiring SSL(1) and the wiring DSL(1) are set to $+V_H$ and the transistor 708 in the non-selected string 792 is turned off, whereby the semiconductor 742 in the non-selected string 792 is brought into a floating state. Thus, the potential $+V_H$ of the semiconductor 742 in the non-selected string 792 which has been subjected to precharge can be retained in the writing period.

Next, in the period T2, the data "0" is written to the selected memory cell 700(1,1,1). The potential $-V_L$ is supplied to the wiring SSL(1) and the wiring DSL(1), whereby the transistor 708 and the transistor 709 of the string 792 in which the selected memory cell 700 is included are turned on. A potential 0 is supplied to the wiring BL(1) and the wiring SL(1), the potential $+V_w$ is supplied to the wiring PL(1), the potential $+V_L$ is supplied to the wiring WWL(1), and the potential $-V_L$ is supplied to the wiring WBL(1), whereby the transistor 701 of the selected memory cell 700 is turned on.

When the transistor 701 is turned on, the potential of the node FN(1,1,1) increases; thus, a potential difference between the node FN(1,1,1) and the gate of the transistor 701 is decreased. When the potential of the node FN(1,1,1) increases to the potential $+V_w$ at which the transistor 701 is turned off, the potential $+V_w$ corresponding to the potential of the data "0" enters the node FN(1,1,1).

In order to turn on the transistor 703, the transistor 705, and the transistor 707 of the non-selected memory cell in the selected string 792, the potential $-V_L$ is supplied to the non-selected wiring WWL($n_3$) and the non-selected wiring WBL($n_3$) other than the wiring WWL(1) and the wiring WBL(1). Accordingly, the potentials of the wiring BL(1) and the wiring SL(1) are applied to the semiconductor 742 in the selected string 792. The transistor 701 of the non-selected memory cell 700 in the selected string 792 is turned off, so that false rewriting on the memory cell 700(1,1,$n_3$) including the node FN(1,1,$n_3$) can be prevented.

Note that in order to prevent false rewriting on the non-selected memory cells 700 sharing the wiring SSL(1), the wiring WWL(1), and the wiring WBL(1), the potential $+V_H$ is preferably supplied to the non-selected wiring BL($n_1$) and the non-selected wiring SL($n_1$). The potential $-V_L$ is supplied to the wiring SSL(1) of the non-selected memory cells 700 sharing the wiring SSL(1), whereby the transistor 708 of the string 792 is turned on. Thus, as in the above-described precharge operation, the potential $+V_H$ is supplied to the non-selected wiring BL($n_1$), the non-selected wiring SL($n_1$), and the like to increase the potential of the semiconductor 742 of the string 792 to $+V_H$, so that false rewriting on the memory cell 700(1,$n_2$,1) including a node FN(1,$n_2$,1) is prevented.

After data writing, the potentials of the wiring WWL(1) to the wiring WWL($m_3$), the wiring WBL(1) to the wiring WBL($m_3$), and the wiring PL(1) are set to 0.

Then, in the period T3, in order to return the potential precharged in the period T1 to the initial state, the potential $-V_L$ is supplied to the non-selected wiring SSL($n_2$) to turn on the transistor 708 of the string 792. Next, the potential 0 is supplied to the wiring BL(1) to the wiring BL($m_1$) and the wiring SL(1) to the wiring SL($m_1$) so that the potential of the semiconductor 742 has the potential 0.

Here, the precharged potential retention time depends on the off-state leakage current of the transistor 708 of the string 792. However, in the case where the retention time of the precharged potential is substantially equal to the writing time, the operation of returning the precharged potential to the initial state in the period T3 may be omitted.

A multi-level memory is possible when the writing potential $+V_w$ corresponds to a gray level. Alternatively, by applying a voltage corresponding to data to be written to the wiring WWL(1) to the wiring WWL($m_3$) and the wiring WBL(1) to the wiring WBL($m_3$), page writing may be performed per strings 792 sharing the wiring BL, the wiring SL, and the wiring SSL.

Alternatively, page writing may be performed per memory cells 700 which share the wiring SSL and the wiring WL (e.g., the wiring WWL($n_3$) and the wiring WBL($n_3$)) and to which the same data "0" or "1" is to be written.

The period T5 to the period T7 correspond to writing operation or erasing operation of the data "1" on the selected memory cell 700(1,1,1). The operation can use the method substantially the same as that in the period T1 to the period T3 for writing the data "0", and the data "1" can be written by setting the potential of PL(1) to 0 in the period T2.

In the period T5, the potential $-V_{HH}$ is supplied to the non-selected wiring SSL($n_2$), the non-selected wiring DSL($n_2$), the non-selected wiring WWL(1) to the non-selected wiring WWL($m_3$), and the non-selected wiring WBL(1) to the non-selected wiring WBL($m_3$) other than the wiring SSL(1) and the wiring DSL(1), whereby the transistor 703 is turned on. Moreover, the potential $-V_H$ is supplied to the wiring BL(1) to the wiring BL($m_1$) and the wiring SL(1) to the wiring SL($m_1$), whereby precharge of the potential $-V_H$ is performed on the active layer of the transistor 703, the active layer of the transistor 705, and the active layer of transistor 707 of the non-selected memory cell 700.

At this time, the gate voltages of the transistor 703, the transistor 705, and the transistor 707 become relatively low potentials, and the transistor 703, the transistor 705, and the transistor 707 are turned on. That is, when the potential $-V_H$ is applied to the semiconductor 742 substantially uniformly, the potentials of the nodes FN of, for example, the memory cell 700($n_1$,1,1) including the non-selected node FN($n_1$,1,1) and the memory cell 700($n_1$,$n_2$,1) including the non-selected node FN($n_1$,$n_2$,1), which share the wiring WWL(1) and the wiring WBL(1) of the selected memory cell, are decreased by capacitive coupling. Thus, when each memory cell 700 includes the node FN retaining a high potential of the data "0", the off state is kept by preventing a potential difference between the source and the drain of the transistor 701 in each of the memory cells 700 from occurring, so that false rewriting on a non-selected memory cells sharing the wiring WWL(1) of the selected memory cell can be prevented. Note that in the case where the non-selected memory cell 700 retains the potential 0 of the data "1", the same data "1" as that written to the selected memory cell may also be written to the non-selected cell, but the data returns to the same data state after the series of operations in the period T5 to the period T7.

Next, the potentials of the non-selected wiring SSL($n_2$) and the non-selected wiring DSL($n_2$) other than the wiring SSL(1) and the wiring DSL(1) are set to 0 and the transistor 708 in the non-selected string 792 is turned off, whereby the semiconductor 742 in the non-selected string 792 is brought into a floating state. Thus, the potential $-V_H$ of the semiconductor 742 in the non-selected string 792 which has been subjected to precharge can be retained in the writing period.

Next, in the period T6, the data "1" is written to the selected memory cell 700(1,1,1). The potential $-V_L$ is supplied to the wiring SSL(1) and the wiring DSL(1), whereby the transistor 708 and the transistor 709 of the string 792(1,1) in which the selected memory cell 700 is included are turned on. A potential 0 is supplied to the wiring BL(1) and the wiring SL(1), the potential 0 is supplied to the wiring PL(1), and the potential $+V_L$ is supplied to the wiring WWL(1), whereby the transistor 701 of the selected memory cell 700 is turned on. The potential $-V_L$ is supplied to the wiring WBL(1), and the transistor 703 in the selected memory cell 700 is turned on to fix the potential of the active layer of the adjacent transistor 705 to 0 so that erasing operation of writing the data "1" can be performed easily.

In order to turn on the transistors 703, the transistors 705, and the transistors 707 of the non-selected memory cell(1, 1,2) to the non-selected memory cell(1,1,$m_3$) in the selected string 792, the potential $-V_L$ is supplied to the non-selected wiring WWL($n_1$) and the non-selected wiring WBL($n_1$) other than the wiring WWL(1) and the wiring WBL(1). Accordingly, the potentials of the wiring BL(1) and the wiring SL(1) are applied to the semiconductor 742 in the selected string 792. The transistor 701 of the non-selected memory cell 700 in the selected string 792 is turned off, so that false rewriting on the memory cell 700(1,1,$n_3$) including the node FN(1,1,$n_3$) can be prevented.

Then, in the period T7, in order to return the potential precharged in the period T5 to the initial state, the potential $-V_L$ is supplied to the non-selected wiring SSL(1) to the non-selected wiring SSL($m_2$) and the non-selected wiring DSL(1) to the non-selected wiring DSL($m_2$) to turn on the transistor 708 and the transistor 709 of the string 792. Next, the potential 0 is supplied to the wiring BL(1) to the wiring BL($m_1$) and the wiring SL(1) to the wiring SL($m_1$) so that the potential of the semiconductor 742 has the potential 0.

Here, the precharged potential retention time depends on the off-state leakage current of the transistor 708 of the string 792. However, in the case where the retention time of the precharged potential is substantially equal to the writing time, the operation of returning the precharged potential to the initial state in the period T7 may be omitted.

After the data writing, the potentials of the wiring WWL (1) to the wiring WWL($m_3$), the wiring WBL(1) to the wiring WBL($m_3$), the wiring SSL(1) to the wiring SSL($m_2$), and the wiring DSL(1) to the wiring DSL($m_2$) are set to 0.

[Data Reading Operation]

The period T9 is an example of a period in which data reading operation is performed in the selected memory cell 700(1,1,1).

As shown in the examples of the timing charts of FIG. 38 to FIG. 40, at the time before the period T9, the data "1" is stored in a selected memory cell 700 (here, the memory cell 700(1,1,1)). In other words, in the memory cell 700(1,1,1), the potential of 0 V is supplied to the node FN(1,1,1).

First, the transistor 708 and the transistor 709 that correspond to the string 792(1,1) including a memory cell 700 to be selected are turned on. The potential $-V_R$ is supplied to the wiring SSL(1) and the wiring DSL(1), whereby the transistor 708 and the transistor 709 are turned on. In addition, the potential $+V_R$ is input to the wiring SL(1).

Next, the potential 0 is supplied to the wiring WWL(1) and the wiring WBL(1), whereby the data stored at the node FN(1,1,1) of the memory cell 700(1,1,1) is read.

When the potential $-V_R$ is supplied to the wiring WWL(2) to the wiring WWL($m_3$) and the wiring WBL(2) to the wiring WBL($m_3$) in reading, the potential of the node FN of the non-selected memory cell 700(1,1,2) to the non-selected memory cell 700(1,1,$m_3$) in the selected string 792(1,1) is decreased by capacitive coupling, so that the transistor 703, the transistor 705, and the transistor 707 of the non-selected memory cell 700 in the selected string 792(1,1) are turned on.

Note that since the selection transistor 708($n_1$,$n_2$) and the transistor 709($n_1$,$n_2$) in the non-selected string 792($n_1$,$n_2$) are turned off when the gate voltages are made relatively equal to or higher than the potential $+V_R$ input to the wiring SL(1), the potential $+V_R$ is supplied to the wiring SSL(2) to the wiring SSL($m_3$) and the wiring DSL(2) to the wiring DSL($m_3$).

As described above, in the selected string 792, the transistor 703, the transistor 705, and the transistor 707 of the non-selected memory cell 700(1,1,$n_3$) other than the transistor 703, the transistor 705, and the transistor 707 of the selected memory cell 700(1,1,1) are turned on. Thus, a potential corresponding to the state of data at the node FN(1,1,1) of the memory cell 700(1,1,1) is output to the wiring BL(1) depending on on or off and the driving capability of the transistor 703, the transistor 705, and the transistor 707 of the selected memory cell 700(1,1,1), whereby the data stored in the memory cell 700(1,1,1) can be read.

Through the series of operations described above (the period T9), the data stored in the memory cell 700(1,1,1) can be read.

Embodiment 4

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desk-top computers, but also to large computers such as server systems. Alternatively, the semiconductor device described in the above embodiment is applied to a variety of removable memory devices such as memory cards (e.g., SD cards), USB memories, and SSDs (solid state drives). FIG. 41 schematically illustrates some structure examples of removable memory devices. The semiconductor device described in the above embodiment is processed into a packaged memory chip and used in a variety of storage devices and removable memories, for example.

Figure 41A:
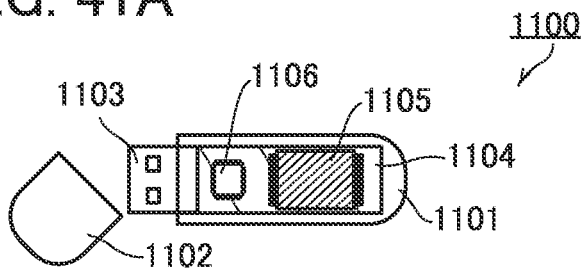
FIGS. 41A-41E Schematic views of a memory device of one embodiment of the present invention.

FIG. 41(A) is a schematic diagram of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like on the substrate 1104.

Figures 41B, 41C:
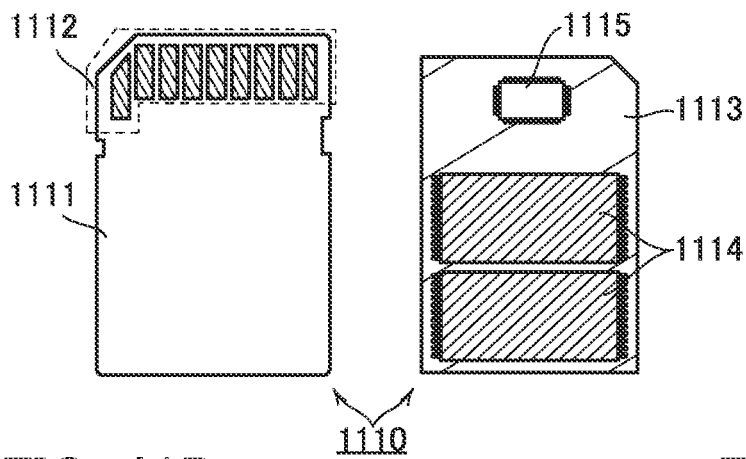

FIG. 41(B) is a schematic external diagram of an SD card, and FIG. 41(C) is a schematic diagram of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on a back side of the substrate 1113, the capacity of the SD card 1110 can be increased. In addition, a wireless chip with a radio communication function may be provided on the substrate 1113. With such a wireless chip, the memory chip 1114 can read and write data by radio communication between a host device and the SD card 1110. The semiconductor device described in the above embodiment can be incorporated in the memory chip 1114 or the like on the substrate 1113.

Figures 41D, 41E:
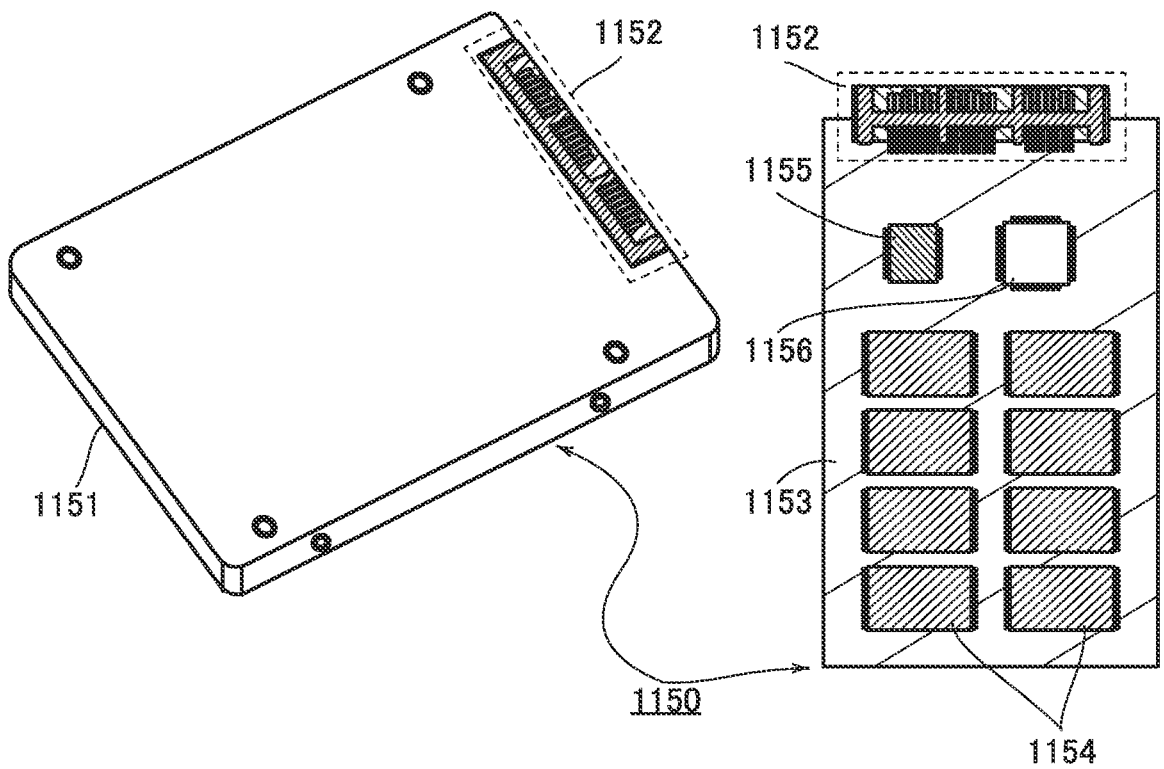

FIG. 41(D) is a schematic external diagram of an SSD, and FIG. 41(E) is a schematic diagram of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DRAM chip may be used, for example. When the memory chip 1154 is also provided on a back side of the substrate 1153, the capacity of the SSD 1150 can be increased.

The semiconductor device described in the above embodiment can be incorporated in the memory chip 1154 or the like on the substrate 1153.

Embodiment 5

In this embodiment, an AI system in which the semiconductor device described in the above embodiment is used is described with reference to FIG. 42.

Figure 42:
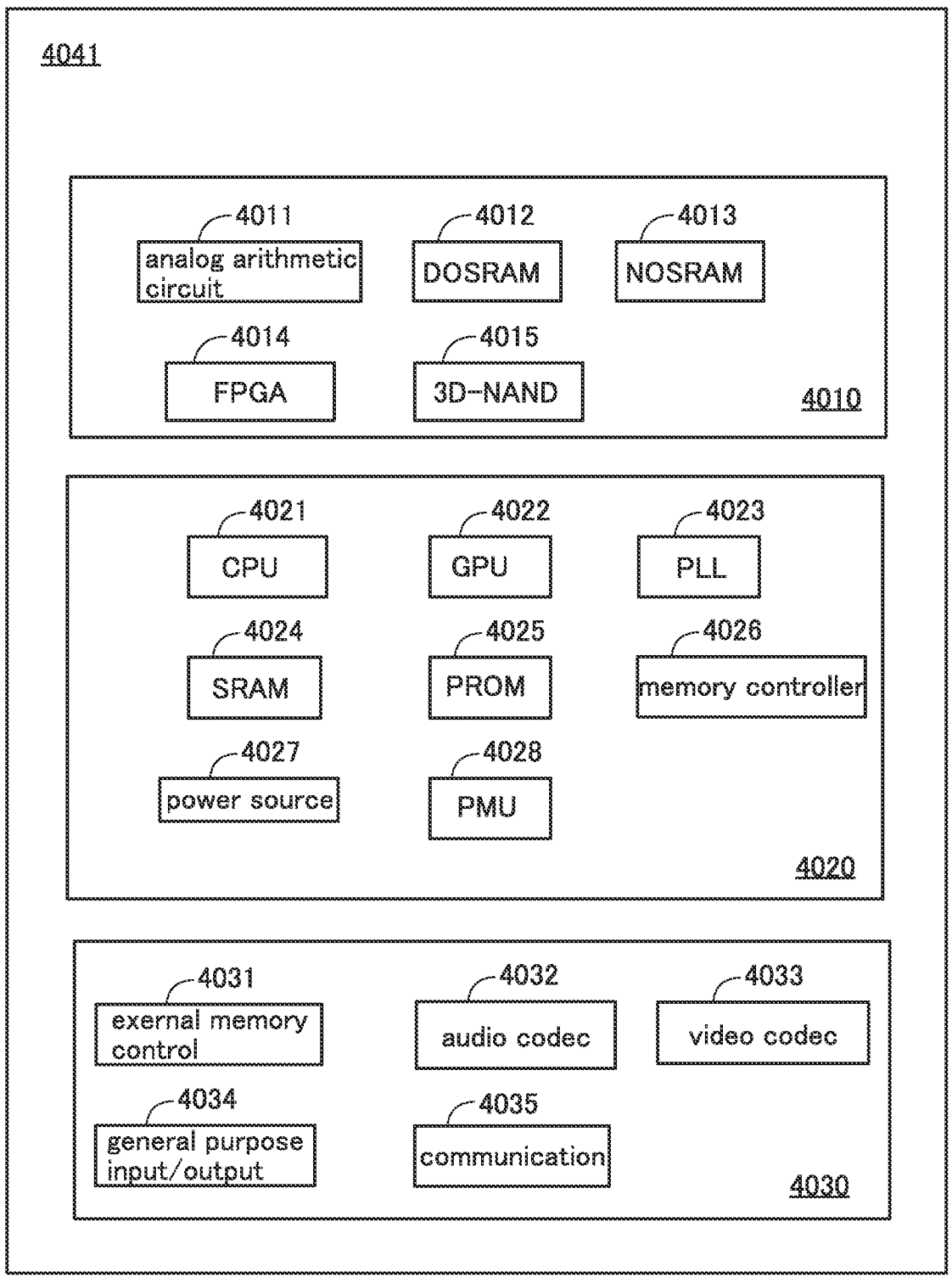
FIG. 42 A block diagram illustrating a structure example of an AI system of one embodiment of the present invention.

FIG. 42 is a block diagram illustrating a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, an FPGA 4014, and a 3D-NAND 4015. The semiconductor devices described in the above embodiment can be used as the DOSRAM 4012, the NOSRAM 4013, and the FPGA 4014.

The term DOSRAM (registered trademark) is an abbreviation of "Dynamic Oxide Semiconductor RAM", which indicates a RAM including 1T (transistor)-1C (capacitor) memory cell.

In addition, NOSRAM (registered trademark) is an abbreviation of "Nonvolatile Oxide Semiconductor RAM", which indicates a RAM including a gain cell (2T or 3T) memory cell. The DOSRAM and the NOSRAM are each a memory utilizing a low off-state current of an OS transistor.

The control portion 4020 includes a CPU (Central Processing Unit) 4021, a GPU (Graphics Processing Unit) 4022, a PLL (Phase Locked Loop) 4023, an SRAM (Static Random Access Memory) 4024, a PROM (Programmable Read Only Memory) 4025, a memory controller 4026, a power supply circuit 4027, and a PMU (Power Management Unit) 4028.

The input/output portion 4030 includes an external memory control circuit 4031, an audio codec 4032, a video codec 4033, a general-purpose input/output module 4034, and a communication module 4035.

The arithmetic portion 4010 can execute learning or inference by a neural network.

The analog arithmetic circuit 4011 includes an A/D (analog/digital) converter circuit, a D/A (digital/analog) converter circuit, and a product-sum operation circuit.

The analog arithmetic circuit 4011 is preferably formed using an OS transistor. The analog arithmetic circuit 4011 using an OS transistor includes an analog memory and can execute a product-sum operation necessary for the learning or inference with low power consumption.

The DOSRAM 4012 is a DRAM formed using an OS transistor, and the DOSRAM 4012 is a memory that temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DO SRAM 4012 can be small.

In the calculation with the neural network, the number of input data exceeds 1000 in some cases. In the case where the input data are stored in an SRAM, the input data have to be stored piece by piece because of the circuit area limitation and small storage capacity of the SRAM. The DOSRAM 4012 has a larger storage capacity than an SRAM because the memory cells can be highly integrated even in a limited circuit area. Therefore, the DOSRAM 4012 can efficiently store the input data.

The NOSRAM 4013 is a nonvolatile memory using an OS transistor. The NOSRAM 4013 consumes less power in data writing than the other nonvolatile memories such as a flash memory, a ReRAM (Resistive Random Access Memory), and an MRAM (Magnetoresistive Random Access Memory). Moreover, unlike a flash memory and a ReRAM, elements do not deteriorate when data is written, and there is no limitation on the number of times of data writing.

Furthermore, the NOSRAM 4013 can store multilevel data of 2 bits or more as well as 1-bit binary data. The multilevel data storage in the NOSRAM 4013 leads to a reduction in the memory cell area per bit.

Furthermore, the NOSRAM 4013 can store analog data as well as digital data. Thus, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of 3 bits (8 levels) or more. The above-described multilevel data is included in the analog data in some cases.

Data and parameters used in the neural network calculation can be once stored in the NOSRAM 4013. The data and parameters may be stored in a memory provided outside the AI system 4041 via the CPU 4021; however, the NOSRAM 4013 provided inside the AI system 4041 can store the data and parameters more quickly with lower power consumption. Furthermore, the NOSRAM 4013 enables a longer bit line than the DOSRAM 4012 and thus can have an increased storage capacity.

The FPGA 4014 is an FPGA using an OS transistor. With the use of the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), or a deep belief network (DBN) described later, with a hardware. Establishing the connection of the neural network with a hardware enables higher speed performance.

The FPGA 4014 is an FPGA including an OS transistor. An OS-FPGA can have a smaller memory area than an FPGA including an SRAM. Thus, addition of a context switching function only causes a small increase in area. Moreover, an OS-FPGA can transmit data and parameters at high speed by boosting.

The 3D-NAND 4015 is a nonvolatile memory including an OS transistor. The 3D-NAND 4015 is a highly integrated memory in which the storage capacity per unit area is large.

Furthermore, the 3D-NAND 4015 can store multilevel data of 2 bits or more as well as 1-bit binary data. The multilevel data storage in the 3D-NAND 4015 leads to a further reduction in the memory cell area per bit.

As the 3D-NAND 4015, for example, the semiconductor device in the above embodiment can be used. Accordingly, the occupation area in the memory cell can be reduced, so that the semiconductor device including the memory circuit of this embodiment can be more highly integrated. As a result, the storage capacity per unit area of the memory device of this embodiment can be increased.

In the AI system 4041, the analog arithmetic circuit 4011, the DOSRAM 4012, the NOSRAM 4013, and the FPGA 4014 can be provided on one die (chip). Thus, the AI system 4041 can execute calculation of the neural network quickly with low power consumption. In addition, the analog arithmetic circuit 4011, the DOSRAM 4012, the NOSRAM 4013, and the FPGA 4014 can be fabricated through the same manufacturing process. Therefore, the AI system 4041 can be fabricated at low cost.

Note that the arithmetic portion 4010 does not necessarily include all of the DOSRAM 4012, the NOSRAM 4013, and the FPGA 4014. One or more memories selected from the DOSRAM 4012, the NOSRAM 4013, and the FPGA 4014 are provided in accordance with a problem that is desired to be solved by the AI system 4041.

The AI system 4041 can execute a method such as a deep neural network (DNN), a convolutional neural network (CNN), a recurrent neural network (RNN), an autoencoder, a deep Boltzmann machine (DBM), or a deep belief network (DBN) in accordance with the problem that is desired to be solved. The PROM 4025 can store a program for executing arithmetic operation of at least one of these methods. Furthermore, part or the whole of the program may be stored in the NOSRAM 4013.

Most of the existing programs that exist as libraries are premised on processing with a GPU. Therefore, the AI system 4041 preferably includes the GPU 4022. The AI system 4041 can execute the bottleneck product-sum operation among all the product-sum operations used for learning and inference in the arithmetic portion 4010, and execute the other product-sum operations in the GPU 4022. In this manner, the learning and inference can be executed at high speed.

The power supply circuit 4027 generates not only a low power supply potential for a logic circuit but also a potential for an analog operation. The power supply circuit 4027 may use an OS memory. When a reference potential is stored in the OS memory, the power consumption of the power supply circuit 4027 can be reduced.

The PMU 4028 has a function of temporarily stopping the power supply to the AI system 4041.

The CPU 4021 and the GPU 4022 preferably include OS memories as registers. By including the OS memories, the CPU 4021 and the GPU 4022 can retain data (logic values) in the OS memories even when power supply is stopped. As a result, the AI system 4041 can save the power.

The PLL 4023 has a function of generating a clock. The AI system 4041 performs an operation on the basis of the clock generated by the PLL 4023. The PLL 4023 preferably includes an OS memory. By including the OS memory, the PLL 4023 can retain an analog potential with which the clock oscillation cycle is controlled.

The AI system 4041 may store data in an external memory such as a DRAM. For this reason, the AI system 4041 preferably includes the memory controller 4026 functioning as an interface with the external DRAM. Furthermore, the memory controller 4026 is preferably positioned near the CPU 4021 or the GPU 4022. Thus, data transmission can be performed at high speed.

Some or all of the circuits illustrated in the control portion 4020 can be formed on the same die as the arithmetic portion 4010. Thus, the AI system 4041 can execute the neural network calculation at high speed with low power consumption.

Data used for the neural network calculation is stored in an external memory device (such as an HDD (Hard Disk Drive) or an SSD (Solid State Drive)) in many cases. Therefore, the AI system 4041 preferably includes the external memory control circuit 4031 functioning as an interface with the external memory device.

Because the neural network often deals with audio and video for learning and inference, the AI system 4041 includes the audio codec 4032 and the video codec 4033. The audio codec 4032 encodes and decodes audio data, and the video codec 4033 encodes and decodes video data.

The AI system 4041 can perform learning or inference using data obtained from an external sensor. For this reason, the AI system 4041 includes the general-purpose input/output module 4034. The general-purpose input/output module 4034 includes a USB (Universal Serial Bus) or an I2C (Inter-Integrated Circuit), for example.

The AI system 4041 can perform learning or inference using data obtained via the Internet. For this reason, the AI system 4041 preferably includes the communication module 4035.

The analog arithmetic circuit 4011 may use a multi-level flash memory as an analog memory. However, the flash memory has a limitation on the number of rewriting times. In addition, it is extremely difficult to embed the multi-level flash memory (to form the arithmetic circuit and the memory on the same die).

Alternatively, the analog arithmetic circuit 4011 may use a ReRAM as an analog memory. However, the ReRAM has a limitation on the number of rewriting times and also has a problem in storage accuracy. Moreover, the ReRAM is a two-terminal element, and thus has a complicated circuit design for separating data writing and data reading.

Further alternatively, the analog arithmetic circuit 4011 may use an MRAM as an analog memory. However, the MRAM has a problem in storage accuracy because of its low magnetoresistive ratio.

In consideration of the above, the analog arithmetic circuit 4011 preferably uses an OS memory as an analog memory.

The structure described in this embodiment can be used in appropriate combination with the structure described in the other embodiments.

Embodiment 6

Application Example of AI System

In this embodiment, application examples of the AI system described in the above embodiment are described with reference to FIG. 43.

Figure 43A:
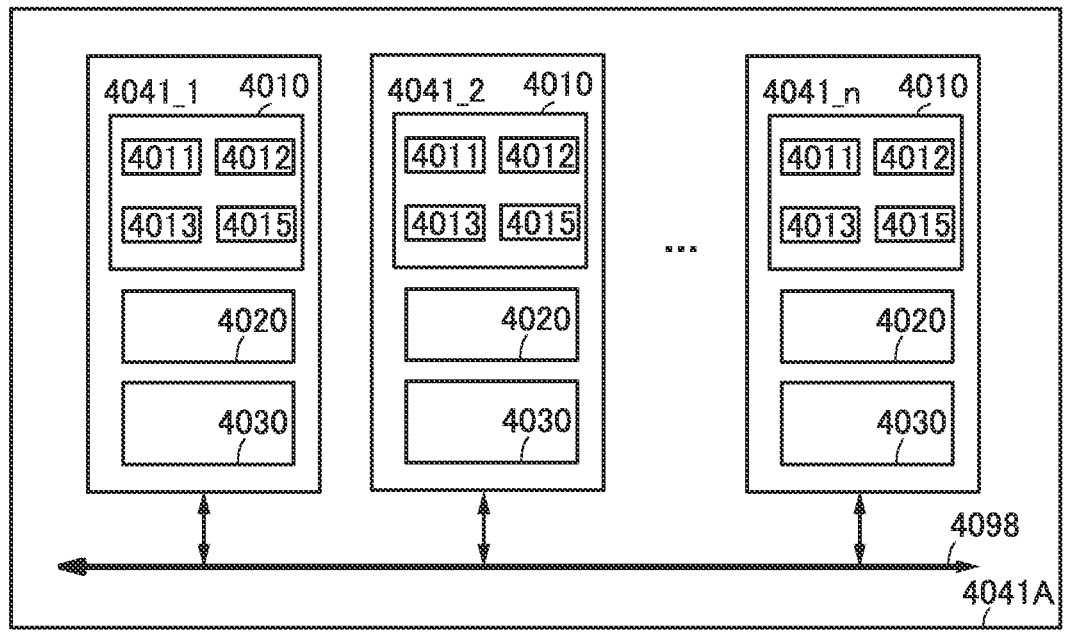
FIGS. 43A-43B Block diagrams each illustrating an application example of an AI system of one embodiment of the present invention.

FIG. 43(A) is an AI system 4041A in which the AI systems 4041 described with FIG. 42 are arranged in parallel and a signal can be transmitted between the systems via a bus line.

The AI system 4041A illustrated in FIG. 43(A) includes a plurality of AI systems 4041_1 to 4041_n (n is a natural number). The AI system 4041_1 to the AI system 4041_n are connected to each other via a bus line 4098.

Figure 43B:
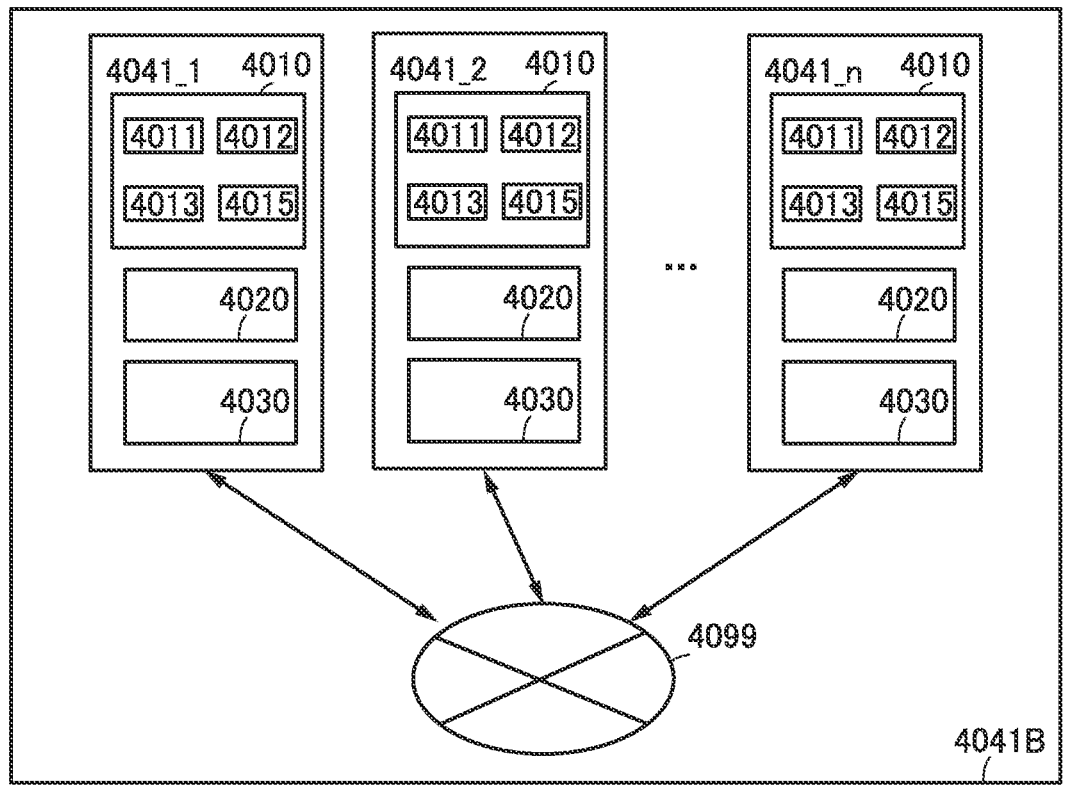

FIG. 43(B) is an AI system 4041B in which the AI systems 4041 described with FIG. 42 are arranged in parallel as in FIG. 43(A) and a signal can be transmitted between the systems via a network.

The AI system 4041B illustrated in FIG. 43(B) includes the plurality of AI systems 4041_1 to 4041_n. The AI system 4041_1 to the AI system 4041_n are connected to each other via a network 4099.

A structure may be employed in which a communication module is provided in each of the AI system 4041_1 to the AI system 4041_n to perform wireless or wired communication via the network 4099. A communication module can perform communication via an antenna. For example, the communication can be performed in such a manner that an electronic device is connected to a computer network such as the Internet that is an infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case of performing wireless communication, it is possible to use, as a communication protocol or a communication technology, a communications standard such as LTE (Long Term Evolution), GSM (Global System for Mobile Communication: registered trademark), EDGE (Enhanced Data Rates for GSM Evolution), CDMA 2000 (Code Division Multiple Access 2000), or W-CDMA (registered trademark), or a communications standard developed by IEEE such as Wi-Fi (registered trademark), Bluetooth (registered trademark), or ZigBee (registered trademark).

With the structure in FIG. 43(A) or 43(B), analog signals obtained with external sensors or the like can be processed by different AI systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. When the signal processing or learning is performed by different AI systems, the amount of information processed by each AI system can be reduced. Accordingly, the signal processing or learning can be performed with a smaller amount of arithmetic processing. As a result, recognition accuracy can be increased. The information obtained with each AI system is expected to enable instant understanding of collective biological information that irregularly changes.

The structure described in this embodiment can be used in appropriate combination with the structure described in the other embodiments.

Embodiment 7

In this embodiment, an example of an IC into which the AI system described in the above embodiment is incorporated is described.

In the AI system described in the above embodiment, a digital processing circuit such as a CPU that includes a Si transistor, an analog arithmetic circuit that uses an OS transistor, an OS-FPGA, and an OS memory such as a DOSRAM or a NOSRAM can be integrated into one die.

Figure 44:
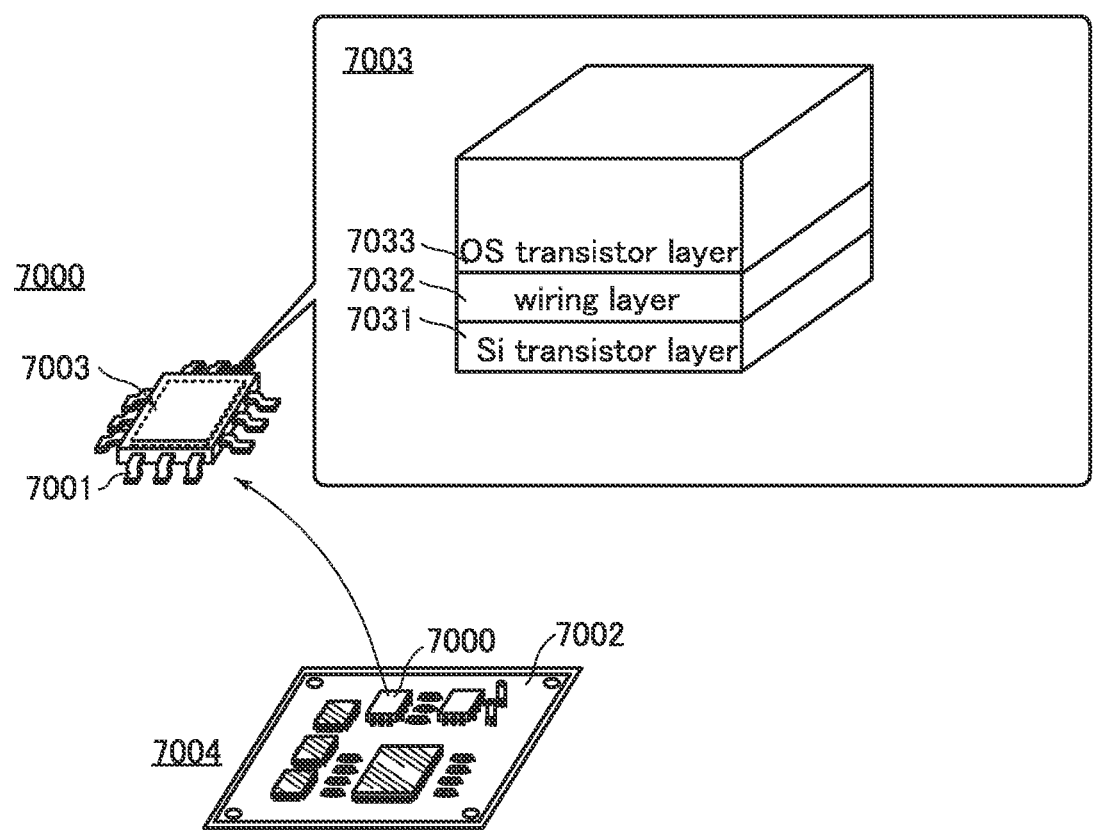
FIG. 44 A schematic perspective view illustrating a structure example of an IC incorporating an AI system of one embodiment of the present invention.

FIG. 44 illustrates the example of the IC into which the AI system is incorporated. An AI system IC 7000 illustrated in FIG. 44 includes a lead 7001 and a circuit portion 7003. The AI system IC 7000 is mounted on a printed circuit board 7002, for example. A plurality of such IC chips are combined and electrically connected to each other on the printed circuit board 7002; thus, a board on which electronic components are mounted (a circuit board 7004) is completed. In the circuit portion 7003, the various circuits described in the above embodiment are provided on one die. The circuit portion 7003 has a stacked-layer structure as described in the above embodiment, and is broadly divided into a Si transistor layer 7031, a wiring layer 7032, and an OS transistor layer 7033. Since the OS transistor layer 7033 can be provided to be stacked over the Si transistor layer 7031, the size of the AI system IC 7000 can be easily reduced.

Although a QFP (Quad Flat Package) is used as a package of the AI system IC 7000 in FIG. 44, the embodiment of the package is not limited thereto.

The digital processing circuit such as a CPU, the analog arithmetic circuit that uses an OS transistor, the OS-FPGA, and the OS memory such as a DOSRAM or a NOSRAM can all be formed in the Si transistor layer 7031, the wiring layer 7032, and the OS transistor layer 7033. In other words, elements included in the AI system can be formed through the same manufacturing process. Thus, the number of steps in the manufacturing process of the IC described in this embodiment does not need to be increased even when the number of elements is increased, and accordingly the AI system can be incorporated into the IC at low cost.

The structure described in this embodiment can be used in appropriate combination with the structure described in the other embodiments.

Embodiment 8

<Electronic Device>

A semiconductor device of one embodiment of the present invention can be used for a variety of electronic devices. FIG. 45 to FIG. 47 illustrate specific examples of the electronic devices using the semiconductor device of one embodiment of the present invention.

Figure 45A:
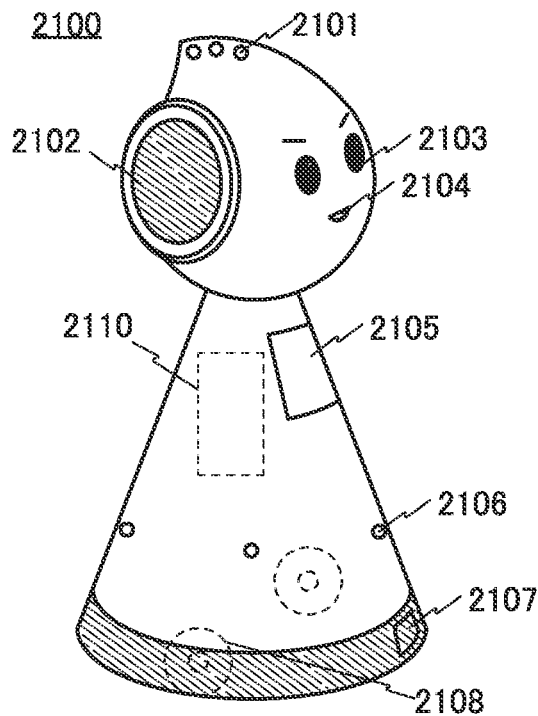
FIGS. 45A-45D Diagrams illustrating electronic devices of one embodiment of the present invention.

A robot 2100 illustrated in FIG. 45(A) includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user by using the microphone 2102 and the speaker 2104.

The display 2105 has a function of displaying various kinds of information. The robot 2100 can display information desired by a user on the display 2105. The display 2105 may be provided with a touch panel.

The upper camera 2103 and the lower camera 2106 have a function of capturing an image of the surroundings of the robot 2100. The obstacle sensor 2107 can detect an obstacle in the direction where the robot 2100 advances with the moving mechanism 2108. The robot 2100 can move safely by recognizing an ambient environment with the upper camera 2103, the lower camera 2106, and the obstacle sensor 2107.

Figure 45B:
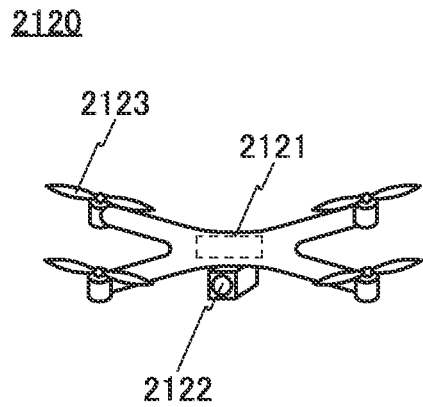

A flying object 2120 illustrated in FIG. 45(B) includes an arithmetic device 2121, a propeller 2123, and a camera 2122 and has a function of flying autonomously.

The above electronic component can be used for the arithmetic device 2121 and the camera 2122 of the flying object 2120.

Figure 45C:
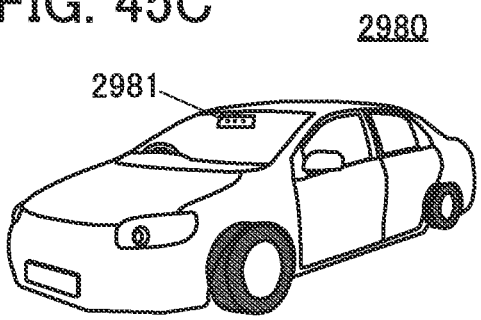

FIG. 45(C) is an external view illustrating an example of an automobile. An automobile 2980 includes a camera 2981 and the like. The automobile 2980 also includes various sensors and the like such as an infrared radar, a millimeter wave radar, and a laser radar. The automobile 2980 judges traffic information therearound such as the presence of a pedestrian with analyzing an image taken by the camera 2981, and thus can perform automatic driving.

Figure 45D:
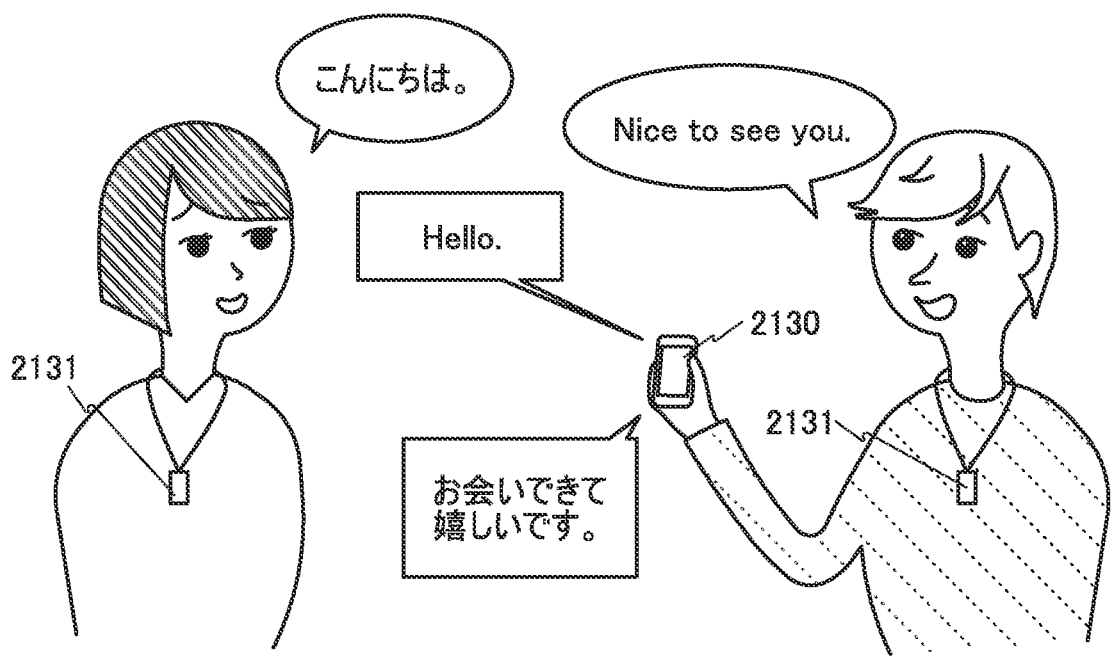

FIG. 45(D) illustrates a situation where a portable electronic device 2130 performs simultaneous interpretation in communication between people who speak different languages.

The portable electronic device 2130 includes a microphone, a speaker, and the like and has a function of recognizing a user's speaking voice and translating it into a language spoken by a collocutor.

The user has a portable microphone 2131 in FIG. 45(D). The portable microphone 2131 has a radio communication function and a function of transmitting a detected sound to the portable electronic device 2130.

Figure 46A:
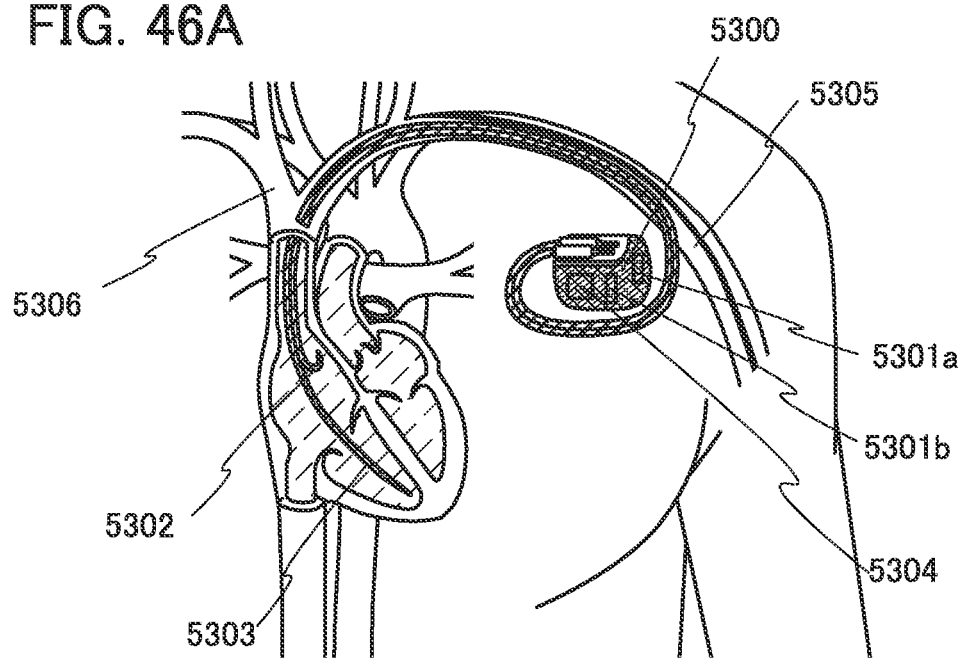
FIGS. 46A-46B Diagrams illustrating electronic devices of one embodiment of the present invention.
Figure 47:
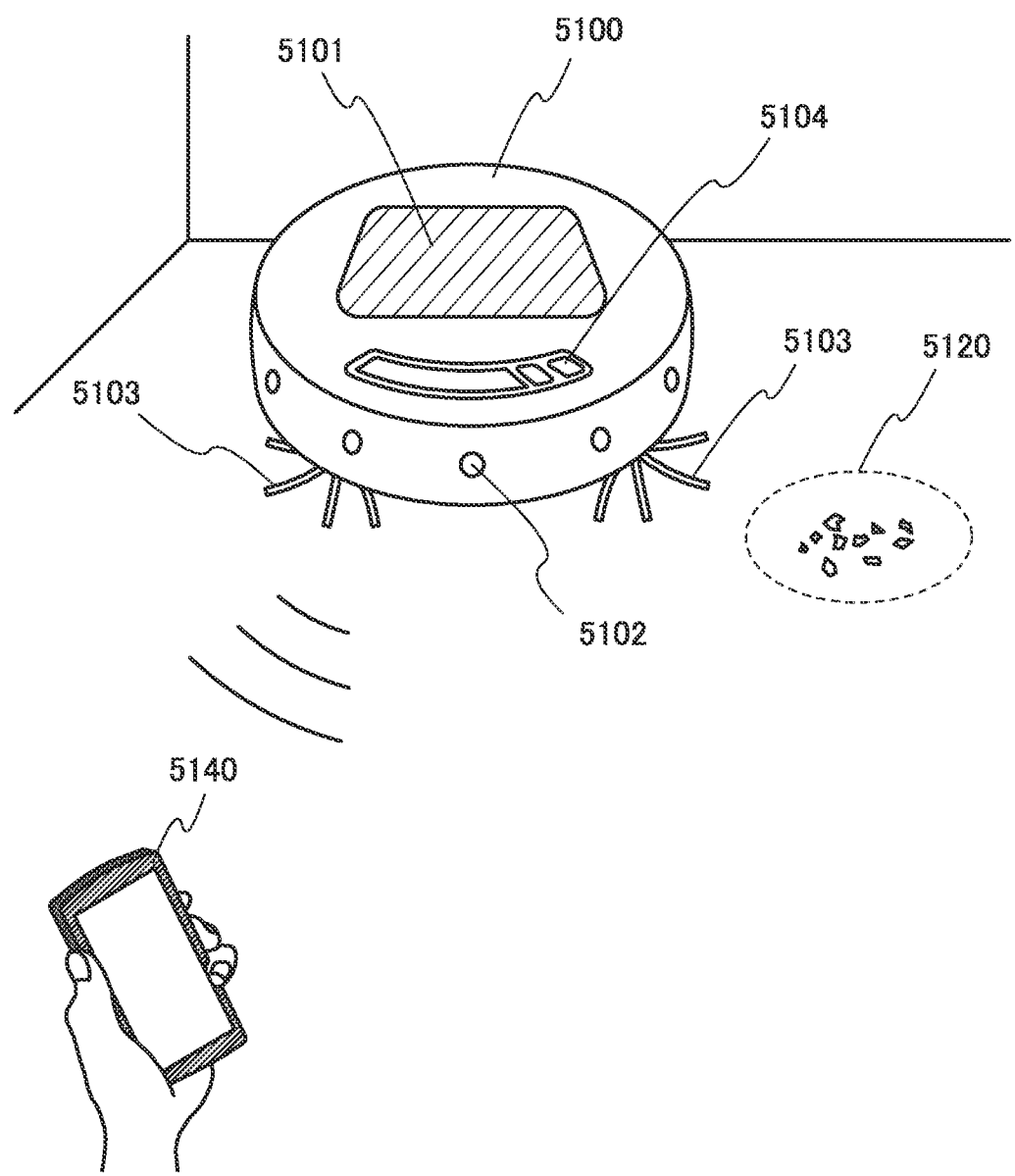
FIG. 47 A diagram illustrating an electronic device of one embodiment of the present invention.

FIG. 46(A) is a cross-sectional schematic view illustrating an example of a pacemaker.

A pacemaker body 5300 includes at least batteries 5301a and 5301b, a regulator, a control circuit, an antenna 5304, a wire 5302 reaching a right atrium, and a wire 5303 reaching a right ventricle.

The pacemaker body 5300 is implanted in a body by surgery, and the two wires pass through a subclavian vein 5305 and a superior vena cava 5306 of a human body, with the end of one of them placed in the right ventricle and the end of the other of them placed in the right atrium.

The antenna 5304 can receive electric power, and the plurality of batteries 5301a and 5301b are charged with the electric power, which can reduce the frequency of replacing the pacemaker. Since the pacemaker body 5300 has a plurality of batteries, the safety is high, and even when one of the batteries fails, the other can function. In this manner, the plurality of batteries function as auxiliary power supplies.

In addition to the antenna 5304 that can receive electric power, an antenna that can transmit a physiological signal may be provided. For example, a system that monitors the cardiac activity, and is capable of monitoring physiological signals such as pulses, a respiratory rate, a heart rate, and body temperature with an external monitoring device may be constructed.

Figure 46B:
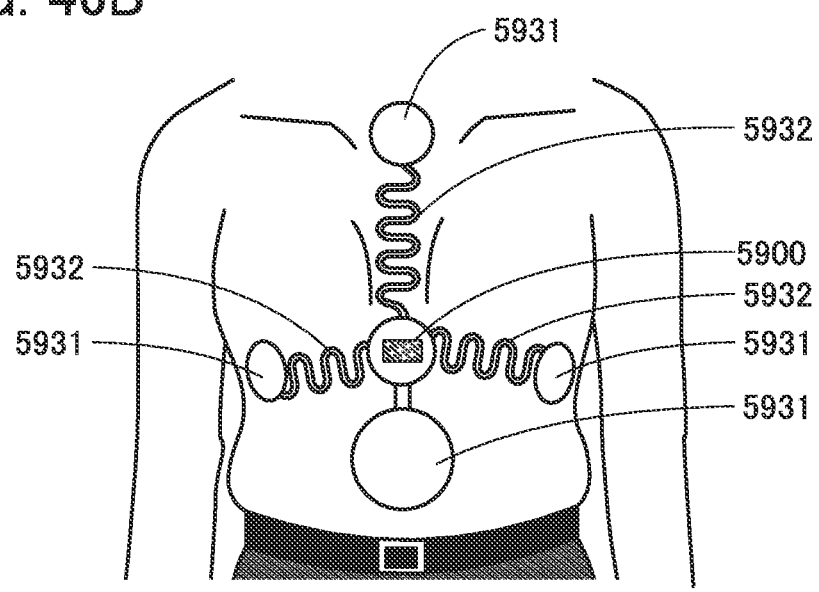

A sensor 5900 illustrated in FIG. 46(B) is attached to a human body with the use of a bond pad or the like. The sensor 5900 obtains biological data or the like such as a heart rate or an electrocardiogram by supplying a signal through a wiring 5932 to an electrode 5931 or the like attached to the human body. The obtained data is transmitted to a terminal such as a reading device as a wireless signal.

FIG. 47 is a schematic view illustrating an example of a cleaning robot.

A cleaning robot 5100 includes a display 5101 on its top surface, a plurality of cameras 5102 on its side surface, a brush 5103, and an operation button 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a radio communication means.

The cleaning robot 5100 can run autonomously, detect dust 5120, and vacuum the dust through the inlet provided on the bottom surface.

The cleaning robot 5100 can judge whether or not there is an obstacle such as a wall, furniture, or a step by analyzing an image taken by the cameras 5102. In the case where an object that is likely to be caught in the brush 5103 such as a wiring is detected by image analysis, the rotation of the brush 5103 can be stopped.

The display 5101 can display the remaining capacity of a battery, the amount of vacuumed dust, and the like. The display 5101 may display a path in which the cleaning robot 5100 has run. The display 5101 may be a touch panel and the operation button 5104 may be provided on the display 5101.

The cleaning robot 5100 can communicate with a portable electronic device 5140 such as a smartphone. The portable electronic device 5140 can display an image taken by the cameras 5102. Therefore, an owner of the cleaning robot 5100 can monitor his/her room even from the outside. The owner can also check the display on the display 5101 by the portable electronic device such as a smartphone.

A memory device including the semiconductor device of one embodiment of the present invention can hold control data, a control program, or the like of the above electronic device for a long period. With the use of the semiconductor device of one embodiment of the present invention, a highly reliable electronic device can be achieved.

An IC in which the above AI system is incorporated can be used for the arithmetic device or the like of the above-described electronic device, for example. Accordingly, the electronic device of this embodiment can perform appropriate operations depending on circumstances with low power consumption by utilizing the AI system.

This embodiment can be implemented in an appropriate combination with any of the structures described in the other embodiments, examples, and the like.

REFERENCE NUMERALS

700: memory cell, 701: transistor, 703: transistor, 704: capacitor, 705: transistor, 706: capacitor, 707: transistor, 708: transistor, 709: transistor, 712: insulator, 713: insulator, 713A: insulating film, 714: conductor, 716: insulator, 718: conductor, 718A: conductive film, 719: conductor, 719A: conductive film, 720: insulator, 720_1: insulator, 720A: insulating film, 721: conductor, 721_1: conductor, 721A: conductive film, 722: insulator, 722_1: insulator, 722A: insulating film, 724: conductor, 724_1: conductor, 724A: conductive film, 725: insulator, 725_1: insulator, 725A: insulating film, 726: conductor, 726_1: conductor, 726A: conductive film, 728: insulator, 728_m: insulator, 728_1: insulator, 728A: insulator, 730: oxide, 730_1: oxide 730A: oxide, 730B: oxide, 730B_1: oxide, 734: conductor, 734_1: conductor, 734A: conductive film, 741: insulator, 741A: insulator, 743: oxide, 743A: oxide, 748: insulator, 748A: insulator, 750: insulator, 750A: insulating film, 751: insulator, 752: conductor, 753: conductor, 753A: conductive film, 754: conductor, 755: conductor, 756: conductor, 757: insulator, 758: conductor, 759: conductor, 761: conductor, 762: conductor, 763: conductor, 764: conductor, 765: conductor, 766: conductor, 780: mask, 782: mask, 790: memory cell array, 792: string

The invention claimed is:

1. A semiconductor device comprising:
a stack including:
a first conductor;
a first insulator over the first conductor;
a second conductor, a first oxide, a third conductor over the first insulator;
a second insulator over the second conductor, the first oxide, and the third conductor; and
a fourth conductor over the second insulator;
a cylindrical third insulator arranged to penetrate the stack;
a second oxide in the cylindrical third insulator;
a first transistor comprising the first oxide;
a second transistor comprising the second oxide;
a first wiring electrically connected to one of source and drain of the second transistor; and
a second wiring electrically connected to the other of source and drain of the second transistor, wherein the second conductor is electrically connected to one of source and drain of the first transistor,
wherein the third conductor is electrically connected to a gate of the second transistor and the other of source and drain of the first transistor, and
wherein the first conductor, the second conductor, the first oxide, the third conductor, and the fourth conductor are arranged in a ring-like shape which surrounds the cylindrical third insulator.

2. The semiconductor device according to claim 1,
wherein the first oxide and the second oxide contain In, an element M, and Zn, and
wherein M is Al, Ga, Y, or Sn.

3. A semiconductor device comprising:
a first transistor comprising:
  a first conductor;
  a first insulator over the first conductor;
  a second conductor, a first oxide, a third conductor over the first insulator, the first oxide being between the second conductor and the third conductor;
  a second insulator over the second conductor, the first oxide, and the third conductor; and
  a fourth conductor over the second insulator;
a second transistor comprising:
  the second conductor;
  a cylindrical third insulator; and
  a second oxide in the cylindrical third insulator;
a first wiring electrically connected to one of source and drain of the second transistor; and
a second wiring electrically connected to the other of source and drain of the second transistor,
wherein the second conductor is electrically connected to one of source and drain of the first transistor, and
wherein the third conductor is electrically connected to a gate of the second transistor and the other of source and drain of the first transistor.

4. The semiconductor device according to claim 3,
wherein the first oxide and the second oxide contain In, an element M, and Zn, and
wherein M is Al, Ga, Y, or Sn.

* * * * *